(12) United States Patent
Bazzone

(10) Patent No.: US 8,098,967 B1
(45) Date of Patent: Jan. 17, 2012

(54) GENERATOR PROTECTION SYSTEM

(76) Inventor: Michael Louis Bazzone, Delmont, PA (US)

( * ) Notice: Subject to any disclaimer, the term of this patent is extended or adjusted under 35 U.S.C. 154(b) by 0 days.

(21) Appl. No.: 12/900,556

(22) Filed: Oct. 8, 2010

(51) Int. Cl.
*G02B 6/00* (2006.01)
*H04J 14/02* (2006.01)
*G01R 13/30* (2006.01)
*G01J 1/04* (2006.01)

(52) U.S. Cl. .............. 385/12; 385/13; 385/37; 385/6; 385/128; 398/79; 73/1.45; 73/25.01; 250/227.11; 250/227.14; 250/227.18

(58) Field of Classification Search .............. 385/12, 385/13, 123, 37, 128, 6, 8, 1, 2, 3; 398/79, 398/84, 87; 73/1.45, 25.01; 250/227.11, 250/227.14, 227.18, 227.19
See application file for complete search history.

(56) References Cited

U.S. PATENT DOCUMENTS

| | | | |
|---|---|---|---|
| 4,818,975 A | 4/1989 | Jenkins | 340/584 |
| 5,042,898 A * | 8/1991 | Morey et al. | 385/37 |
| 5,394,488 A * | 2/1995 | Fernald et al. | 385/13 |
| 5,465,015 A | 11/1995 | Anastas et al. | 310/26 |
| 5,473,428 A * | 12/1995 | Lee et al. | 356/480 |
| 5,640,472 A | 6/1997 | Meinzer et al. | 385/26 |
| 5,680,025 A | 10/1997 | Bowers, III et al. | 318/806 |
| 5,689,070 A | 11/1997 | Clark | 73/643 |
| 5,867,258 A * | 2/1999 | Frederick et al. | 356/35.5 |
| 5,877,426 A * | 3/1999 | Hay et al. | 73/733 |
| 6,246,048 B1 * | 6/2001 | Ramos et al. | 250/227.18 |
| 6,260,422 B1 | 7/2001 | Odachi et al. | 73/862.334 |
| 6,407,466 B2 | 6/2002 | Caamano et al. | 290/52 |
| 6,452,667 B1 * | 9/2002 | Fernald et al. | 356/73.1 |
| 6,624,528 B2 | 9/2003 | Shimizu et al. | 290/40 C |
| 6,683,297 B2 | 1/2004 | Schulz et al. | 250/227.16 |
| 6,804,008 B1 * | 10/2004 | Morison et al. | 356/479 |
| 6,873,752 B2 | 3/2005 | Rowe | 385/12 |
| 7,154,081 B1 * | 12/2006 | Friedersdorf et al. | 250/227.14 |
| 7,324,714 B1 * | 1/2008 | Cranch et al. | 385/12 |
| 7,512,291 B2 | 3/2009 | Mendoza | 385/12 |
| 7,533,572 B2 | 5/2009 | Twerdochlib | 73/657 |
| 7,539,361 B2 | 5/2009 | Dimmick et al. | 385/12 |
| 7,809,029 B2 | 10/2010 | Poulson et al. | 372/6 |

(Continued)

FOREIGN PATENT DOCUMENTS

WO 2010053356 5/2010

OTHER PUBLICATIONS

Rochford, Espejo, Rose, Dyer, Improved Fiber Optic Magnetometer Based on Iron Garnet Crystals, Proc 14th Optical Fibers Sensors Conference, Oct. 11-13, 2000, pp. 332-335.

(Continued)

*Primary Examiner* — Brian Healy

(57) ABSTRACT

A magnetic flux sensor is disclosed. The sensor comprises an optical fiber and at least one twin-grating structure formed on the optical fiber. Each twin-grating structure comprises a first optical grating structure, a second optical grating structure adjacent the first optical grating structure, and a sensing cavity disposed between the first and second optical grating structures. Each twin-grating structure is selectively responsive to a unique wavelength of light to generate an optical interference fringe signal. The sensor also includes a magnetostrictive coating disposed over each twin-grating structure to change an optical property of the twin-grating structure and a phase of the optical interference fringe signal when the magnetostrictive coating is exposed to changing magnetic flux.

63 Claims, 35 Drawing Sheets

U.S. PATENT DOCUMENTS

| | | | |
|---|---|---|---|
| 7,856,888 B2 | 12/2010 | Ferguson | 73/800 |
| 2003/0157350 A1 | 8/2003 | Ueyama et al. | 428/474.4 |
| 2005/0046861 A1* | 3/2005 | Morison et al. | 356/479 |
| 2006/0152015 A1 | 7/2006 | Bywaters et al. | 290/55 |
| 2006/0163456 A1* | 7/2006 | Wittrisch et al. | 250/227.14 |
| 2007/0019898 A1 | 1/2007 | Chimenti et al. | 385/12 |
| 2008/0203954 A1 | 8/2008 | Qian et al. | 318/490 |
| 2008/0212925 A1 | 9/2008 | Arashitani et al. | 385/37 |
| 2009/0052831 A1 | 2/2009 | Arias Vidal et al. | 385/12 |
| 2010/0018323 A1 | 1/2010 | Cheng et al. | 73/861.24 |
| 2010/0077828 A1 | 4/2010 | Herz et al. | 73/1.03 |

OTHER PUBLICATIONS

Chandrasekar, Radha and Ramprasad, A Simple Fiber Optic Vibration Sensor, Pacific Northwest Fiber Optic Workshop, Troutdale, or May 3-4, 1995, pp. 159-164.

Wippich, Dessau, Tunable Lasers and Fiber Optic Bragg Grating Sensors, The Industrial Physicist, vol. 9, issue 3, 2003, pp. 24-28.

Davol, Udd, Kreger, Kunzler, Laylor and Heider, Yu, Monitoring of Advanced Composite Weave Structures Using Multi-Axis Fiber Grating Strain Sensors, Blue Road Research and University of Delaware, DOD contract report A338054, 2003, 7 pgs.

Ambrosino, Capoluongo, Campopiano, Cutolo, Cusano and Giordano and Davino, Visone, Novel Magnetic Sensor Based on Fiber Bragg Grating and Magnetic Shape Memory Alloys, Proceedings—1st Intl Conference on Sensing Technology, Nov. 21-23, 2005, Palmerston, New Zealand, pp. 349-354.

Laylor, Calvert, Taylor, Schulz, Lumsden, Udd, Fiber Optic Grating Moisture and Humidity Sensors, SPIE vol. 4694 pp. 210-218, 2002.

Form PCT/ISA1220 (1 page) International Search Report Form PCT/ISA/210 (3 pages) and Written Opinion Form PCT/ISA/237 (17 pages) for International application No. PCT/US2010/052273, date Dec. 13, 2010.

Form PCT/ISA/220 (1 page) International Search Report Form PCT/ISA/210 (2 pages) and Written Opinion Form PCT/ISA/237 (9 pages) for International application No. PCT/US2010/052270, date Dec. 14, 2010.

Nader-Rezvani, Claus, Sarrafzadeh; Low Frequency Fiber Optic Magnetic Field Sensors, Optical Engineering 31(01) pp. 23-27 Publication Date: Jan. 1992 (Revised to add publication date).

Mike Hoffer, et al, Stator Bar Vibration Sensors and Fiber-Optic Accelerometers, New Tools Used to Measure Stator Winding Vibration in Large Turbine Generators, 17 pages Publication Date: Jan. 2003 (Revised to add publication date).

* cited by examiner

GENERATOR PROTECTION SYSTEM

BACKGROUND

Electric generators, such as those used in the power generation industry, essentially comprise a rotor and a stator. The rotor is wound with conductors to form a field winding. The stator is wound with conductors to form a stator winding. The field winding is supplied with an excitation current in order to create a magnetic field on the rotor. When the rotor spins inside the stator, electric power is induced in the stator winding.

In order to ensure safe and efficient operation of an electric generator, operating characteristics of the generator may be monitored using a number of different instruments located throughout the generator. Monitored characteristics may comprise, by way of example, vibration, temperature, voltage and current. Conventional conductor-based instruments for monitoring such characteristics may be unsuitable due to the harsh operating environment within the generator or a lack of space necessary to locate such instrumentation on the generator component(s) of interest. Instruments that address these limitations are therefore desirable.

FIGURES

The novel features of the various embodiments are set forth with particularity in the appended claims. The described embodiments, however, both as to organization and methods of operation, may be best understood by reference to the following description, taken in conjunction with the accompanying drawings in which:

DESCRIPTION

Fiber Optic Flux Probe Sensor

The winding turn insulation state in a rotor may be an important aspect to be real-time monitored for possible shorted turns arising during the operation of the rotor. Early information may be helpful when making a maintenance decision concerning when and whether the rotor might necessarily be taken out of service and reworked. Previous technology mainly utilizes an air-gap magnetic flux sensor on-line to measure the rotor slot leakage flux in the rotor. The transitional magnetic flux sensor may utilize the Hall probe or the coil as sensing elements which are electrical in nature. These types of sensors may be connected to the data acquisition system outside of the generator with an electrical wire. The wire causes problems in the power system security and increases risk to people when they handle these devices on-line. As fiber optic sensing technology may provide the sensor system with immunity to electromagnetic interference, it may be possible to let the fiber optic flux probe sensors work in such a harsh environment. The fiber optic flux probe sensor proposed may be a fiber-based interference sensor with ferrite-magnetostrictive coating that may allow for detection of the fringe signals, induced by the rotor slot leakage flux in the generator, more efficiently. Due to the direct relationship between rotor winding shorted turns and magnetic flux variation in the rotor, the amplitude of variation may be used as an indicator of shorted turns. By incorporating a dual cavity where one cavity is coated with the magnetostrictive material and the other cavity is longer, giving a different fringe pattern, a computer-implemented algorithm may be used to sort out the effect of the shorted turn as well as the local temperature rise.

Description of Technology

Magnetic flux leakage inspection methods or tools can be used to locate and characterize the rotor winding where there have been previous episodes of shorted turns. In principle, as the generator operates, magnetic flux generated by the rotor winding may leak into the surrounding air or air-gap between the rotor and stator. This leakage flux is known as rotor slot leakage. If a magnetic flux sensor is put in this leakage region, the sensor may accumulate a physical parameter output related to the flux magnitude. The rotor slot leakage may be local to each rotor slot and its magnitude may be proportional to the current flowing through the turns found in the slot and therefore may be a possible indication of active shorted turns in the slot. Several types of known sensor systems employing Hall-type or coil-type or magnetic-resistance-type sensing elements to detect the rotor slot flux leakages in a generator have been developed. The corresponding software environment in the computer has been built to automatically determine the rotor winding shorted turns by analyzing detected flux waveforms.

Figure 1:
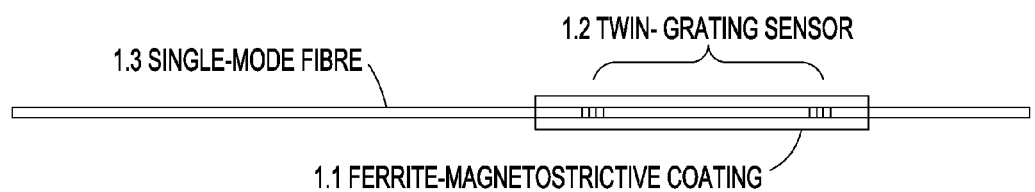
FIG. 1 illustrates a fiber optic flux probe sensor according to one embodiment.
Figure 2:
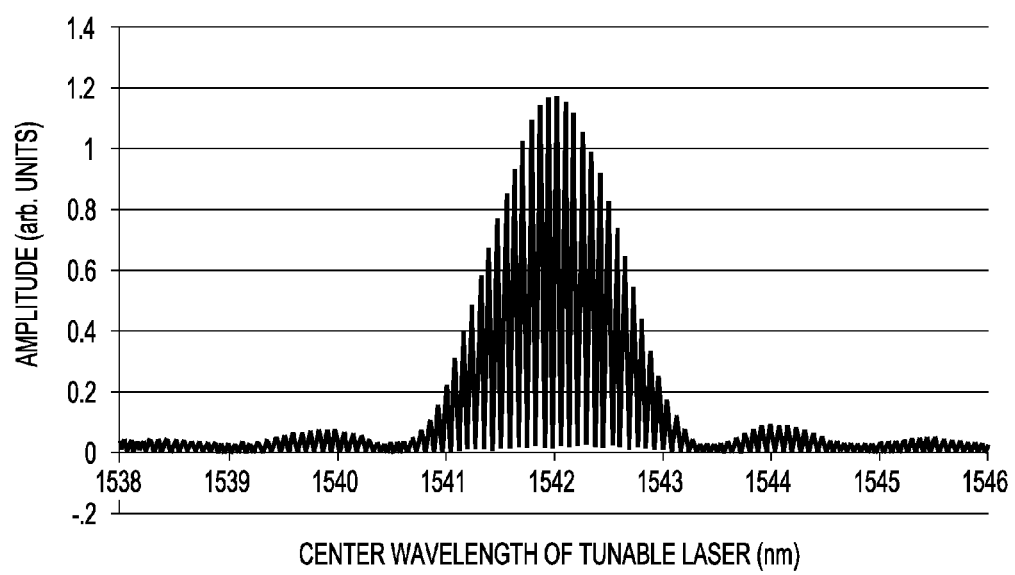
FIG. 2 illustrates a spectrum of a twin-grating fiber optic sensor according to one embodiment.

Embodiments of the fiber optic flux probe sensor may comprise a ferrite-coated fringe sensor. The structure of this embodiment is shown in FIG. 1 in which a sensing element with a designed wavelength may comprise a fringe sensor. The sensor may be coated with a magnetostrictive material, 1.1, such as Terfenol-D. The sensor with two gratings may comprise a Fabry-Perot type of interferometer, 1.2. Therefore it may have very high detection sensitivity and fast response speed compared to that of single-grating sensors, 1.3, and therefore may be very suitable for magnetic flux detections. FIG. 2 is an output spectrum of the twin-grating sensor, in which many spectral lines, called the interference fringe, can be seen.

Figure 3:
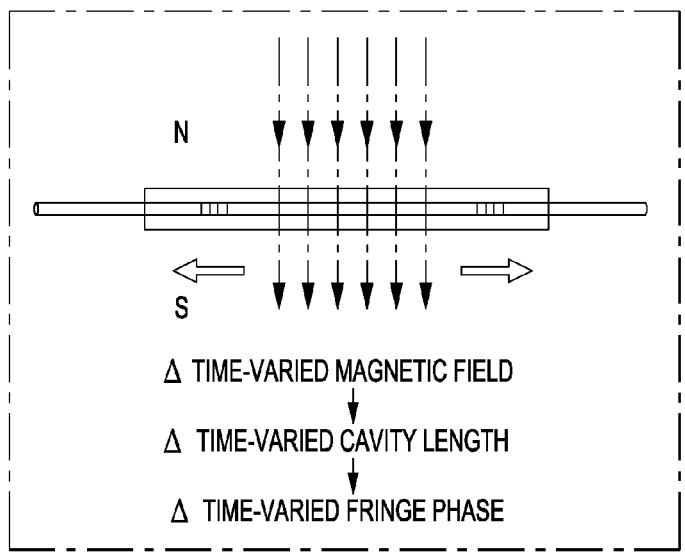
FIG. 3 illustrates operation of a fiber optic flux probe sensor according to one embodiment.
Figure 4:
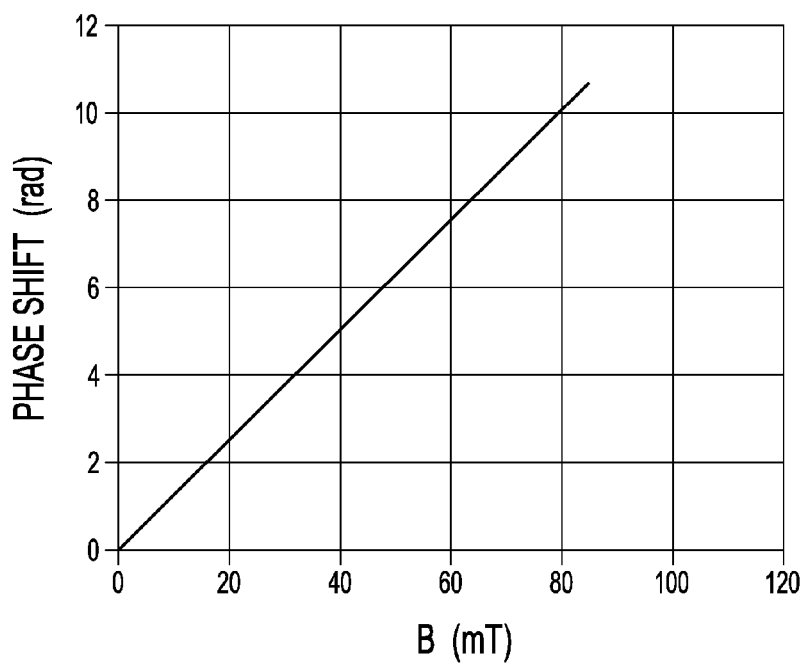
FIG. 4 illustrates a graphical relationship between a phase shift of the fringe signal and an applied magnetic field according to one embodiment.

In operation principle, as illustrated in FIG. 3, the variation of applied magnetic flux through the magnetostrictive effect may affect some physical parameters of the sensor, such as the working wavelength and the cavity length, through the photoelasticity of the optical fiber. As a result, it may finally change the phase of the fringe signal. The phase shift magnitude of the fringe signal may be proportional to the applied magnetic field in intensity in an effective saturation range as illustrated in FIG. 4.

In one embodiment, Terfenol-D may be selected as a coating material for the magnetic flux sensor. It has a relatively large magnetostriction on the order of 1000 ppm for magnetizing a field of 100 mT when it operates at room temperature, free of mechanical stress. The saturation field of Terfenol-D depends on the mechanical load and increases from 100 mT to 500 mT for loading in the range 0-100 mPa. Additionally, Terfenol-D can operate efficiently at a frequency range of 0-5 kHz. It may be very suitable as a magnetostrictive coating material on the fiber sensor for the detection of rotor slot leakage flux in the generator. For example, where the rotor has 4 poles and 8 coils per pole and the rotor rotates at 60 Hz rate, the maximum frequency in detection signals generated by the rotor windings may be about 60 Hz×4×8=1.92 kHz lower than 3 kHz.

Figure 5:
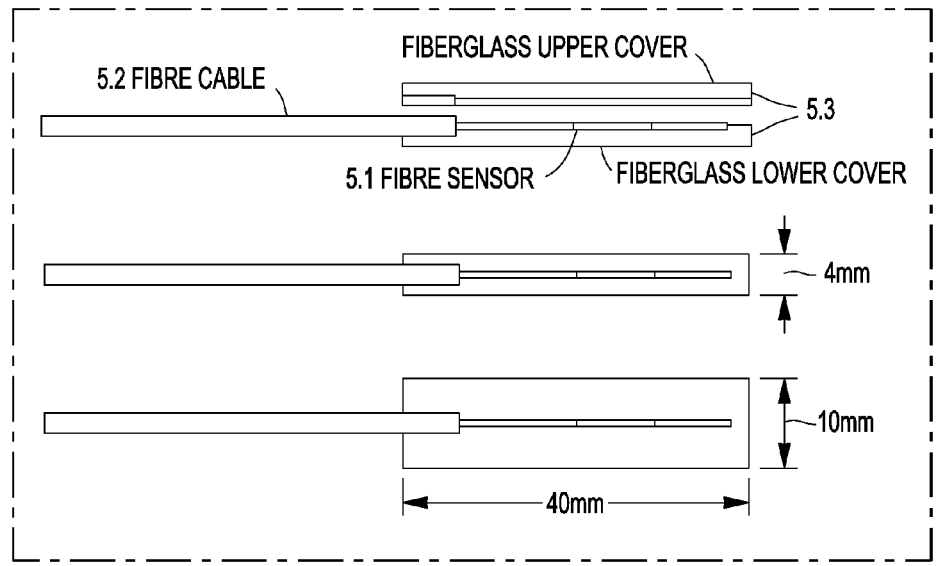
FIG. 5 illustrates a packaged fiber optic flux probe sensor according to one embodiment.

One embodiment of a sensor package is schematically illustrated in FIG. 5. The fiber flux sensor, 5.1 may be packaged into Teflon, 5.2, with fiberglass filler, 5.3, with 4-mm to 10-mm in thickness for satisfying a requirement of installing in the air-gap of the generator. Mathematically, the phase of fringe signal $\phi_{FP}$ can be expressed as:

$$2\phi_{FP}(\lambda_{Bragg}) = \frac{4\pi n_{eff} L}{\lambda_{Bragg}}, \quad (1)$$

where $n_{eff}$ is an effective refractive index of the optical fiber, L is the physical length of the sensor cavity and $\lambda_{Bragg}$ is the central wavelength of two identical Bragg gratings. When the ferrite-magnetostrictive coating, such as Terfenol-D coating is employed on the sensor, the magnetostriction of the coating material may affect the optical parameters of the sensor in terms of the working wavelength and effective refractive index as well as the physical length of the cavity. When these optical parameters are changed, the fringe spectrum may move as a blue shift or a red shift in spectral domain and the fringe pattern in time domain, which may present an initial phase change in the fringe time waveform. The magnitude of phase change or phase shift may be taken as a detectable physical quantity to evaluate the magnitudes of the magnetic flux. When the magnetic flux magnitude changes with time, the detected fringe may become a time-varied fringe signal.

Figure 6:
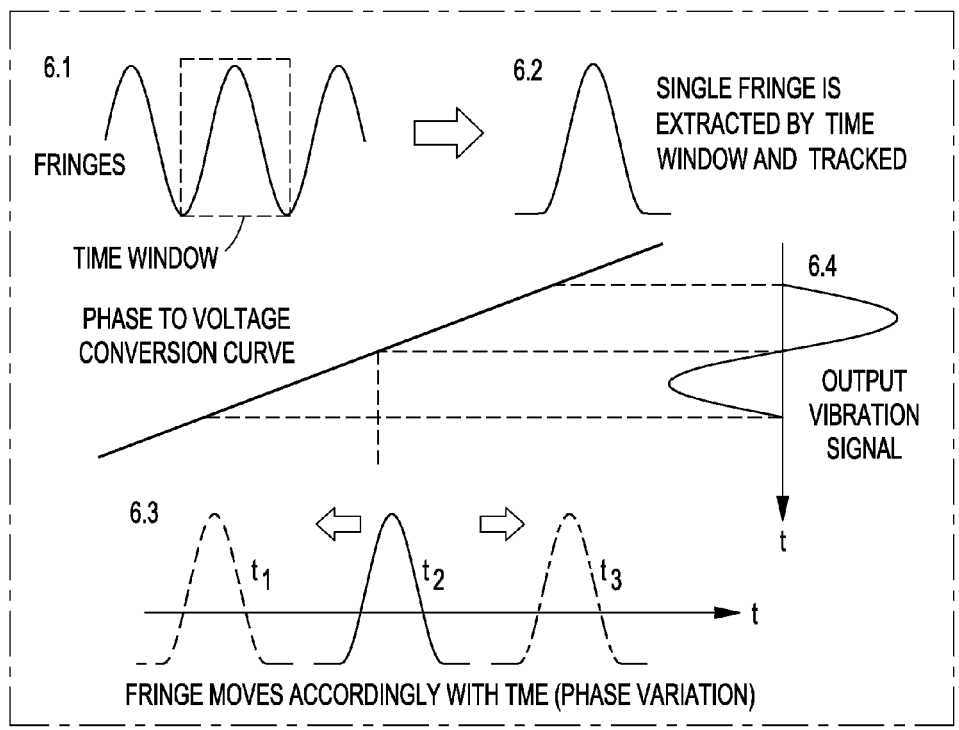
FIG. 6 illustrates detection of phase shift in fringe signal according to one embodiment.

In one embodiment of a detection process, phase changes in the detected fringe signal may be measured and then converted into an amplitude value, for example, as a voltage value. This signal processing method may comprise a fringe tracking algorithm. In operation principle, as shown in FIG. 6, the input detected signal with multiple fringes may be first filtered in time domain by a time window, 6.1, with a window width equal to that of the fringe, in order to extract a target fringe, 6.2, to be real-time tracked afterwards. When the laser source is frequency modulated with a saw-tooth periodic signal, the fringe position in this modulation signal period (a time that the fringe appears in a modulation period) may be determined by the initial phase value of the fringe signal, 6.3. In the detection of the rotor slot leakage, when the rotor rotates, each rotor slot passes over the flux sensor and the slot leakage from that slot may be detected by the fiber optic flux probe sensor and converted into a fringe voltage signal as a flux signal, 6.4.

In the shorted-turn sensing algorithm, the premise is that the magnitude of that peak in the detected flux waveform is related to the amp-turns in the slot. Since amp-turns are directly related to the number of active turns in the slot, it is anticipated that a coil with shorted turns will display a smaller peak than a coil without shorted turns. By comparing slot peak magnitudes between poles, the number of shorted turns may be calculated for each coil in the rotor. To calculate the presence of symmetric shorted turns (same coils in all poles) may require comparison to a base set of data recorded before the development of the shorted turns.

Figure 7:
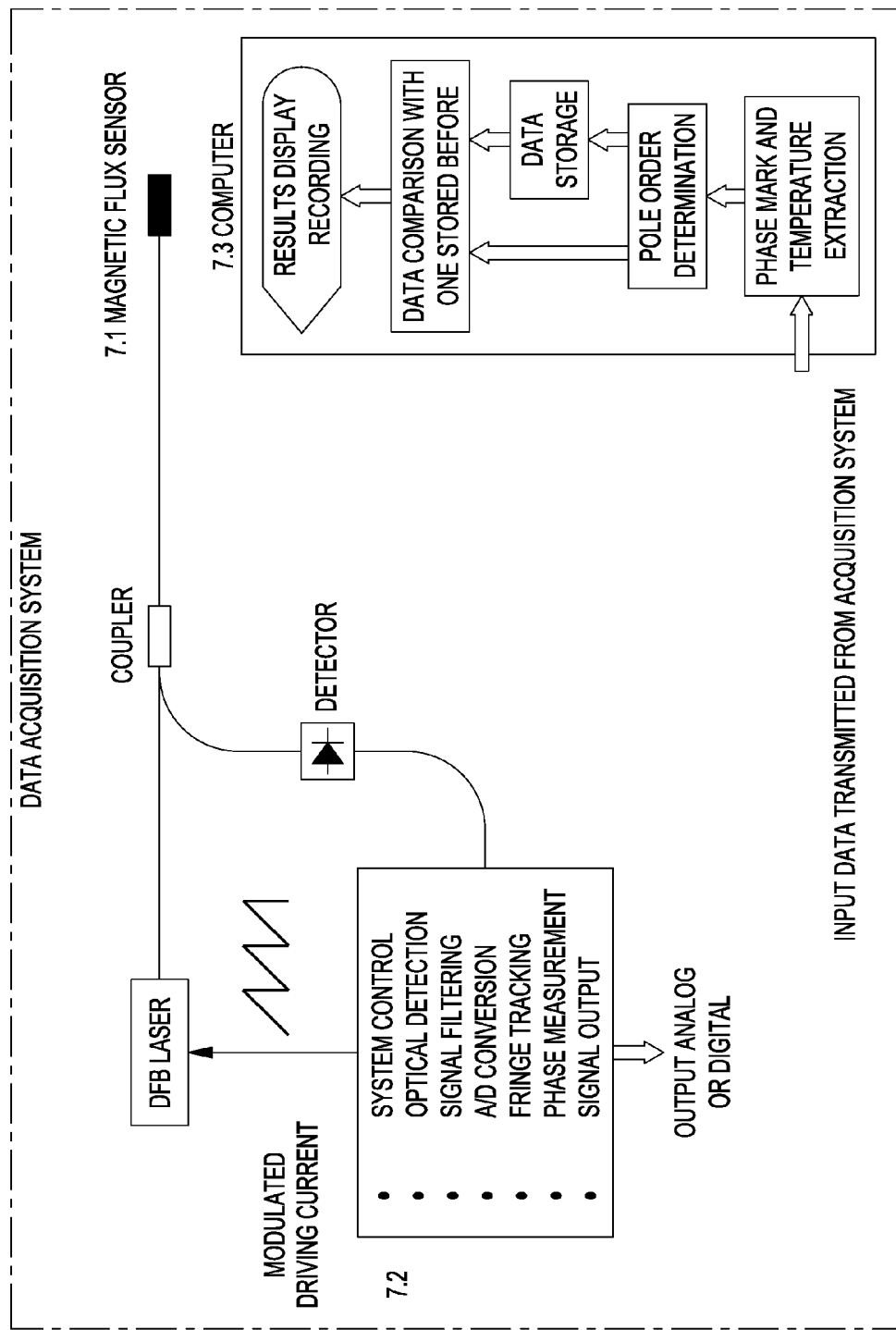
FIG. 7 illustrates a fiber optic flux probe sensor system according to one embodiment.

A schematic diagram of a fiber optic flux probe sensor system is illustrated in FIG. 7. The system may comprise a fiber optical flux probe sensor, 7.1, a data acquisition system, 7.2, and a computer, 7.3. The basic functions of the data acquisition system may comprise optical detection of the signal lights from the flux sensor, signal filtering, analog-to-digital conversion and phase measurement.

In the data acquisition system, the fringe signals received may be digitized with the analog-to-digital converter. The phase information, related to the rotor slot leakage flux, may be extracted by using a fringe tracking algorithm as illustrated in FIG. 6. The flux sensing waveforms, in analog or digital format, may be output or transmitted to a computer for signal processing and waveform analysis. With the software in the computer, a phase mark signal embedded in flux sensing waveforms may be extracted as a signature to identify the physical pole to which a coil with shorted turns belongs.

It should be noted that the fiber optic flux probe sensor system may not only provide a basic tool for the rotor winding insulation state analysis, but may also simultaneously display the real-time temperature in the generator. This may be an important factor in determining the operating status of the rotor when the generator is in a running state.

Example

Figure 8:
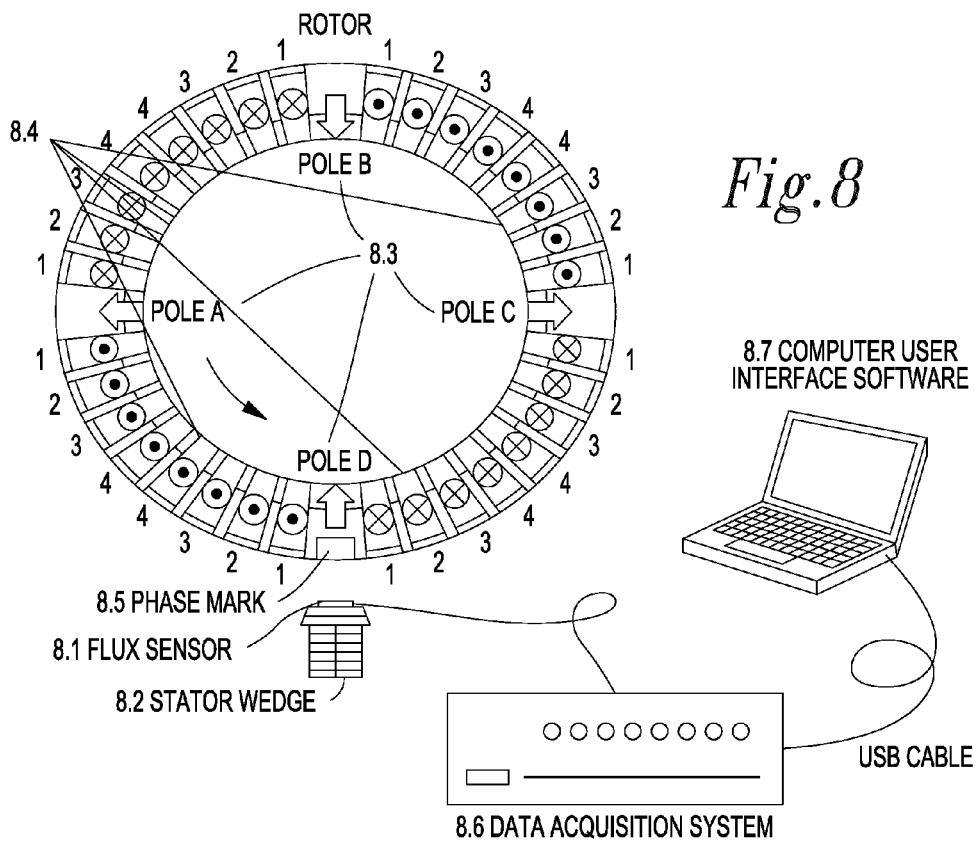
FIG. 8 illustrates a fiber optic flux probe sensor system for monitoring the rotor winding insulation according to one embodiment.
Figure 9:
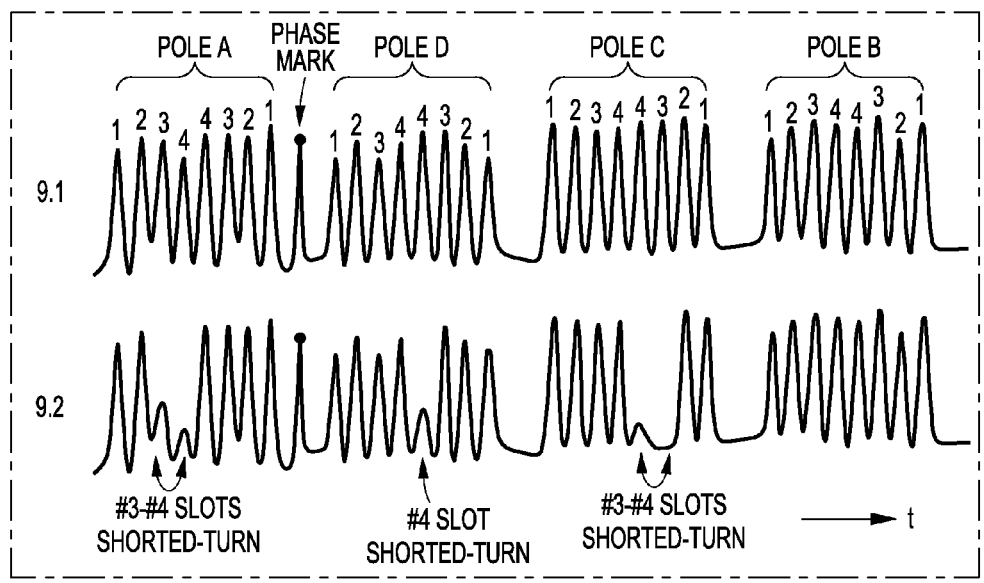
FIG. 9 illustrates magnetic flux waveforms detected by a fiber optic flux probe sensor system according to one embodiment.

As an application case, one embodiment of a fiber optic flux probe sensor system is schematically illustrated in FIG. 8, in which a fiber optic flux probe sensor, 8.1, may be mounted on a stator wedge, 8.2, in a position over a continuous ring of wedges. The rotor may have four poles, 8.3, and each pole may have eight slots, 8.4. The fiber optic flux probe sensor cable, 8.5, may be routed out of the stator core to connect a data acquisition system, 8.6, in which the flux waveforms may be detected, recorded and sent to a computer, 8.7, through USB connection cable. As an example, two sets of detected flux waveforms are presented in FIG. 9. In these flux waveforms, the upper trace, 9.1, with high amplitude in each flux peak, may be one case without the rotor slot shorted turns occurring, and the lower trace, 9.2, may be one case where several shorted turns occur in slots as indicated by arrows. It will be appreciated that when a slot has a shorted turn, the amp-turn in this slot may decrease and, as a result, the leakage flux may be reduced accordingly.

Fiber Optic Wedge Tightness Sensors

When the stator wedge assembly loses its tightness, individual windings may become free to move resulting in larger vibration amplitude. The vibration originates from the electromagnetic field interaction between the rotor and the stator; it is the nature of the machine's normal operation. Excess vibration may cause rubbing and deteriorate the insulation layer between windings and eventually cause shorted turns. Tightness can be maintained by inserting a ripple spring between the wedge element and the fiberglass filler that directly presses against the stator coil. Tightness of the wedge assembly can be defined as a measurable physical strain in the fiberglass filler and can help to estimate the magnitude of the pressure exerted by the ripple spring. As the ripple spring becomes deformed, it may introduce strain to the wedge element underneath. This strain may be measured by embedding a twin gratings cavity inside the fiberglass filler. The technology involves a fringe-phase measurement algorithm. The vertical pressure generated by the ripple spring may be transferred into a transverse stress and an axial strain on the fiber sensor. In this phase measurement method, fringe movements can be detected that are caused by changes in the axial strain on the fiber sensor which indirectly affects the tightness in the wedge assembly. It may therefore be used as an automated inspection tool for monitoring the tightness in the stator coil.

The embodiment may comprise sensors with a polyamide coated fiber which may be 145 microns, for example, providing excellent adhesion so the pressure from the ripple spring may be entirely transferred into the axial strain. If an acrylate coated fiber is used, the soft coating may absorb some of the strain. Polyamide is a tough polymer that may work in a harsh environment with high temperatures of up to 250° C., and like the normal fiber, may be immune to high voltages and electromagnetic interference.

Basic detection technology may be based on a measurement of the axial strain index change on the fiber sensor array.

Figure 10:
FIG. 10 illustrates a twin-grating fiber optic sensor according to one embodiment.

The structure of an individual twin-grating sensor is schematically illustrated in FIG. 10. The sensor may comprise two identical gratings, 10.1, inscribed in the single-mode fiber, 10.2. These two gratings form an optical cavity with a length of $L_{core}$l, where $n_{core}$ is the index of reflection in the fiber core and/is the physical length of the cavity in the fiber. When the reflection ratios of two gratings are both small, the transfer function of this twin-grating cavity may work as a two beam interferometer to generate a fringe signal as the sensor is lit with a coherent laser beam. The fringe signal, formed by the interference of the incoming beam and also the first reflected beam, may beam the intensity profile of these fringes and can be expressed as:

$$I_{cav}(v) = 2I_0 \kappa \left\{ 1 + \cos\left[\frac{4\pi v}{c}(L + \Delta L)\right] \right\}, \Delta L = \Delta L_{strain} + \Delta L_{temp} \quad (2)$$

where $I_0$ is the input light intensity, $v$ is the optical frequency, $\kappa$ is a receiving sensitivity and $\kappa \leq 1$, and c is the speed of light in a vacuum. $\Delta L$ is the variation of cavity length, which may comprise two terms, $\Delta L_{strain}$ from the axial strain effect and $\Delta L_{temp}$ from the thermal effect on the fiber, respectively.

FIG. 2 is an output spectrum of such a twin-grating sensor, in which there are many spectral lines called the interference fringes.

Figure 11:
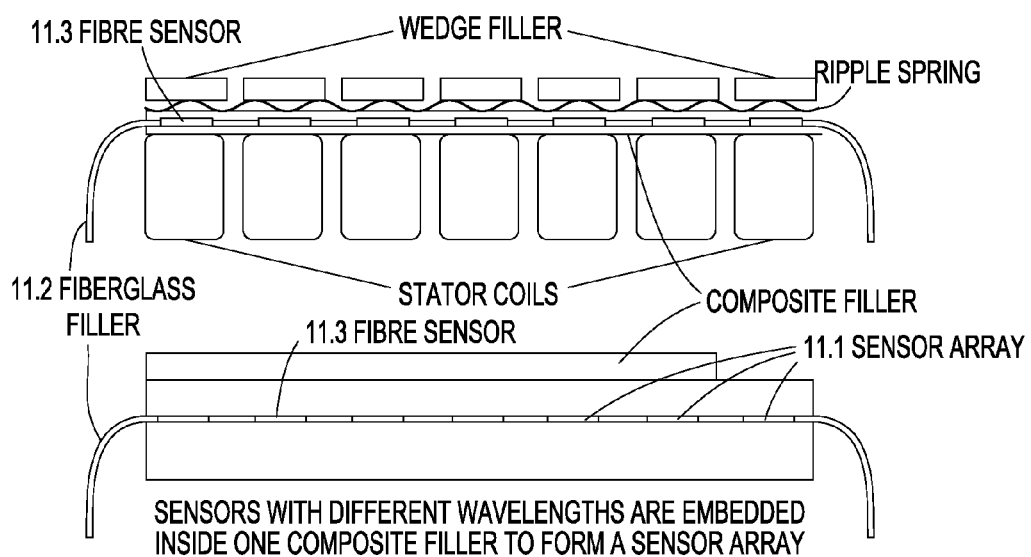
FIG. 11 illustrates a fiber optic wedge tightness sensor array embedded inside a composite plate according to one embodiment.

The basic structure of the embodiment to monitor wedge tightness is schematically shown in FIG. 11, in which a sensor array, 11.1, would be embedded inside the fiberglass filler, 11.2, to form a sensing unit in the stator. In this architecture, one fiber sensor, 11.3, manages one set of wedges per coil slot in the stator as illustrated in FIG. 11. In this way, the tightness state in one wedge element may be detected and identified through interrogating the corresponding sensor by data acquisition system.

Figure 12:
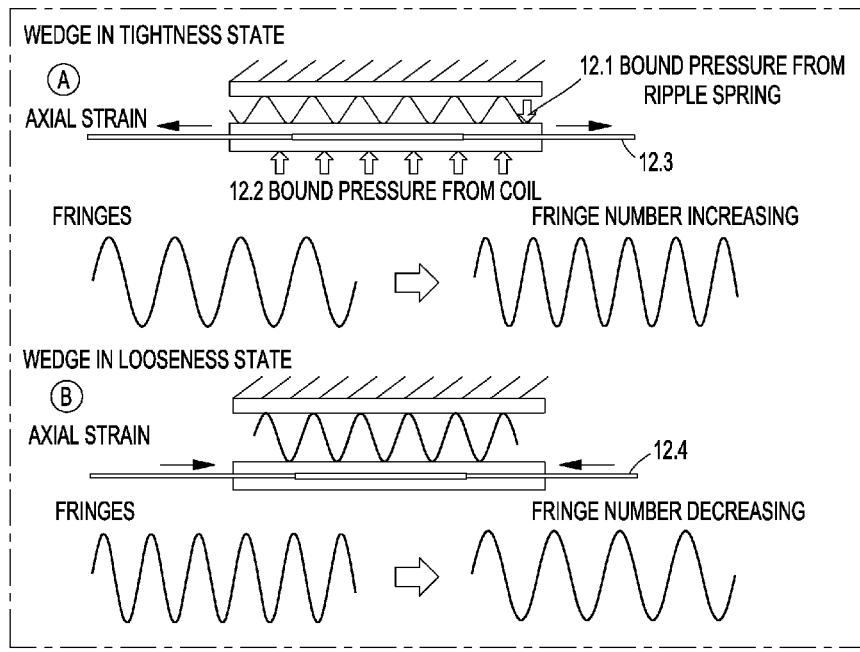
FIG. 12 illustrates operation of a fiber optic wedge tightness sensor according to one embodiment.

The detection principle may be explained with schematics as illustrated in FIG. 12. When the wedge assembly is tight, the pressures from the ripple spring, 12.1, and the coil, 12.2, below may generate a transverse stress in the fiberglass filler, 12.3, which may then transfer into an axial strain applied on the fiber sensor. This strain may elongate the cavity and the fringes may increase in number as illustrated in FIG. 12A.

Over a long period of time, as the material ages, the ripple spring gradually loses its strength, 12B. The coil may now vibrate more freely and cause damage to the insulating layer. There may be a possibility of gradual reduction of cavity length, 12.4, causing the fringe count to go down. This information may be helpful to the maintenance engineer. When the wedge is tightened, the cavity length may stretch again; restoring to its original state and the fringe number may increase.

Figure 13:
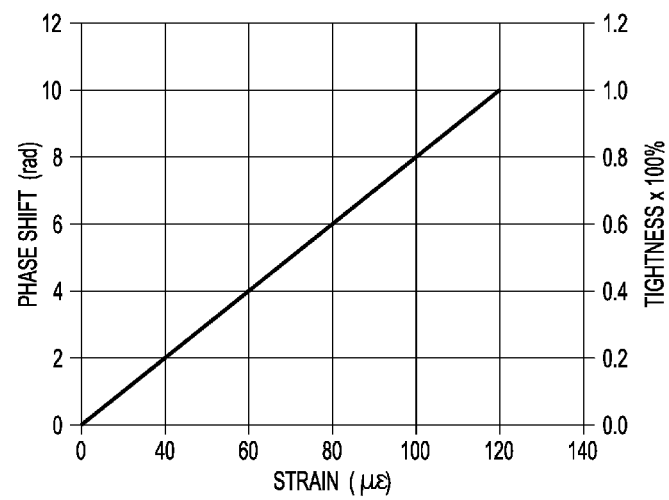
FIG. 13 illustrates a graphical relationship between axial strain applied on a fiber optic sensor, fringe phase and tightness according to one embodiment.

The implementation of the system and method may involve the initial set up of measurement references during the installation of the sensor arrays. After the stator coil is tightened by wedging through the ripple spring and fiberglass filler, the generator becomes ready to operate again. Recording at this time may obtain an initial phase value. Through continuous recordings, the change in tightness may be measured as explained in following section. The initial phase value may be stored as a reference value to use later for a comparison with an updated phase value in another inspection cycle. There may be a linear relationship between the fringe phase and the strain applied onto the fiber sensor, as shown in FIG. 13. As the axial strain on the fiber may be linearly proportional to the cavity length, the fringe phase becomes a linear function of the cavity length. Therefore, a variation in the detected phase value may be interpreted as a change in the axial strain and the cavity length. The tightness of the wedge $T_{wedge}$, can be defined as follows:

$$T_{wedge} = \frac{|\phi_{current} - \phi_{static}|}{|\phi_{initial} - \phi_{static}|} \times 100\%, \quad (3)$$

where $\phi_{static}$, $\phi_{initial}$ and $\phi_{current}$ are the measured phase value of the fringe signal in a static state without any applied strain generated by external pressure on the fiberglass filler, one after the installation of the sensor system as an initial value, and one measured at routine inspection times, respectively. Generally, the tightness $T_{wedge}$ in a normal situation, varies gradually with passed time (day or month or year), decreasing from its initial maximum value ~100% to a smaller value. When the measured $T_{wedge}$ is lower than a designated threshold, an alarm signal may be activated.

Figure 14:
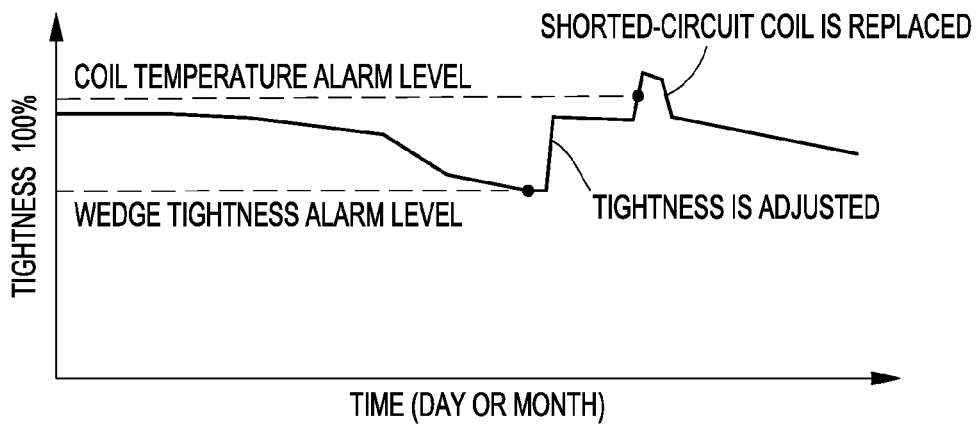
FIG. 14 illustrates tightness changes in a wedge plate over time according to one embodiment.

Usually, one routine inspection may be carried out in a day cycle or in a month cycle, according to the specific running situation in generator. FIG. 14 is a simulated curve of the tightness change in one wedge, which may be obtained by following the detection procedures shown in the flowchart of FIG. 15. With this trending plot of FIG. 14, one may learn about the variation in tightness in the wedge assembly over time.

Phase Measurement Technology

During the measurement process, the phase changes in the fringe can be measured and converted into an analog value, for example, as voltages or current. In operation principle, as shown in FIG. 6, the input detected signal with multiple fringes may be first filtered in time domain by a time window, 6.1, with a window width equal to that of the fringe, in order to extract a target fringe, 6.2, to be real-time tracked afterwards. When the laser source is frequency modulated with a saw-tooth periodic signal, the fringe position in this modulation signal period (a time that the fringe appears in a modulation period) may be determined by the initial phase value of the fringe signal, 6.3. With this phase tracking algorithm, very tiny changes in the axial strain may be caught, 6.4. For a large change in the axial strain, a fringe counting method, to measure the phase changed with the strain, may also be used.

Data Acquisition System

Figure 16:
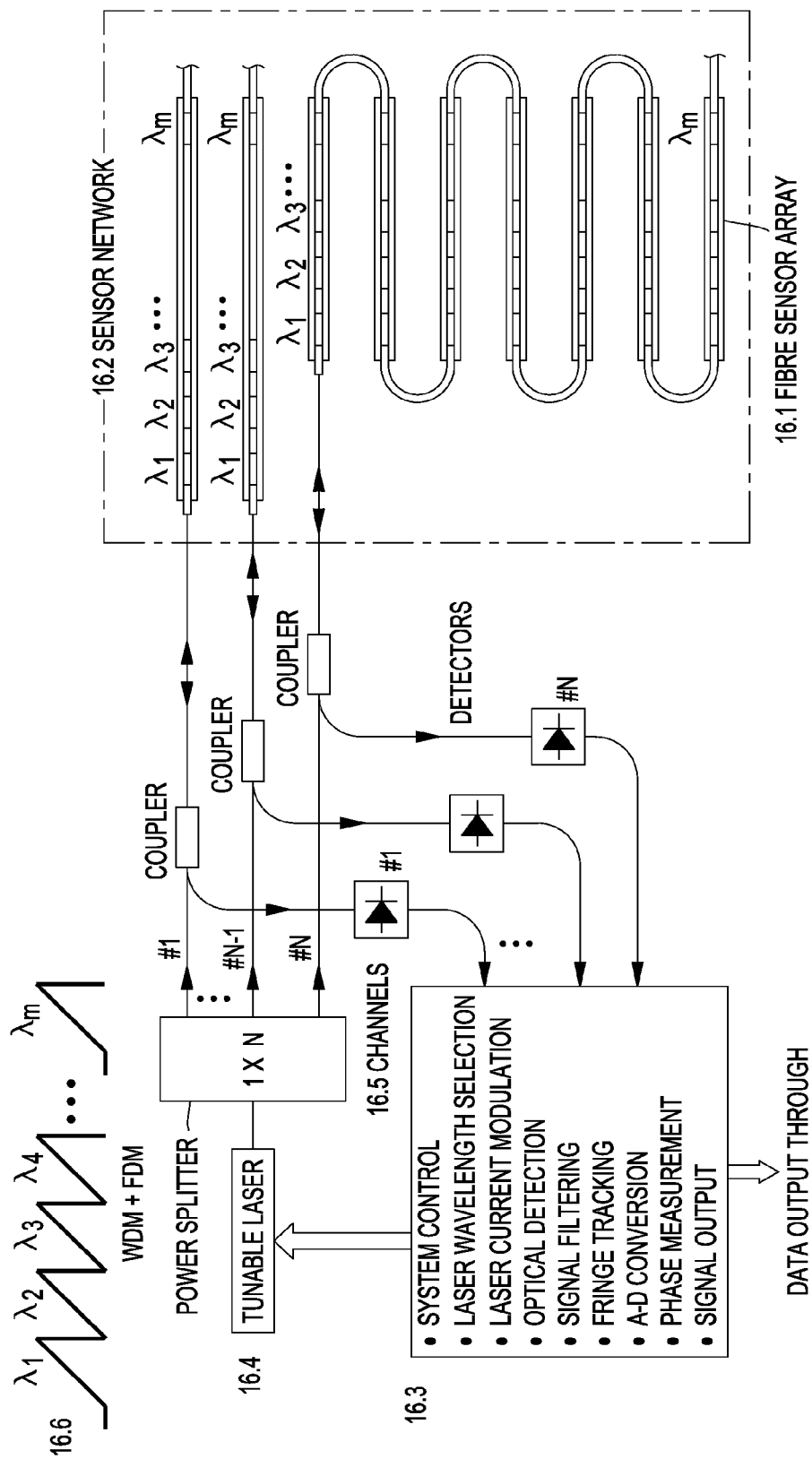
FIG. 16 illustrates a fiber optic wedge tightness sensor system according to one embodiment.

A schematic diagram of the fiber optic wedge tightness sensor system is shown in FIG. 16. The basic system (single channel) may comprise a fiber sensor array that may be embedded inside fiberglass filler, 16.1, and a data acquisition system. For multiple channels sensing, the data acquisition system may be able to handle multiple fiber sensor arrays to form a sensor network, 16.2, to manage multiple slots and wedges.

In order to interrogate multiple fiber sensors in different positions for monitoring multiple points in the wedge assembly, the data acquisition system, 16.3, may be required to be capable of working in a wavelength-selectable or wavelength division multiplexing mode (WDM) to sweep over the working wavelength of the laser source repeatedly. This may be completed by using a wavelength tunable laser diode, 16.4, in the sensor system. Additionally, since there are so many wedge slots in one generator system to be inspected, the wavelength tunable range may be required to be as wide as possible in order to manage as many sensors as possible in a single fiber. The data acquisition system may also be required to have multiple-channel detection ability, 16.5, which may allow each channel to share one laser source and individually interrogate the sensor with a wavelength matching with that of laser source.

In order to complete a measurement of the phase variation in the fringe, the optical frequency of the laser diode may be swept by changing its driving current with a linear modulation waveform, for example, with a saw-tooth waveform signal. This is a frequency division multiplexing working mode (FDM). Therefore one embodiment of a data acquisition system for wedge tightness monitoring may be able to alternately work under two different working modes, WDM and FDM, 16.6, as illustrated in FIG. 16. Finally, the detected phase value data from different fiber sensors, after preliminarily processing, may be transmitted in digital form to a computer as a test data server where additional signal processing may be performed.

Figure 15:
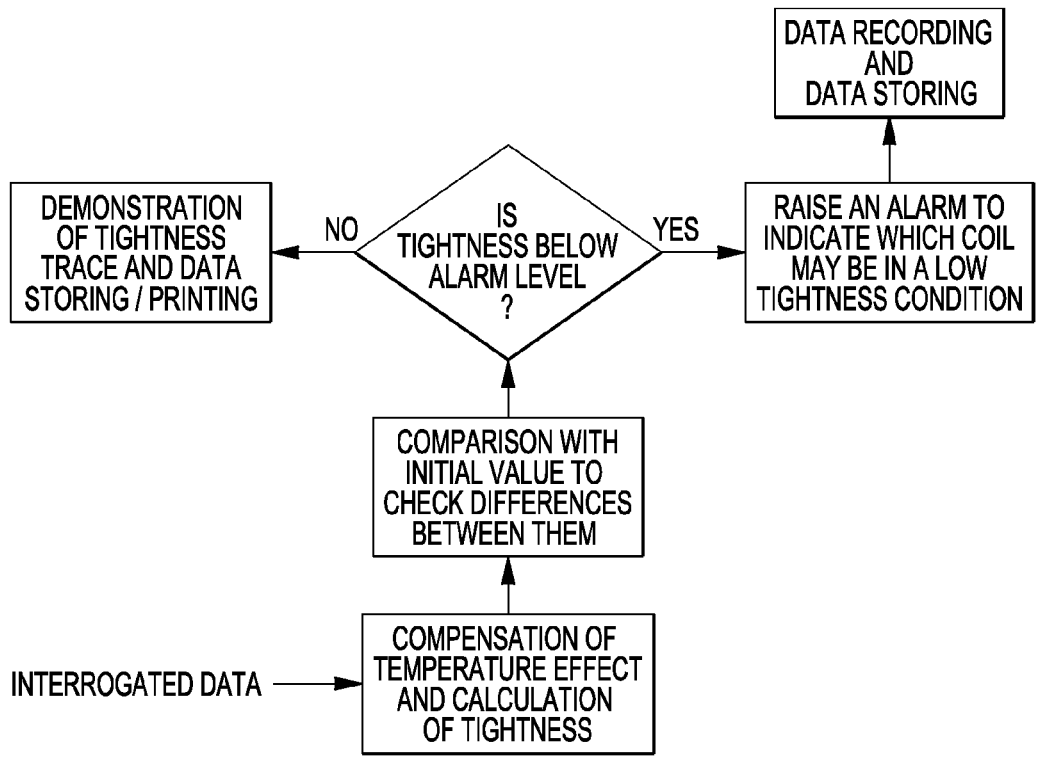
FIG. 15 illustrates functions used in a computer user interface program for wedge tightness monitoring according to one embodiment.

A diagram for illustrating data processing functions in a computer user interface program is shown in FIG. 15. As illustrated, this software may be able to make adjustment to the strain measurement. When there is a tightness alert, compensation for temperature change may be taken into consideration to alleviate concerns of a false alarm.

Example

Figure 17:
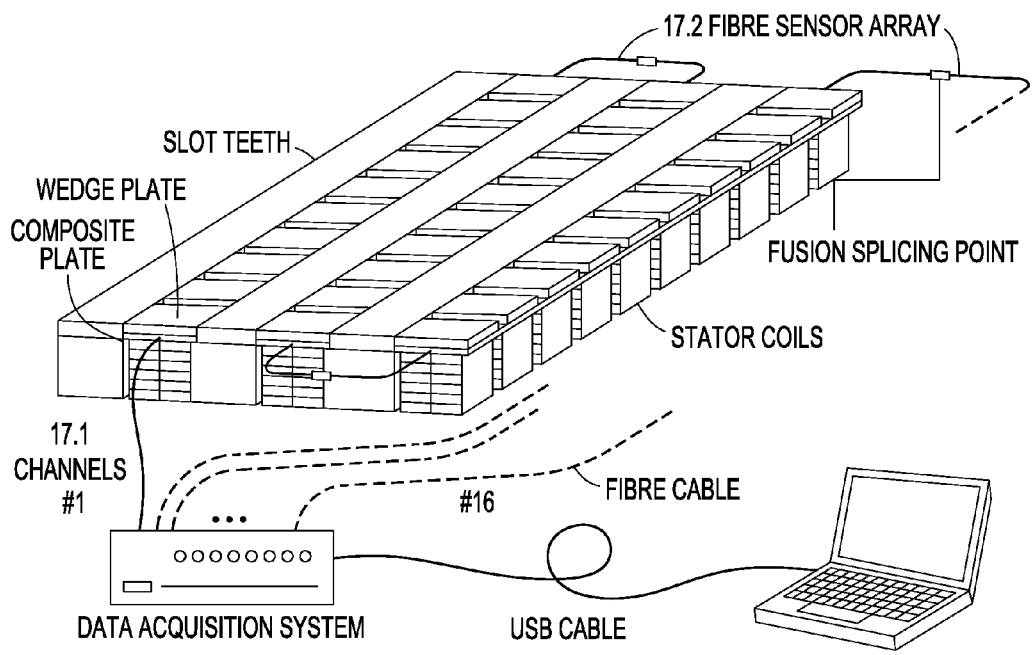
FIG. 17 illustrates a fiber optic wedge tightness sensor system for monitoring tightness variations in multiple wedge plates in the stator according to one embodiment.

One embodiment of a fiber optic wedge tightness sensor system is schematically shown in FIG. 17, in which a data acquisition system may simultaneously handle 16 channels, 17.1, for signal detections. Each fiber sensor array may be embedded inside a long, fiberglass filler, 17.2. The array may comprise up to 70 sensors with different wavelengths across the ITU grid in the C-band (1530 nm-1565 nm). A total number of 1120 (16×70) fiber sensors are capable of being handled by this data acquisition system which, in the worst case, would still satisfy the requirement of a large generator.

The detected phase data finally may be transmitted into the computer with the user interface software, 17.3, as introduced above, where final data processing for each sensor may be performed. The calculated tightness as detection data may be recorded and stored as an inspection record or working report, according to the user's requirement.

Fiber Optic Core Temperature Monitoring

Figure 18:
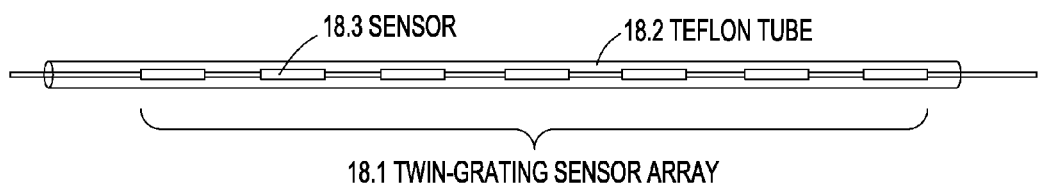
FIG. 18 illustrates a fiber optic temperature sensor array packaged inside a Teflon tube according to one embodiment.

When a short occurs within the interlaminar insulation system in the stator core, extra heat may be generated which may cause the temperature of the core to increase rapidly. Therefore, the temperature changes in the core of the stator may be monitored real-time and an alarm may be set off when the temperature in a core increases above a threshold. From Equation (2), it will be appreciated that the cavity length of the sensor may be a function of both the strain and temperature, so the same detection principle used in monitoring the wedge tightness may also be employed to monitor the temperature of the core. As shown in FIG. 18, the similar twin-grating sensor array, 18.1, may be shielded in a small-size tube, 18.2 (e.g., a Teflon tube) and may be placed in direct contact with the core without any additional pressure. In this way the sensor may be, materially, free of strain and may rapidly detect the temperature change in the core. Each sensor, 18.3, may manage a section of the core and may be registered in the data acquisition system. A slightly modified detection algorithm, originally used for monitoring the wedge tightness, may be employed to monitor the temperature of the core. The movement of the fringe signal in a sensor may be considered from a temperature change in the corresponding core.

Both sensor and the fiber may be polyamide coated in order to provide the sensor an ability to work in a harsh environment with high temperatures of up to 250° C. Also, just like the normal fiber, the polyamide coated fiber sensor may be immune to high voltages and electromagnetic interference.

The phase measurement technology used for temperature detection of the core may be similar to the monitoring of the wedge tightness. In operation principle, as shown in FIG. 6, the input detected signal with multiple fringes may be first filtered in time domain by a time window, 6.1, with a window width equal to that of the fringe, in order to extract a target fringe, 6.2, to be real-time tracked afterwards. When the laser source is frequency modulated with a saw-tooth periodic signal, the fringe position in this modulation signal period (a time that the fringe appears in a modulation period) may be determined by the initial phase value of the fringe signal, 6.3. With this phase tracking algorithm, very tiny changes in the core temperature may be caught. For a large change in the core temperature, a fringe counting method may be used to decide the degree of temperature changes in the core.

Figure 19:
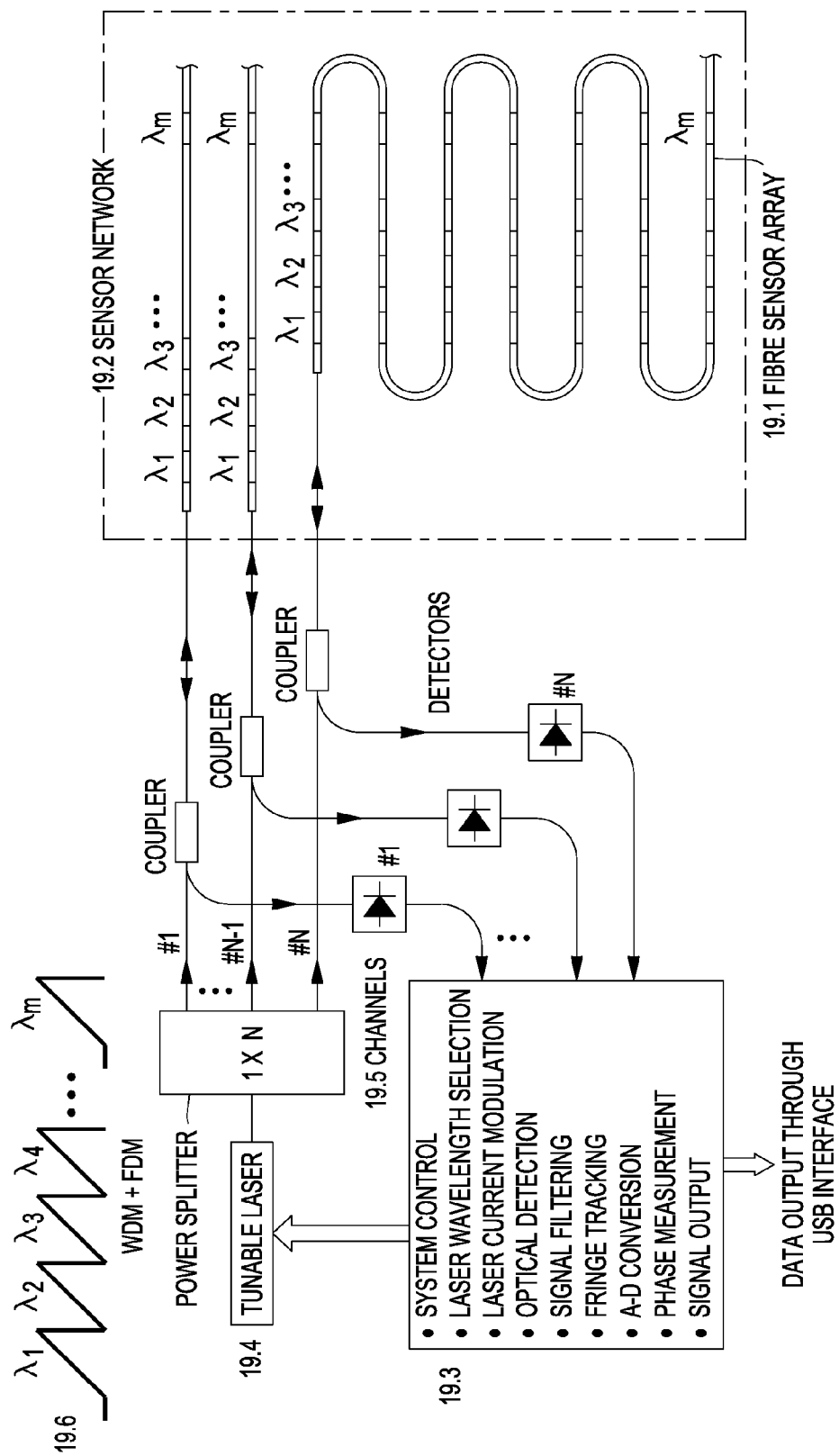
FIG. 19 illustrates a fiber optic core temperature sensor system according to one embodiment.

A schematic diagram of fiber optic core temperature monitoring system is shown in FIG. 19. The basic system (single channel) may comprise a fiber sensor array, 19.1, and a data acquisition system. For multiple channels sensing, the data acquisition system may be able to handle multiple fiber sensor arrays to form a sensor network, 19.2, to manage multiple core temperatures.

In order to interrogate multiple fiber sensors in different positions for monitoring the temperature change of each section of corresponding core, the data acquisition system may be required to be capable of working in a wavelength-selectable or wavelength division multiplexing mode (WDM), 19.3, to sweep over the working wavelength of the laser source repeatedly. This may be completed by using a wavelength tunable laser diode, 19.4, in the sensor system. Additionally, since there are multiple sections in the stator core to be inspected, the wavelength tunable range may be required to be as wide as possible in order to manage as many sensors as possible in a single fiber. The data acquisition system may also be required to have a multiple-channel detection ability, 19.5, which may allow each channel to share one laser source and individually interrogate the sensor with a wavelength matching that of the laser source.

In order to complete a measurement of the phase variation in the fringe, the optical frequency of the laser diode may be swept by changing its driving current with a linear modulation waveform, for example, with a saw-tooth waveform signal. This is a frequency division multiplexing working mode (FDM). Therefore one embodiment of a data acquisition system for core temperature monitoring may be able to alternately work under two different working modes, WDM and FDM, 19.6, as illustrated in FIG. 19. Finally, the detected phase value data from different fiber sensors, after preliminarily processing, may be transmitted in a digital form to a computer where additional signal processing may be performed.

Figure 20:
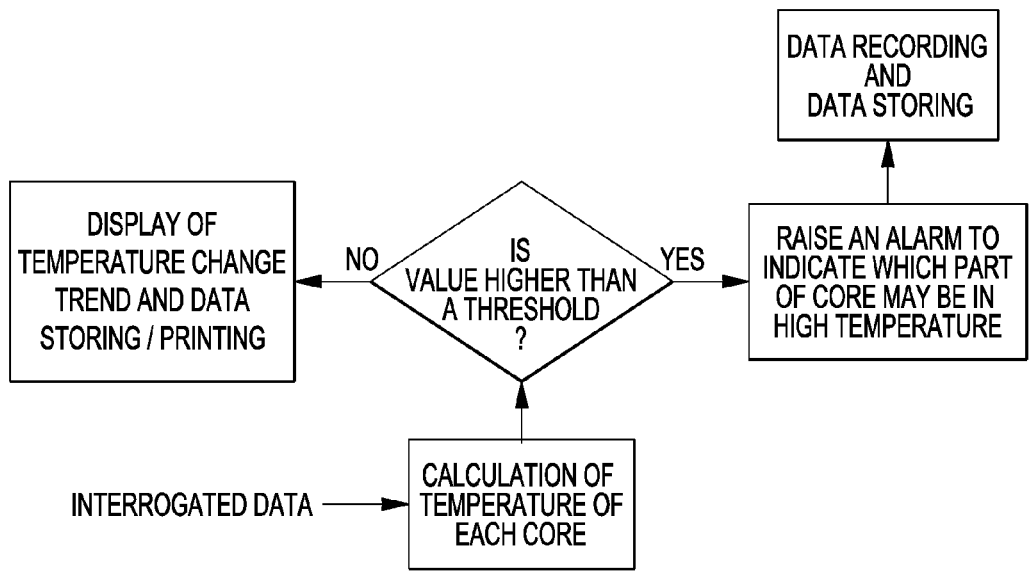
FIG. 20 illustrates functions used in a computer user interface program for core temperature monitoring according to one embodiment.

A diagram for illustrating data processing functions in a computer user interface program is shown in FIG. 20. As illustrated, this software may display the temperature and change trend of each core to be monitored and set off an alarm if the temperature is higher than a threshold set previously by the user.

Example

Figure 21:
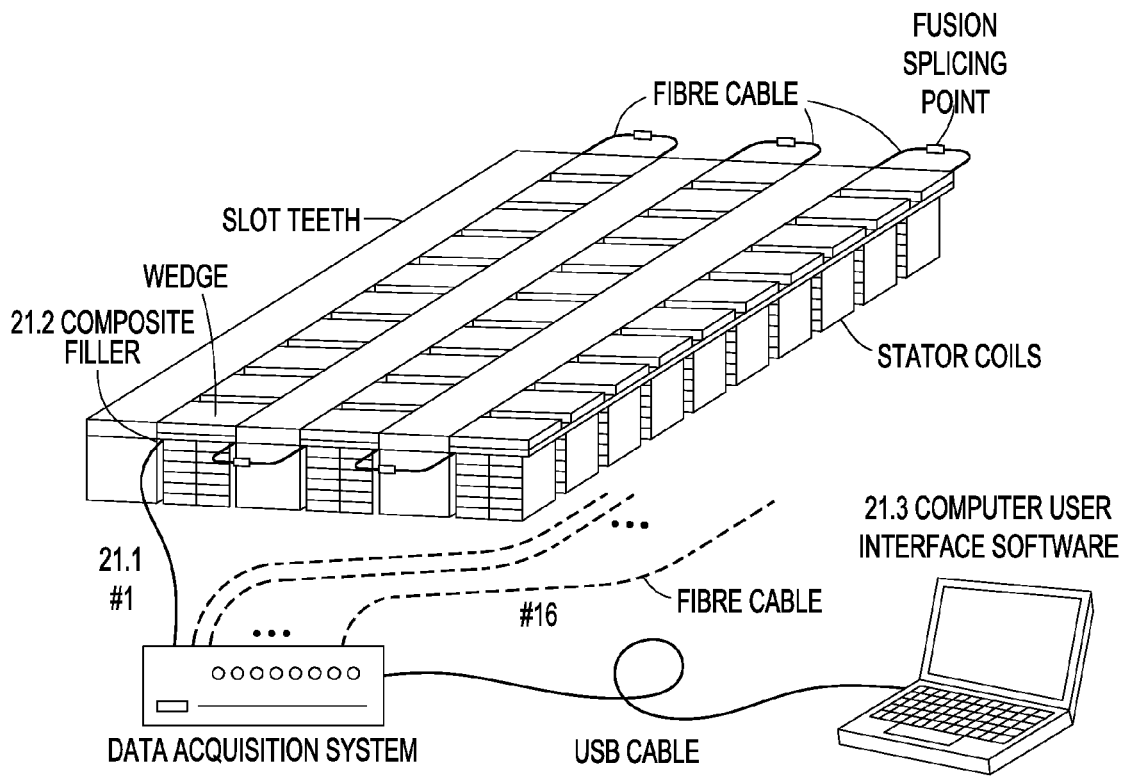
FIG. 21 illustrates a fiber optic core temperature sensor system for monitoring temperature variations in multiple cores in the stator according to one embodiment.

One embodiment of a fiber optic core temperature monitoring system is schematically shown in FIG. 21, in which the data acquisition system may simultaneously handle 16 channels, 21.1, for core temperature monitoring. Each sensor array may be placed below the composite fillers, 21.2, in contact with the core. One sensor array may comprise up to 70 sensors with different wavelengths across the ITU grid in the C-band (1530 nm-1565 nm). A total number of 1120 (16×70) fiber sensors are capable of being handled by this data acquisition system which, in the worst case, would still satisfy the requirement of a large generator.

The detected phase data finally are transmitted into the computer with the user interface software, 21.3, as introduced above, where final data processing and temperature calculation for each sensor may be performed.

Fiber Optic Through Bolt Sensors

The bolt tightness in a generator may be real-time monitored through certain detection methods. An effective detection method may be to use fiber sensor technology to measure the tightness changes according to the changes of the optical signal parameters, such as optical intensity, polarization state or optical phase. This embodiment may comprise a fiberglass washer, with an embedded fiber optic sensor as a sensing element, to be used as a through bolt sensor to detect the relative torque applied on the washer by the bolt. The phase change in the optical detection signal may be used as a characteristic to determine the state of the bolt tightness.

Figure 22:
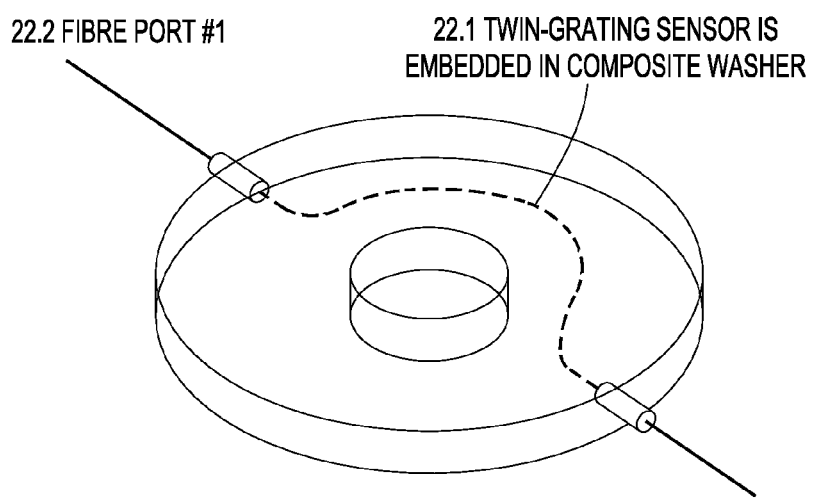
FIG. 22 illustrates a fiber washer with an embedded fiber optic sensor as a fiber optic through bolt sensor according to one embodiment.
Figure 23:
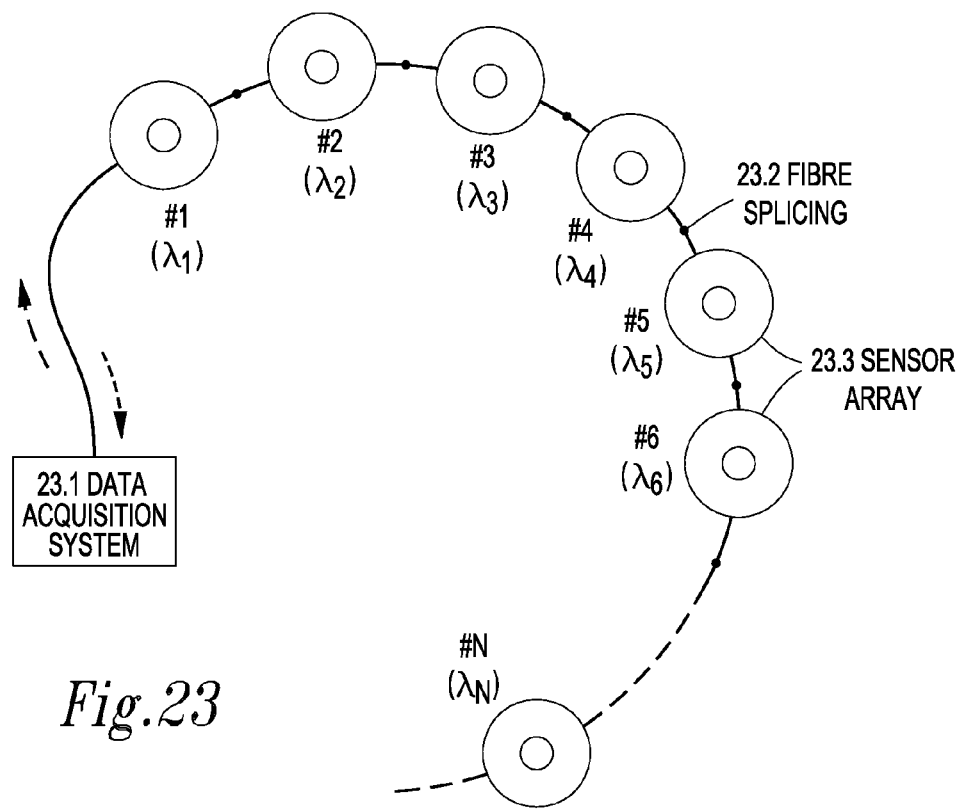
FIG. 23 illustrates a fiber optic through bolt sensor array according to one embodiment.

A schematic view of the fiber optic through bolt sensor is shown in FIG. 22, in which a twin-grating fiber sensor, 22.1, as a sensing element with a designed wavelength, may be embedded into the fiberglass washer. The structure of an individual twin-grating sensor is schematically illustrated in FIG. 10. The fiber optic through bolt sensor may have two fiber ports (22.2, 22.3), which, as pictured in FIG. 23, may be utilized to connect to the data acquisition system, 23.1, or cascade with another sensor by splicing, 23.2, to form a fiber optic through bolt sensor array, 23.3, that may monitor multiple bolts' tightness in one detection period. In a sensor array, each fiber optic through bolt sensor may have a unique wavelength and the information generated by this sensor may be interrogated by a data acquisition system operated at a wavelength matched with that of the sensor. For interrogating multiple sensors, a wavelength-tunable laser source in the data acquisition system may be required.

Figure 24:
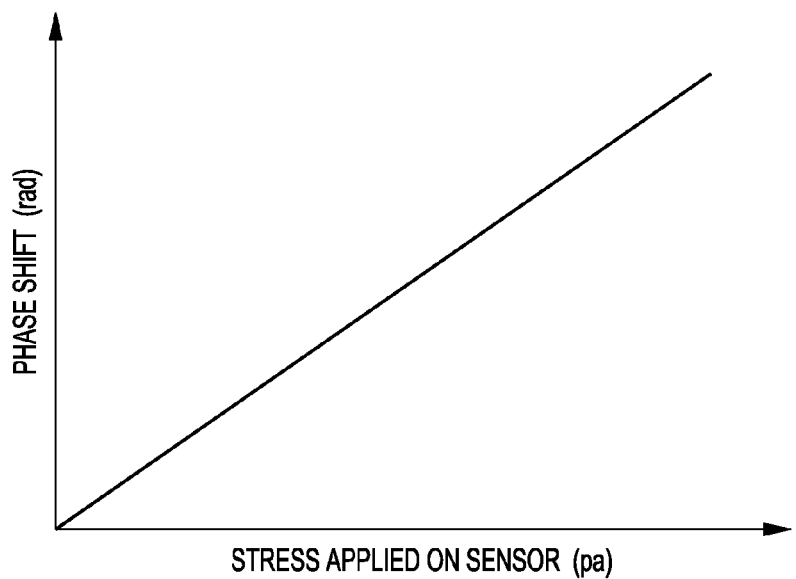
FIG. 24 illustrates a graphical relationship between applied stress on a fiber washer and phase shift in a detected fringe signal according to one embodiment.

A stress on the washer generated by tightening the bolt may generate a change of effective refractive index of the fiber in the fiberglass washer. This change in turn may alter the optical parameters of the twin-grating cavity, such as the cavity length as described with Equation (2) on page 10, which may make the phase of interference signal (fringe) change. This phase shift may be linearly proportional to the amount of stress or torque applied on the washer, as illustrated schematically in FIG. 24. The total phase shift, as a result of the moving fringe, may be measured with the phase algorithm technology.

The phase algorithm technology used for bolt tightness monitoring may be the same as in monitoring the wedge tightness. In operation principle, as shown in FIG. 6, the input detected signal with multiple fringes may be first filtered in time domain by a time window, 6.1, with a window width equal to that of the fringe, in order to extract a target fringe, 6.2, to be real-time tracked afterwards. When the laser source is frequency modulated with a saw-tooth periodic signal, the fringe position in this modulation signal period (a time that the fringe appears in a modulation period) may be determined by the initial phase value of the fringe signal, 6.3. With this phase tracking algorithm, changes in the fringe signal may be detected. For relatively large changes in the bolt tightness, a fringe counting method may be used to decide the amount of phase changes in the fringe signal.

Using this phase algorithm technology, as the state of bolt tightness changes, a phase variation in the fringe signal may be detected, and the change trend of the bolt tightness may also be obtained by comparing the currently measured value with the previously measured value.

Example

Figure 25:
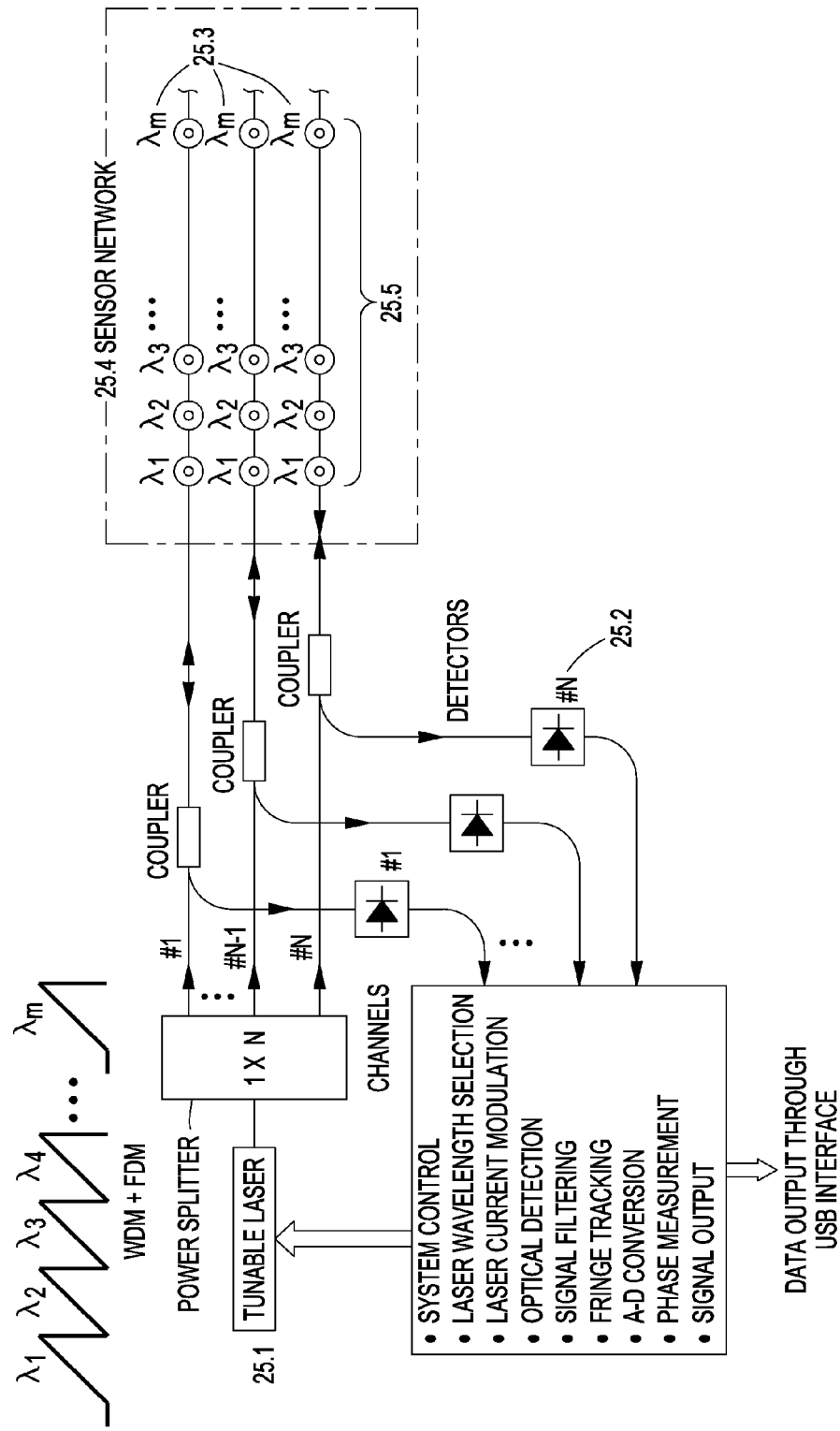
FIG. 25 illustrates a fiber optic through bolt sensor system according to one embodiment.
Figure 26:
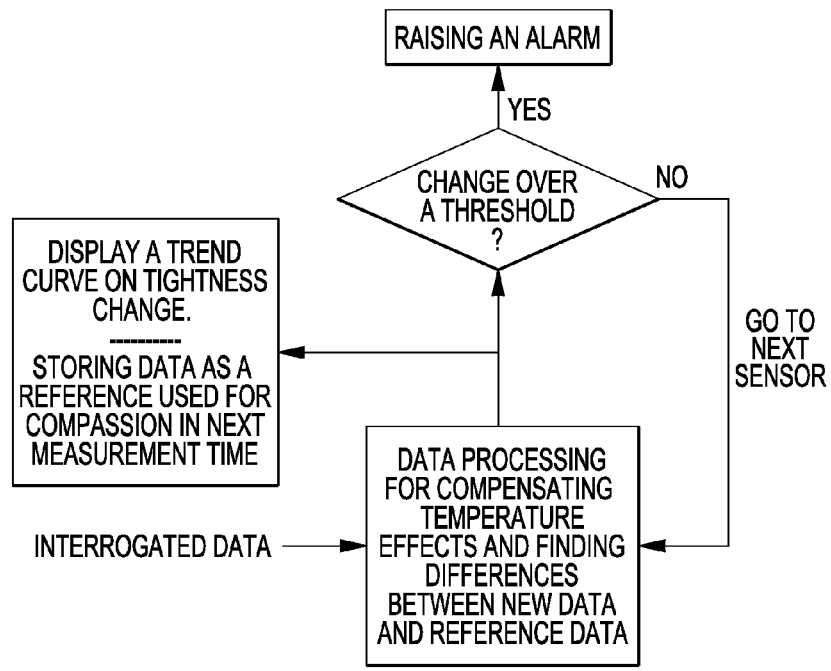
FIG. 26 illustrates functions used in a computer user interface program for through bolt tightness monitoring according to one embodiment.

One embodiment of a fiber optic through bolt sensor system to monitor the tightening states of multiple through bolts in the generator is shown in FIG. 25, in which a wavelength-tunable laser source, 25.1, may be used. The data acquisition system may simultaneously handle N channels, 25.2, and each channel may comprise m through bolt sensors, 25.3, which may form a sensor network, 25.4. The wavelength of laser light may be changed periodically from $\lambda_1$ to $\lambda_m$, 25.5. In this way, each sensor with a designed wavelength may be accessed by the data acquisition system. The laser driving current may be modulated with a saw-tooth signal; in this way the fringes in the optical cavity of the sensor may be read out. The detected fringe signals in analog format may be converted into those in digital format via an analogue-to-digital converter (ADC) and then may be fed into a micro-processing unit (MPU) for preliminary data processing. The processed data then may be transmitted to a computer via a USB cable. In the computer, as described in functional blocks in FIG. 26, the received data may be processed to compensate for the temperature effects. The bolt tightness change trend may be calculated and the two data sets compared: the current one and the previous one. If the bolt tightness decreases lower than the designated threshold an alarm may be raised.

Fiber Optic Parallel Ring Assemblies Sensors

The block tightness in a generator may be real-time monitored through certain detection methods. An effective detection method may be to use fiber sensor technology to measure the tightness changes according to the changes of the optical signal parameters, such as optical intensity, polarization state or optical phase. In this embodiment, a fiberglass block, with an embedded fiber optic sensor as a sensing element, may be used as a parallel ring assembly sensor to detect the pressure, or lack thereof, applied on the block by the bolt. The phase change in the optical detection signal may be used as a characteristic to determine the state of the block tightness.

Figure 27:
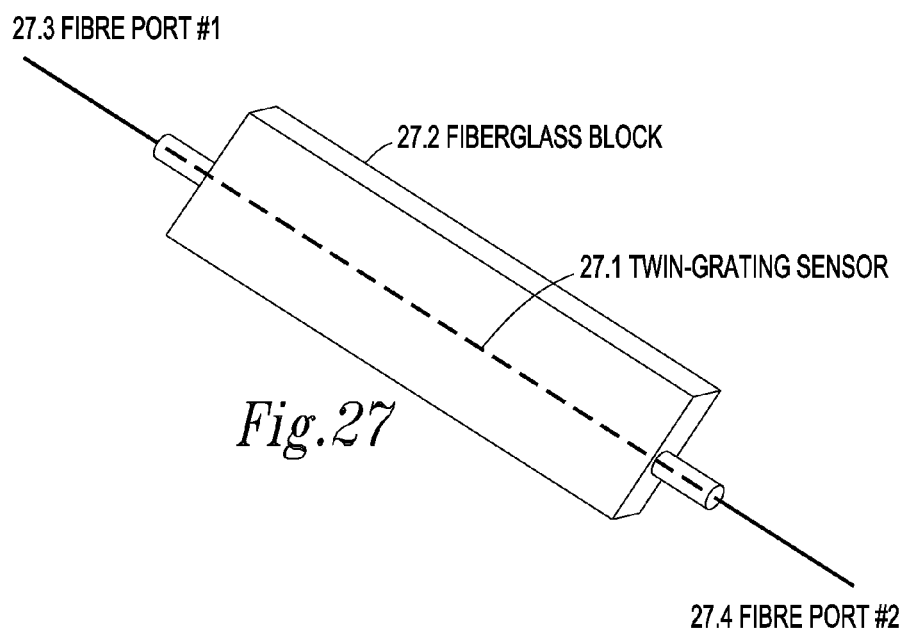
FIG. 27 illustrates a fiber block with fiber optic sensor embedded as a packaged fiber optic parallel ring assembly sensor according to one embodiment.
Figure 28:
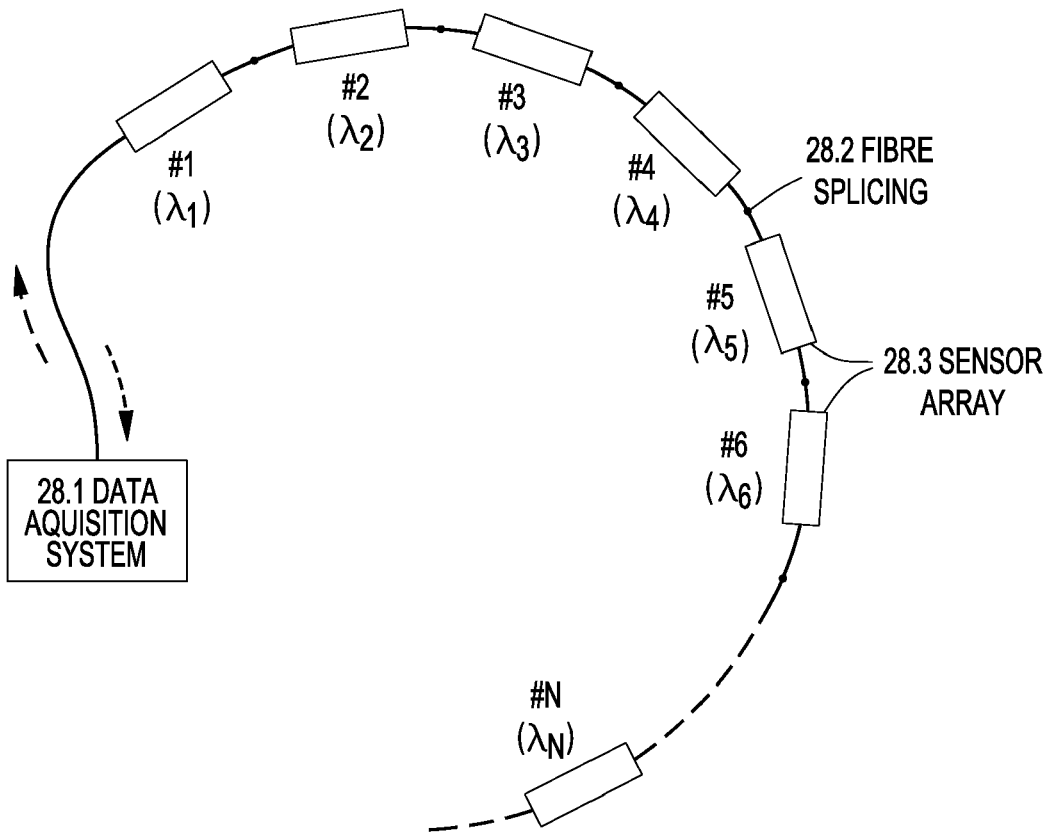
FIG. 28 illustrates a fiber optic parallel ring assembly sensor array according to one embodiment.

A schematic of the fiber optic parallel ring assemblies sensor is shown in FIG. 27, in which a twin-grating fiber sensor, 27.1, as a sensing element with a designed wavelength, may be embedded into fiberglass block, 27.2. The structure of a proposed individual twin-grating sensor is schematically illustrated in FIG. 10. The fiber optic parallel ring assemblies sensor may have two fiber ports (27.3, 27.4), which, as pictured in FIG. 28, may be utilized to connect to the data acquisition system, 28.1, or cascade with another sensor by splicing, 28.2, to form a fiber optic parallel ring assemblies sensor array, 28.3, that may be used to monitor multiple block tightness in one detection period. In a sensor array, each fiber optic parallel ring assembly sensor may have a unique wavelength and the information generated by this sensor may be interrogated by a data acquisition system operated at a wavelength matched with that of sensor. For interrogating multiple sensors, a wavelength-tunable laser source in the data acquisition system may be required.

Stress on the block, generated by tightening the bolt, may generate a change of effective refractive index of the fiber in the fiberglass block. This change may in turn alter the optical parameters of the twin-grating cavity, such as the cavity length as described with Equation (2), which may make the phase of interference signal (fringe) change. This phase shift may be linearly proportional to the amount of stress or torque applied, as illustrated schematically in FIG. 24. The phase shift, as fringe movement, may be completed with the phase measurement technology.

The phase measurement technology used for block tightness monitoring may be the same as that used for monitoring the wedge tightness. In operation principle, as shown in FIG. 6, the input detected signal with multiple fringes may be first filtered in time domain by a time window, 6.1, with a window width equal to that of the fringe, in order to extract a target fringe, 6.2, to be real-time tracked afterwards. When the laser source is frequency modulated with a saw-tooth periodic signal, the fringe position in this modulation signal period (a time that the fringe appears in a modulation period) may be determined by the initial phase value of the fringe signal, 6.3. With this phase tracking algorithm, changes in the fringe signal may be detected. For a relatively large change in the block tightness, a fringe counting method may be used to determine the amount of phase changes in the fringe signal.

Using this phase measurement technology, as the state of block tightness changes, a phase variation in the fringe signal may be detected, and the change trend of the block tightness may also be obtained by comparing the currently measured value with the previously measured value.

Example

Figure 29:
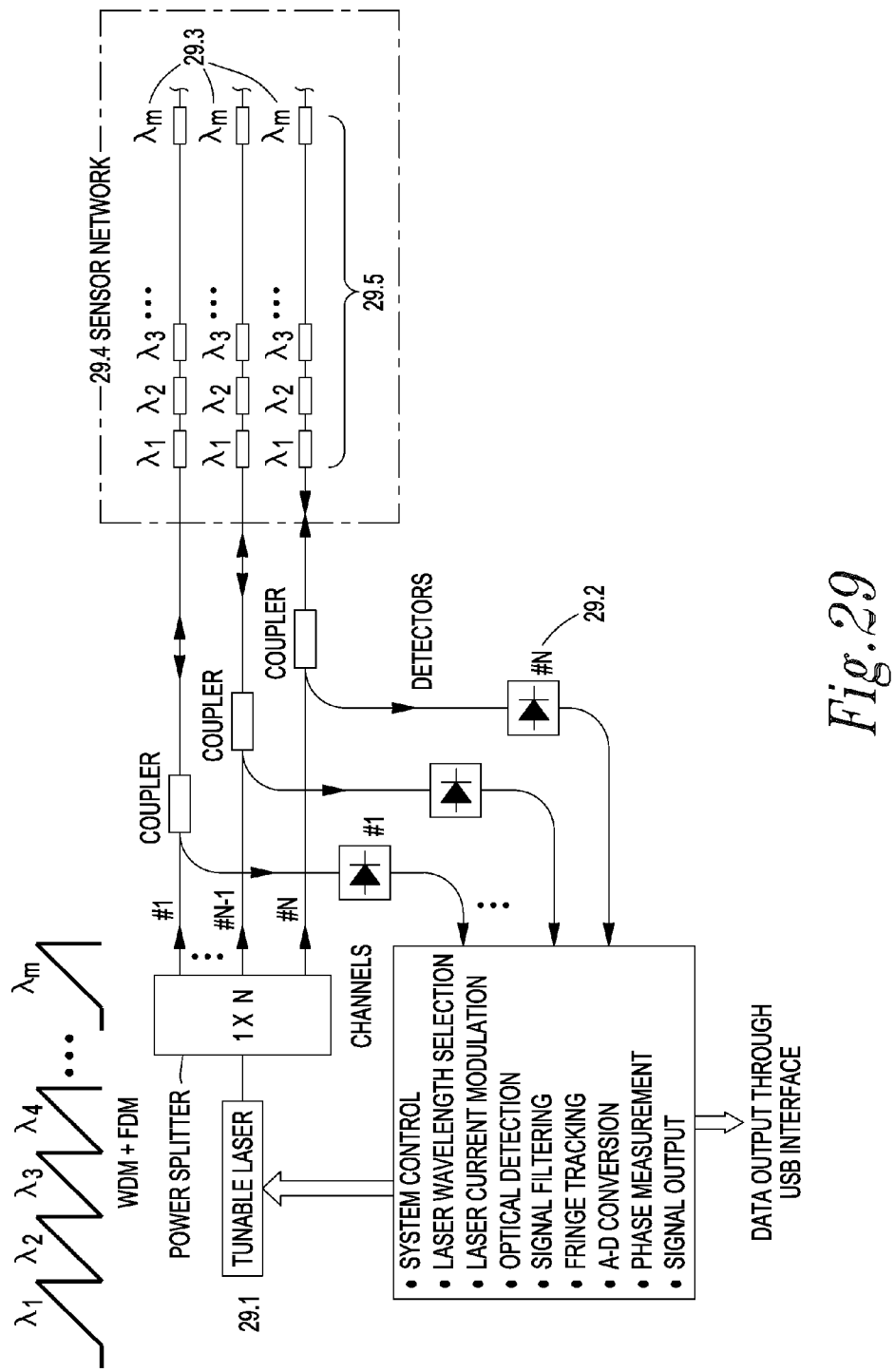
FIG. 29 illustrates a fiber optic parallel ring assembly sensor system according to one embodiment.

One embodiment of a fiber optic parallel ring assembly sensor system to monitor the tightening states of multiple blocks in the generator is shown in FIG. 29, in which a wavelength-tunable laser source, 29.1, may be used. The data acquisition system may simultaneously handle N channels, 29.2, and each channel may comprise m parallel ring assembly sensors, 29.3, which may form a sensor network, 29.4. The wavelength of laser light may be changed periodically from $\lambda_1$ to $\lambda_m$, 29.5. In this way, each sensor with a designed wavelength may be accessed by the data acquisition system. The laser driving current may be modulated with a saw-tooth signal; in this way the fringes in the optical cavity of the sensor may be read out. The detected fringe signals in analog format are converted into those in digital format via an analogue-to-digital converter (ADC) and then are fed into a micro-processing unit (MPU) for preliminary data processing. The processed data then are transmitted to a computer via a USB cable. In the computer, as described in functional blocks in FIG. 26, the received data may be processed to compensate for the temperature effects. The block tightness change trend may be calculated and the two data sets compared: the current one and the previous one. If the block tightness decreases lower than a threshold an alarm may be raised.

Fiber Optic Parallel Ring Temperature Sensors

When the connection in the parallel ring is in poor contact, extra heat may be generated owing to an increase of the contact resistance, which may cause the temperature of the parallel ring to increase rapidly. Therefore temperature rises in the parallel rings of the stator may be monitored real-time and an alarm may be activated when the temperature in a parallel ring increases above a designated threshold. From Equation (2), it will be appreciated that the cavity length of the sensor may be a function of both the strain and temperature, so the same detection principle used in monitoring the block tightness may also be employed to monitor the temperature of the parallel ring. As shown in FIG. 18, a twin-grating sensor array may be shielded in a small-size tube (e.g., a Teflon tube) and may be placed in direct contact with parallel rings without any additional pressure. In this way the sensor may be free of strain and may rapidly detect a temperature rise in the parallel ring monitored. Each sensor may manage a part of the parallel rings and may be registered in the data acquisition system. A slightly modified detection algorithm, originally used for monitoring the block tightness, may be employed to monitor the temperature rise of the parallel ring. The movement of the fringe signal in a sensor may be considered from a temperature rise in the corresponding monitoring area.

Both sensor and the fiber are polyamide coated which may provide the sensor an ability to work in harsh environments with high temperatures of up to 250° C. Also, just like the normal fiber, the polyamide coated fiber sensor may be immune to high voltages and electromagnetic interference.

The phase measurement technology used for temperature detection of the parallel ring may be the same as in monitoring block tightness. In operation principle, as shown in FIG. 6, the input detected signal with multiple fringes may be first filtered in time domain by a time window, 6.1, with a window width equal to that of the fringe, in order to extract a target fringe, 6.2, to be real-time tracked afterwards. When the laser source is frequency modulated with a saw-tooth periodic signal, the fringe position in this modulation signal period (a time that the fringe appears in a modulation period) may be determined by the initial phase value of the fringe signal, 6.3. With this phase tracking algorithm, changes in the ring temperature may be detected. For relatively large temperature changes, a fringe counting method may be used to determine the degree of temperature rises in the parallel ring.

A schematic diagram of fiber optic parallel ring temperature monitoring system is shown in FIG. 19. The basic system (single channel) may comprise a fiber sensor array and a data acquisition system. For multiple channels sensing, the data acquisition system may be able to handle multiple fiber sensor arrays, 19.1, to form a sensor network, 19.2, to manage multiple parallel ring temperatures.

In order to interrogate multiple fiber sensors in different positions for monitoring the temperature rise of corresponding parallel rings, the data acquisition system may be required to be capable of working in a wavelength-selectable or wavelength division multiplexing mode (WDM), 19.3, to sweep over the working wavelength of the laser source repeatedly. This may be completed by using a wavelength tunable laser diode, 19.4, in the sensor system. Additionally, since there are so many parallel rings in stator to be inspected, the wavelength tunable range may be required to be as wide as possible in order to be able to manage as many sensors as possible in a single fiber. The data acquisition system may also be required to have a multiple-channel detection ability which allows each channel to share one laser source and individually interrogate the sensor with a wavelength matching that of the laser source.

In order to complete a measurement of the phase variation in the fringe, the optical frequency of the laser diode may be swept by changing its driving current with a linear modulation waveform, for example, with a saw-tooth waveform signal. This is a frequency division multiplexing working mode (FDM). Therefore one embodiment of a data acquisition system may be able to alternately work under two different working modes, WDM and FDM, 19.6. Finally, the detected phase value data from different fiber sensors, after preliminarily processing, may be transmitted in digital form to a computer where additional signal processing may be performed.

Figure 30:
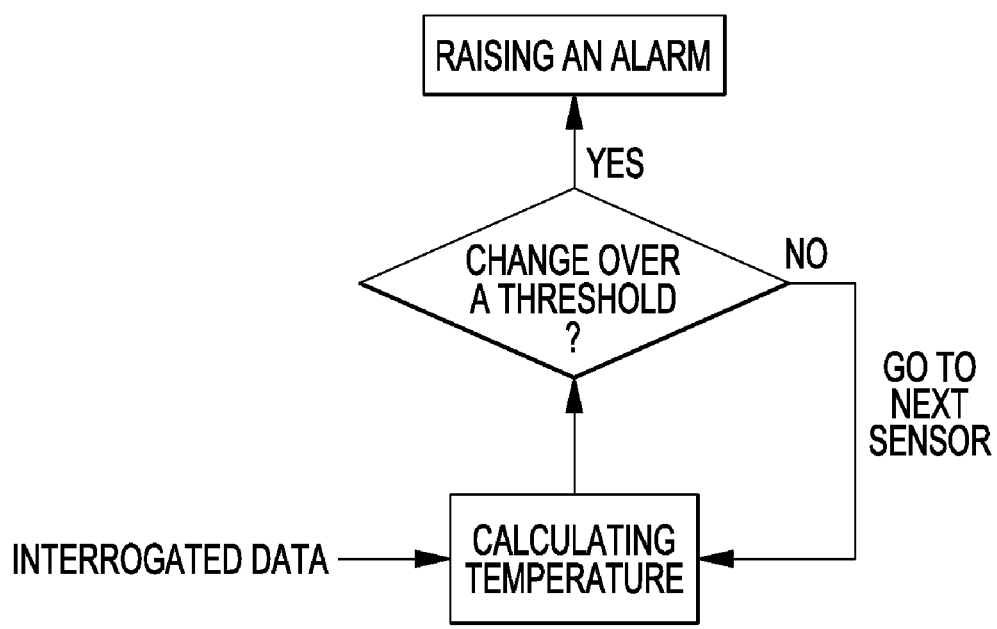
FIG. 30 illustrates functions used in a computer user interface program for parallel ring assembly tightness monitoring according to one embodiment.

A diagram for illustrating data processing functions in a computer user interface program is shown in FIG. 30. As illustrated, this software may be able to display the temperature and change trend of each parallel ring to be monitored and set off an alarm if the temperature is higher than a threshold set previously by the user.

Fiber Optic Coil Connection Temperature Sensors

When the connection in the coil is in poor contact, extra heat may be generated owing to an increase of the contact resistance, which may cause the temperature of the coil connection to increase rapidly. Therefore the temperature rise in the coil connection may be monitored real-time and an alarm may activate when the temperature in a coil connection increases over a designated threshold. From Equation (2), it will be appreciated that the cavity length of the sensor may be a function of both the strain and temperature, so the same detection principle used in monitoring block tightness may also be employed to monitor the temperature rise in the coil connection. As shown in FIG. 18, the similar twin-grating sensor array may be shielded in a small-size Teflon tube and placed in direct contact with coils without any additional pressure. In this way, the sensor may be free of strain and may rapidly detect the temperature rise in the coil connection monitored. Each sensor may manage a coil connection and may be registered in the data acquisition system. A slightly modified detection algorithm originally used for monitoring the coil tightness may be employed to monitor the temperature rise of the coil connection. The movement of the fringe signal in a sensor may be considered from a temperature rise in the corresponding coil connection to be monitored.

Both the sensor and the fiber may be polyamide coated which may provide the sensor an ability to work in a harsh environment with high temperatures of up to 250° C. Also just like the normal fiber, the polyamide coated fiber sensor may be immune to high voltages and electromagnetic interference.

The phase measurement technology used for temperature detection of the coil connection may be the same as used for monitoring block tightness. In operation principle, as shown in FIG. 6, the input detected signal with multiple fringes may be first filtered in time domain by a time window, 6.1, with a window width equal to that of the fringe, in order to extract a target fringe, 6.2, to be real-time tracked afterwards. When the laser source is frequency modulated with a saw-tooth periodic signal, the fringe position in this modulation signal period (a time that the fringe appears in a modulation period) may be determined by the initial phase value of the fringe signal, 6.3. With this phase tracking algorithm, a temperature rise in a coil connection may be detected. For a large temperature change, a fringe counting method may be used to determine the degree of temperature rises in a coil connection.

A schematic diagram of fiber optic coil connection temperature monitoring system is shown in FIG. 19. The basic system (single channel) may comprise a fiber sensor array and a data acquisition system. For multiple channels sensing, the data acquisition system may be able to handle multiple fiber sensor arrays, 19.1, to form a sensor network, 19.2, to manage multiple coils.

In order to interrogate multiple fiber sensors in different positions for monitoring the temperature rise of corresponding coil connection, the data acquisition system may be required to be capable of working in a wavelength-selectable or wavelength division multiplexing mode (WDM), 19.3, to sweep over the working wavelength of the laser source repeatedly. This may be completed by using a wavelength tunable laser diode, 19.4, in the sensor system. Additionally, since there are so many coils in the generator to be inspected, the wavelength tunable range may be required to be as wide as possible in order to be able to manage as many sensors as possible in a single fiber. The data acquisition system may also be required to have a multiple-channel detection ability, 19.5, which may allow each channel to share one laser source and individually interrogate the sensor with a wavelength matching with that of laser source.

In order to complete a measurement of the phase variation in the fringe, the optical frequency of the laser diode may be swept by changing its driving current with a linear modulation waveform, for example, with a saw-tooth waveform signal. This is a frequency division multiplexing working mode (FDM). Therefore one embodiment of a data acquisition system may be able to alternately work under two different working modes, WDM and FDM, 19.6. Finally, the detected phase value data from different fiber sensors, after preliminarily processing, may be transmitted in digital form to a computer where additional signal processing may be performed.

A diagram for illustrating data processing functions in a computer user interface program is shown in FIG. 30. As illustrated, this software may be able to display the temperature and change trend of each coil connection monitored and set off an alarm if the temperature is higher than a threshold set previously by the user.

Fiber Optic Main Lead Vibration/Temperature Sensors

The vibration and temperature of the main lead in a generator are two important parameters which may be real-time monitored through certain detection methods. An increase in the vibration amplitude of the main lead indicates that the main lead may have lost its tightness and integration, and may become free to move. As a result, excess vibration may cause a failure and eventually may cause shorted turns. Accompanying this process, there may be excess heat generated which may raise the temperature of the main lead. An effective detection method may be to use fiber sensor technology to measure the changes of the optical signal parameters, such as optical intensity, polarization state or optical phase, induced by these effects. In this embodiment, a packaged fiber optic vibration/temperature sensor may be used to simultaneously monitor the vibration of the main lead and the temperature changes around the sensor. The movements of the detected fringe signal in high speed and in low speed, for example, may be used as two characteristics to determine the vibration state of the main lead and the temperature variations, respectively.

Description of Technology

Figure 31:
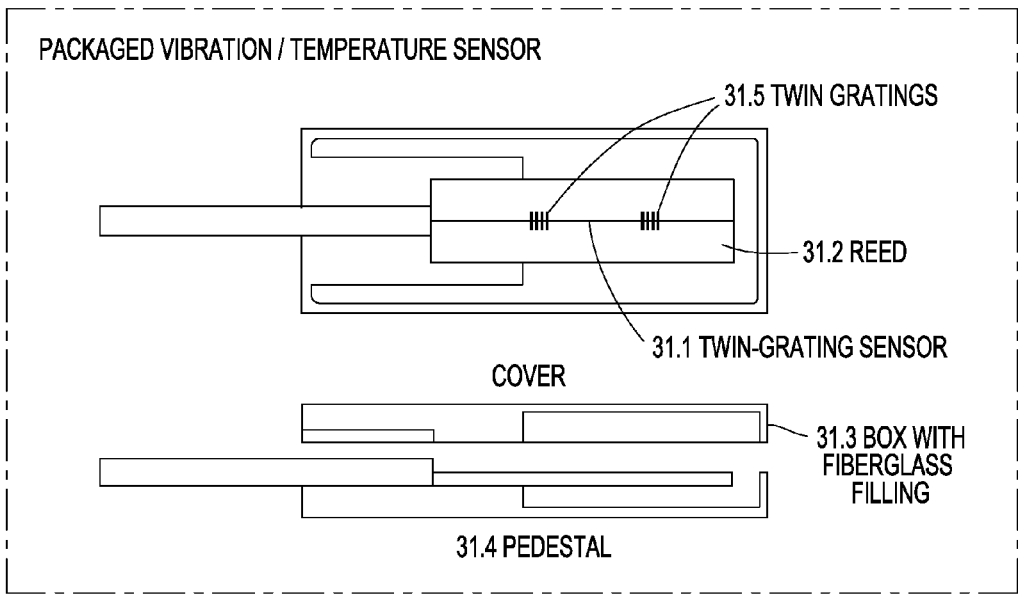
FIG. 31 illustrates a packaged fiber optic vibration/temperature sensor according to one embodiment.

As shown in FIG. 31, a vibration/temperature sensor may comprise a twin-grating fiber sensor, 31.1, as a sensing element, a fiberglass reed forming a vibration board, 31.2, and a nylon box with fiberglass filling, 31.3. The sensing element may be embedded in the fiberglass reed which may be mounted on a pedestal, 31.4, in the sensor box forming a mechanical amplifier.

The sensor's cavity may be formed by two identical fiber gratings (twin gratings), 31.5, in respect to the Bragg wavelength and the reflection rate. In the manufacturing process, the twin gratings may be inscribed in the fiber within a single exposure session by the use of amplitude masks with two equal slits separated by a designed distance. This process theoretically guarantees two FBGs be formed with identical optical characteristics. The sensor finally may be packaged in a sealed box to prevent the ingress of dust and oil or other contaminants. As illustrated schematically by FIG. 32, when the sensor is mounted on an object with mechanical vibration, the reed may vibrate and deform, 32.1, periodically owing to an acceleration applied on the reed, 32.2, which may generate a time-varied stress on the optical cavity structure of the sensor and which may, in turn, induce a phase periodic change, regarded as fringe movement, 32.3, in the detected fringe signal.

Figure 33:
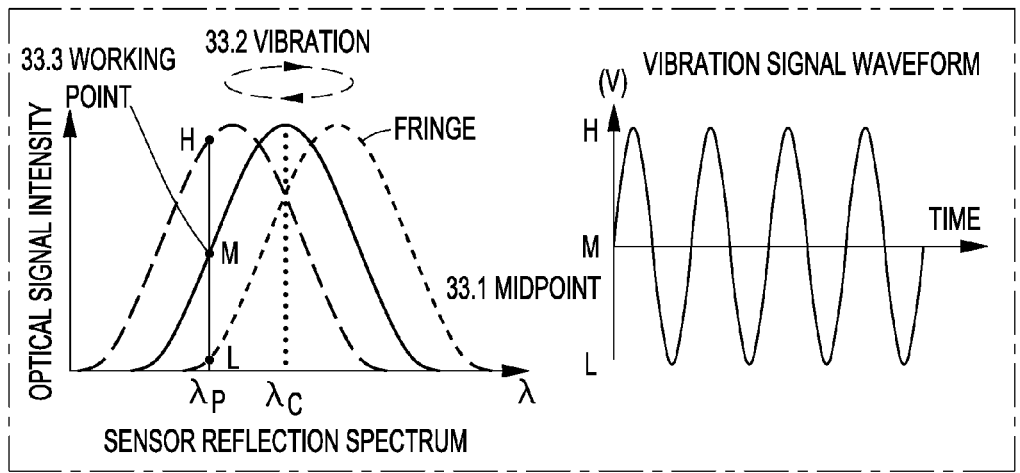
FIG. 33 illustrates measurement of vibration with a fiber optic vibration/temperature sensor according to one embodiment.

FIG. 33 is a schematic for the vibration measurement mechanism which involves an algorithm that tunes the laser central wavelength to the mid-point of a fringe signal through adjusting the driving current of the laser indicated with a letter M, 33.1. This may be regarded as an intersection point or a working point generally used for phase measurements in the sensor technology. When the fringe signal moves to left and right, 33.2, periodically as a result of the vibration of the reed, the working point of the detection system may change, 33.3, along with the slope of the target fringe, moving to the upper portion (H point) and the lower portion (L point) periodically, which may give a different intensity of the reflected light. This may form an effective translation mechanism to convert a wavelength-changed signal to an intensity-changed signal. In this way, the intensity changes in the detection signal may then be interpreted as a detected vibration signal in the analog form.

Figure 34:
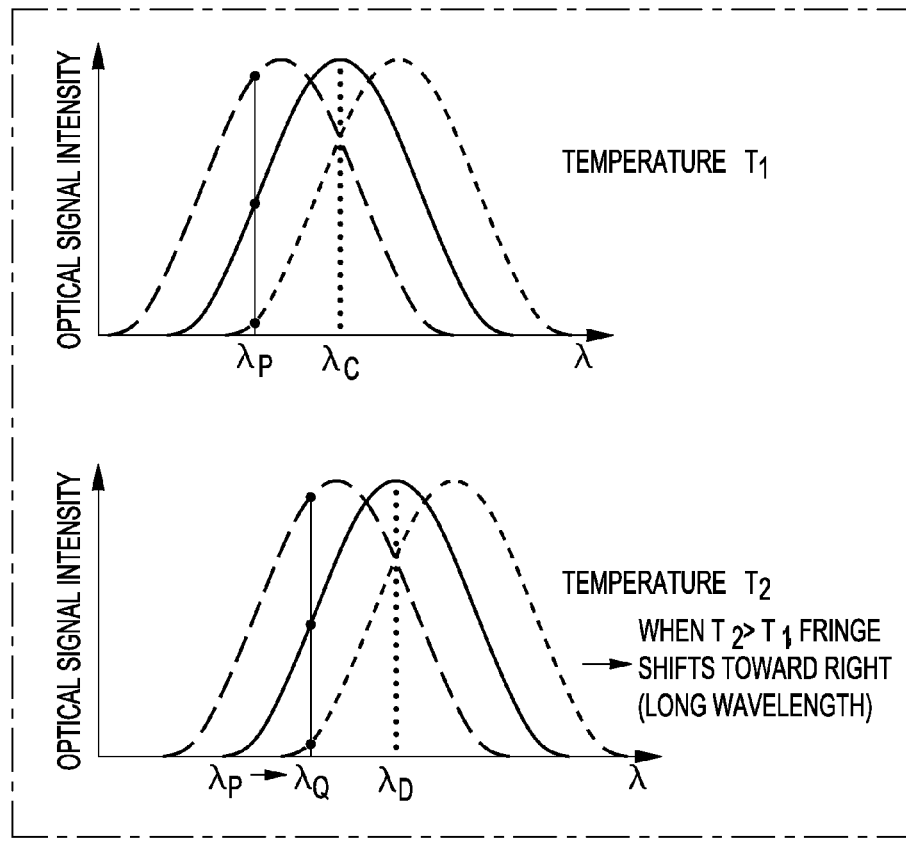
FIG. 34 illustrates movement of a fringe signal with temperature according to one embodiment.

Detection of temperature changes during vibration measurements may be completed by adjusting the laser central wavelength to track the target fringe movement. As shown in FIG. 34, when the temperature around the sensor changes, for example from $T_1$ to $T_2$, the wavelength of the fringe to be detected may shift accordingly from $\lambda_C$ to $\lambda_D$. This process may induce the fringe to move toward the long wavelength which, as a result of working point changing, may induce a decrease of the output amplitude of the vibration signal. In order to keep the output amplitude of the vibration signal constant, the laser central wavelength may be tuned to dynamically track the target fringe movement. As illustrated in FIG. 34, the laser central wavelength may be adjusted from $\lambda_P$ to $P_Q$, which, theoretically, makes the working point recover to the original position and consequently keeps the vibration signal amplitude constant. This fringe-tracking process may be completed by adjusting the laser drive current based on an error signal measured from the deviation of the vibration signal amplitude.

While adjusting the drive current of the laser diode may be fast enough to tune the laser central wavelength to track the target fringe movement to readjust the working point, the technique may have a limited tuning range. Beyond this range, the laser central wavelength may be tuned with the help of the thermoelectric cooler (TEC) drive current adjustment. As known, the laser central wavelength changes linearly with the operation temperature that may be controlled by the TEC and may have a large tuning span and change rate per ° C. Therefore, besides the laser drive current control, the TEC's drive current control may be used to tune the laser central wavelength to track the target fringe movement within a large temperature span. Basically, the laser's drive current control may be employed for fine wavelength tuning, while the TEC's drive current control may be employed for wavelength tuning in a larger scale. The two control methods may be alternately employed in the sensor system for achieving an accurate adjustment of the laser center wavelength to track the target fringe movement. Based on this control algorithm, the variations of the vibration signal amplitude from the working point movement, due to the temperature changes, may be compensated. At the same time, the deviation values in TEC's drive current and the laser drive current may be read out as a measured value for estimating the temperature changes affecting the sensor head. The relationships between the sensor temperature, which results in sensor wavelength shift, may then be compensated by the laser wavelength shift due to changes in the drive currents of the laser and the TEC, as shown in FIG. 3 (1), (2) and (3), respectively. From these relationships, it will be appreciated that the temperature change around the sensor may be obtained from the deviation values of drive currents of the laser and TEC.

Example

Figure 36:
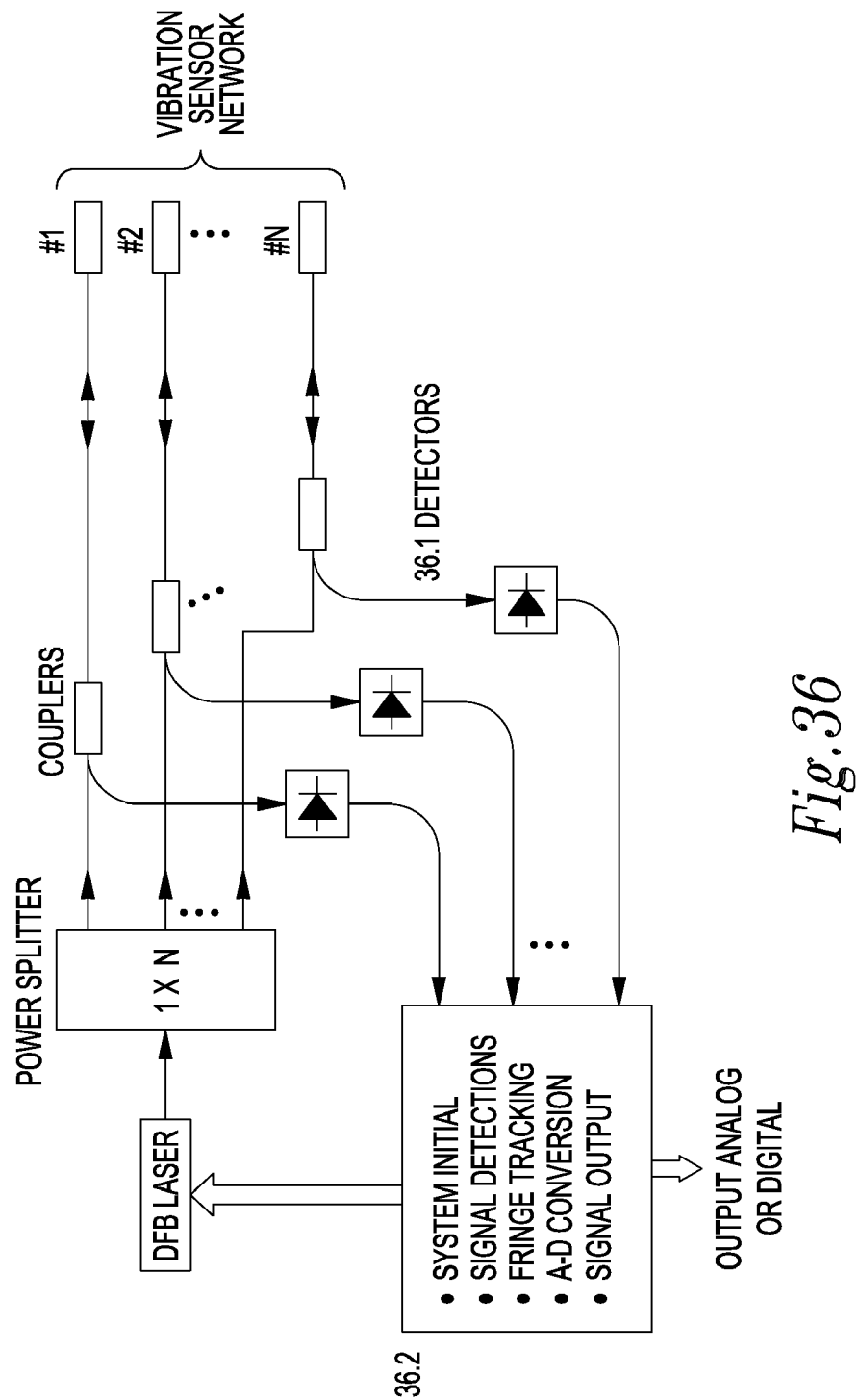
FIG. 36 illustrates a fiber optic vibration/temperature sensor system according to one embodiment.
Figure 37:
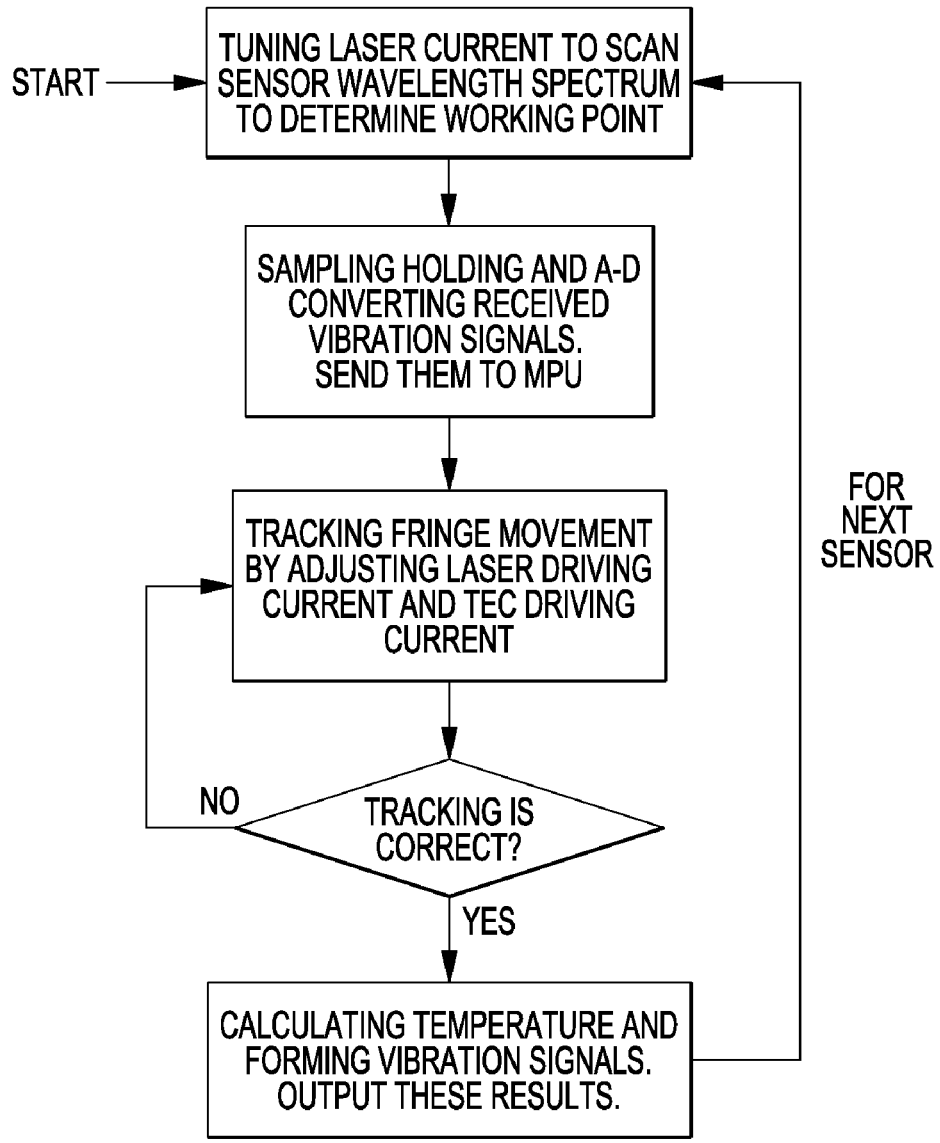
FIG. 37 illustrates a detection process in a fiber optic vibration/temperature sensor system according to one embodiment.
Figure 38:
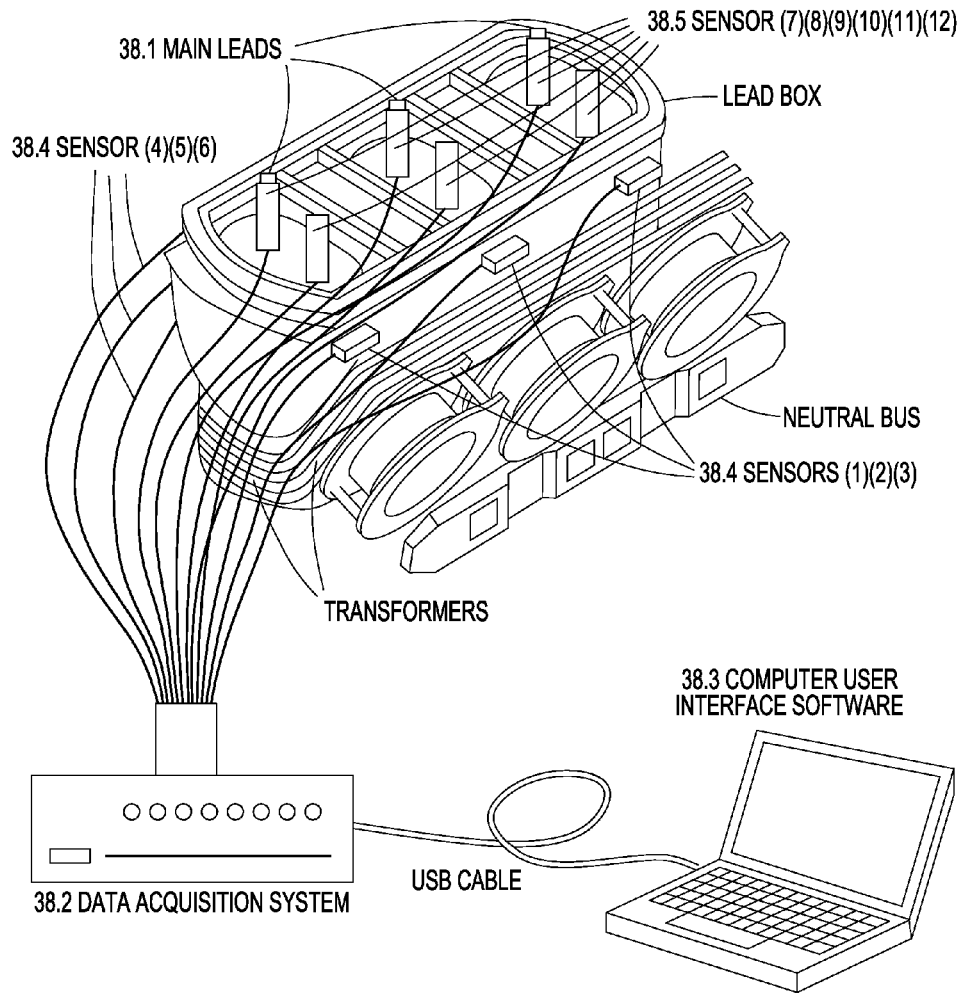
FIG. 38 illustrates a fiber optic vibration/temperature sensor system for monitoring vibration states and temperature variations in main leads according to one embodiment.

One embodiment of a sensor system may be able to operate in a multi-channel mode by using multiplexing technology to monitor the vibration and the temperature variation at different main leads simultaneously, as shown in FIG. 36, where N sensors may be employed for simultaneously monitoring N-point vibrations and the temperature variations in the generator. The reflected lights from each sensor may be detected, 36.1 and the vibrations and temperature variations at each monitoring point may be read out and calculated, 36.2, respectively, with the algorithm mentioned above. The detailed process for possible vibration and temperature variation detections for each sensor is explained with a flowchart as shown in FIG. 37. In one embodiment, as shown in FIG. 38, a sensor system may use a distributed feedback (DFB) laser as the light source and six sensors, 38.1, to monitor the vibrations and temperature variations at six different main leads in the generator. To measure temperature changes while the vibration is measured, the laser drive current may be adjusted one step lower than 1 mA, so that the intensity of the laser output is not affected excessively. For example, the system may calculate the temperature change as an indirect temperature measurement around the sensor by multiplying the total changed current values with the following parameters: for each ° C. change in laser chip temperature, the central wavelength of the laser may move by 100 picometer; and for the driving current change of every 1 mA, the central wavelength of the laser may shift by 10 picometer. This control mechanism may balance the sensor wavelength shift in a change rate up to 10 picometer per ° C. The measured data may be transmitted from the data acquisition system, 38.2, to a computer, 38.3, via a USB cable. In the computer, a graphical user interface program may show the detected multi-channel vibration waveforms, signal spectrums and temperature change trends. Using the user interface program, the user could set the alarm threshold for each monitoring point in the main leads.

Fiber Optic End Winding Vibration/Temperature Sensors

The vibration and temperature of the end winding in a generator are two important parameters which may be real-time monitored through certain detection methods. An increase in the vibration amplitude of the end winding may indicate that the end winding has lost its tightness and integration, and become free to move. As a result, excess vibration may cause failure of the windings. Accompanying this process, there may be excess heat generated which may raise the temperature of the winding. An effective detection method may be to use fiber sensor technology to measure the changes of the optical signal parameters, such as optical intensity, polarization state, or optical phase that may be induced by these effects. In this embodiment, a packaged fiber optic vibration/temperature sensor may be used to simultaneously monitor the vibration of the end winding and the temperature changes around the sensor. The movements of the detected fringe signal in high speed and in low speed may be used as two characteristics to determine the vibration state of the end winding and the temperature variations, respectively.

Description of Technology

A vibration/temperature sensor, as shown in FIG. 31, may comprise a twin-grating fiber sensor, 31.1, as a sensing element, a fiberglass reed forming a vibration board, 31.2, and a nylon box with fiberglass filling, 31.3. The sensing element may be embedded in the fiberglass reed which may be mounted on the pedestal, 31.4, in the sensor box forming a mechanical amplifier.

The sensor's cavity may be formed by two identical fiber gratings (twin gratings), 31.5, in respect to the Bragg wavelength and the reflection rate. In the manufacturing process, the twin gratings may be inscribed in the fiber within a single exposure session by the use of amplitude masks with two equal slits separated by a designed distance. This process theoretically guarantees two FBGs be formed with identical optical characteristics. The sensor finally may be packaged in a sealed box to prevent the ingress of dust and oil.

Figure 32:
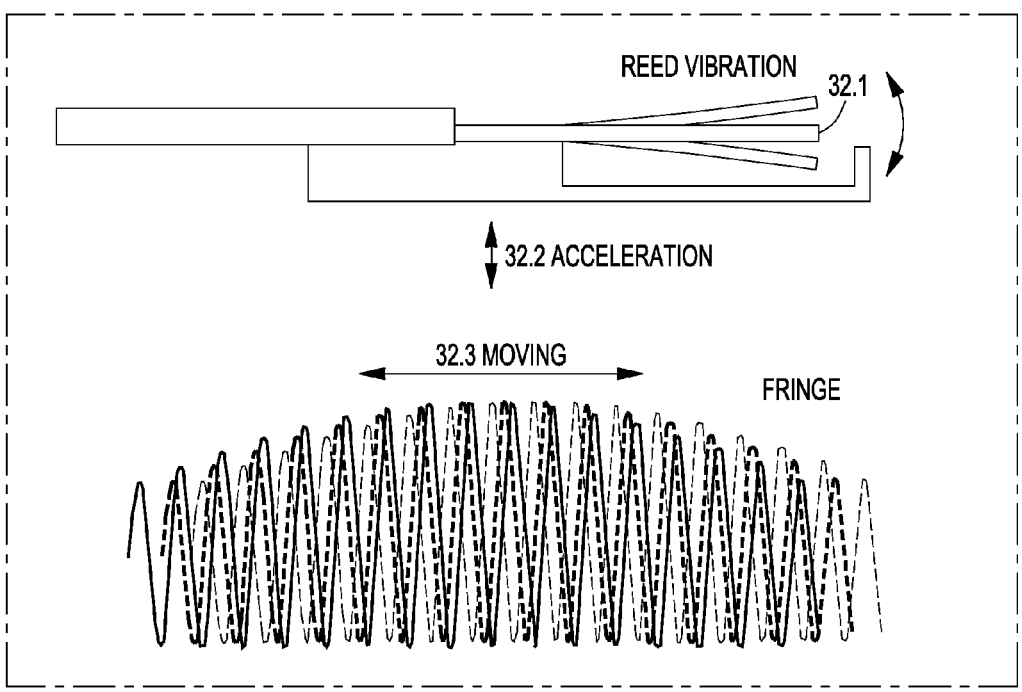
FIG. 32 illustrates fringe signal movement during reed vibration according to one embodiment.

As illustrated schematically by FIG. 32, when the sensor is mounted on an object with mechanical vibration, the reed may vibrate and deform, 32.1 periodically owing to an acceleration applied on the reed, 32.2, which may generate a time-varied stress on the optical cavity structure of the sensor and which may, in turn, induce a phase periodic change, regarded as fringe movement, 32.3, in the detected fringe signal.

FIG. 33 is a schematic for the vibration measurement mechanism which involves an algorithm that tunes the laser central wavelength to the mid-point of a fringe signal through adjusting the driving current of the laser indicated with a letter M, 33.1. This may be regarded as an intersection point or a working point generally used for phase measurements in the sensor technology. When the fringe signal moves to left and right, 33.2, periodically as a result of the vibration of the reed, the working point of the detection system may change, 33.3, along with the slope of the target fringe, moving to the upper portion (H point) and the lower portion (L point) periodically, which may give a different intensity of the reflected light. This may form an effective translation mechanism to convert a wavelength-changed signal to an intensity-changed signal. In this way, the intensity changes in the detection signal may then be interpreted as a detected vibration signal in the analog form.

Detection of temperature changes during vibration measurements may be completed by adjusting the laser central wavelength to track the target fringe movement. As shown in FIG. 34, when the temperature around the sensor changes, for example from $T_1$ to $T_2$, the wavelength of the fringe to be detected may shift accordingly from $\lambda_C$ to $\lambda_D$. This process may induce the fringe to move toward the long wavelength which, as a result of working point changing, may induce a decrease of the output amplitude of the vibration signal. In order to keep the output amplitude of the vibration signal constant, the laser central wavelength may be tuned to dynamically track the target fringe movement. As illustrated in FIG. 34, the laser central wavelength may be adjusted from $\lambda_P$ to $\lambda_Q$, which, theoretically, makes the working point recover to the original position and consequently keeps the vibration signal amplitude constant. This fringe-tracking process may be completed by adjusting the laser drive current based on an error signal measured from the deviation of the vibration signal amplitude.

Figure 35:
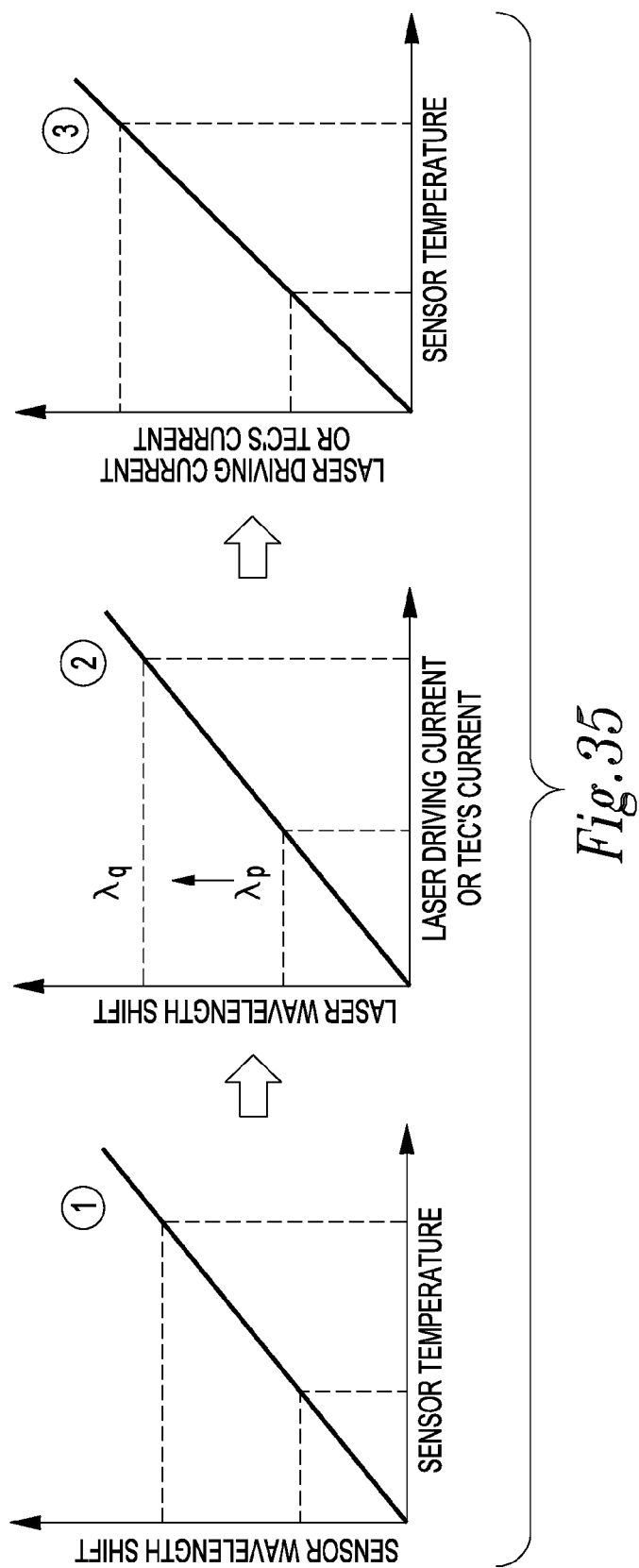
FIG. 35 illustrates graphical relationships between wavelength and temperature of sensor, between laser wavelength and laser control currents and between laser control currents and the sensor temperature according to various embodiments.

While adjusting the drive current of the laser diode may be fast enough to tune the laser central wavelength to track the target fringe movement to readjust the working point, the technique may have a limited tuning range. Beyond this range, the laser central wavelength may be tuned with the help of the thermoelectric cooler (TEC) drive current adjustment. As known, the laser central wavelength changes linearly with the operation temperature that may be controlled by the TEC and may have a large tuning span and change rate per ° C. Therefore, besides the laser drive current control, the TEC's drive current control may be used to tune the laser central wavelength to track the target fringe movement within a large temperature span. Basically, the laser's drive current control may be employed for fine wavelength tuning, while the TEC's drive current control may be employed for wavelength tuning in a larger scale. The two control methods may be alternately employed in the sensor system for achieving an accurate adjustment of the laser center wavelength to track the target fringe movement. Based on this control algorithm, the variations of the vibration signal amplitude from the working point movement, due to the temperature changes, may be compensated. At same time, the deviation values in TEC's drive current and the laser drive current may be read out as a measured value for estimating the temperature changes affecting the sensor head. The relationships between the sensor temperature, which results in sensor wavelength shift, may then be compensated by the laser wavelength shift due to changes in the drive currents of the laser and the TEC, as shown in FIG. 35 (1), (2) and (3), respectively. From these relationships, it will be appreciated that the temperature change around the sensor may be obtained from the deviation values of drive currents of the laser and TEC.

Example

One embodiment of a sensor system may be able to operate in a multi-channel mode by using multiplexing technology to monitor the vibration and the temperature variation of the different end windings, simultaneously, as shown in FIG. 36, where N sensors may be employed for simultaneously monitoring N-point vibrations and the temperature variations in the generator. The reflected lights from each sensor may be detected, 36.1 and the vibrations and temperature variations at each monitoring point may be read out and calculated, 36.2, respectively, with the algorithm mentioned above. The detailed process for possible vibration and temperature variation detections for each sensor is explained with a flowchart as shown in FIG. 37.

Figure 39:
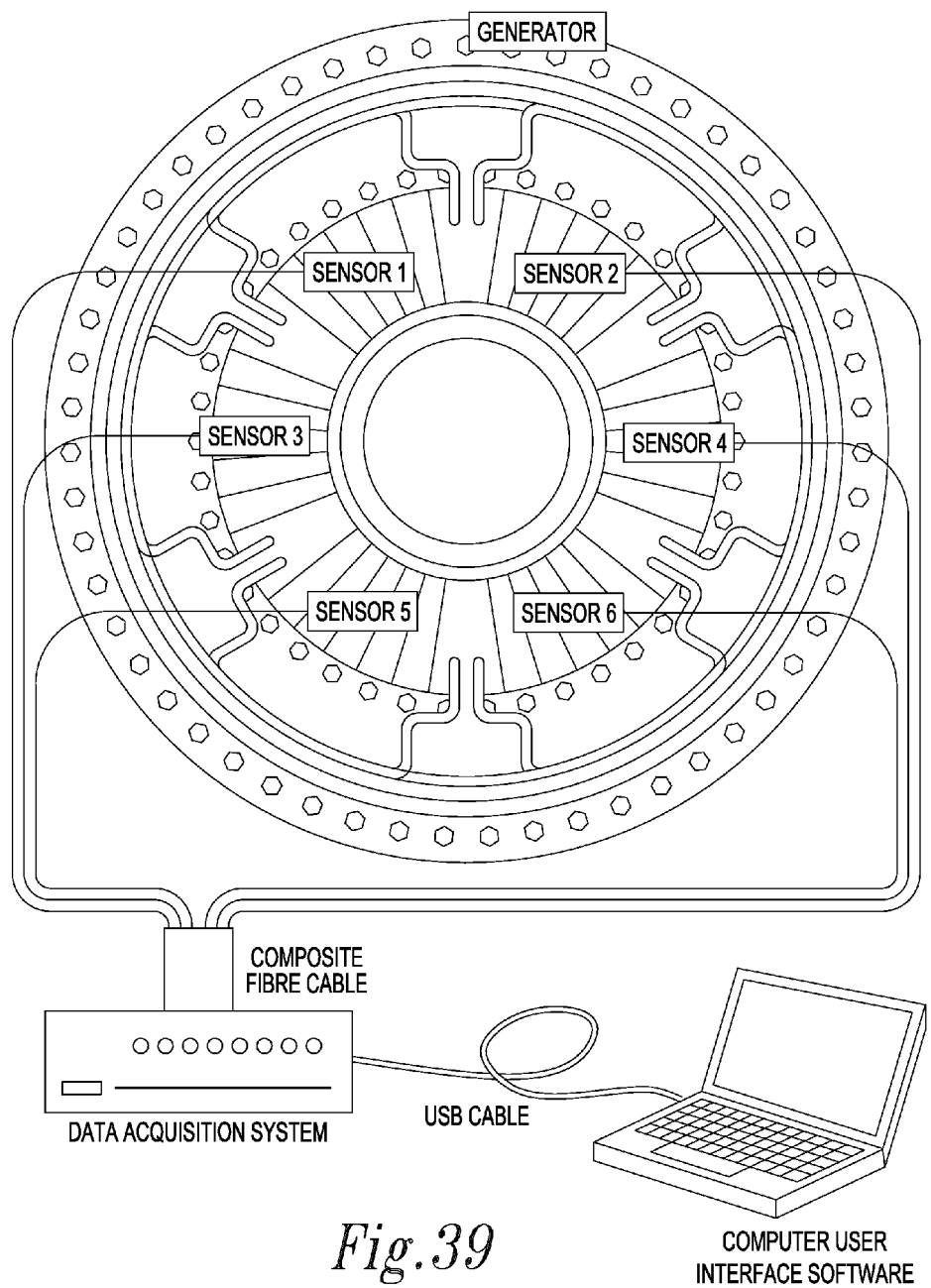
FIG. 39 illustrates a fiber optic vibration/temperature sensor system for monitoring vibration states and temperature variations in a lead box according to one embodiment.

In one embodiment, a sensor system may use a distributed feedback (DFB) laser as the light source and 12 sensors to monitor the vibrations and temperature variations at six drive end and six non-drive end windings in the generator as shown in FIG. 39. To measure temperature changes while the vibration is measured, the laser drive current may be adjusted one step lower than 1 mA, for example, so that the intensity of the laser output is not affected excessively. In another example, the system may calculate the temperature change as an indirect temperature measurement around the sensor by multiplying the total changed current values with the following parameters: for each ° C. change in laser chip temperature, the central wavelength of the laser may move by 100 picometer; and for the driving current change of every 1 mA, the central wavelength of the laser may shift by 10 picometer. This control mechanism may balance the sensor wavelength shift in a change rate up to 10 picometer per ° C. The measured data may be transmitted from the data acquisition system, 38.2, to a computer, 38.3, via a USB cable. In the computer, a graphical user interface program may show the detected multi-channel vibration waveforms, signal spectrums and temperature change trends. Using the user interface program, the user could set the alarm threshold for each monitoring point in the end windings.

Fiber Optic Lead Box Vibration/Temperature Sensors

The vibration and temperature of the lead box in a generator are two important parameters which may be real-time monitored through certain detection methods. An increase in the vibration amplitude of the lead box may indicate that the lead box structure has lost its integration, and may become free to move. As a result, excess vibration may cause structure cracking and may result in hydrogen leakage which may increase the risk of fire. Accompanying this process, there may be excess heat generated which may raise the temperatures at different positions of the lead box. An effective detection method may be to use fiber sensor technology to measure the changes of the optical signal parameters, such as optical intensity, polarization state or optical phase, induced by these effects. In this embodiment, a packaged fiber optic vibration/temperature sensor may be used to simultaneously monitor the vibration of the lead box and the temperature changes around the sensor. The movements of the detected fringe signal in high speed and in low speed may be used as two characteristics to determine the vibration state of the lead box and the temperature variations, respectively.

Description of Technology

As shown in FIG. 31, a vibration/temperature sensor may comprise a twin-grating fiber sensor, 31.1, as a sensing element, a fiberglass reed forming a vibration board, 31.2, and a nylon box with fiberglass filling, 31.3. The sensing element may be embedded in the fiberglass reed which may be mounted on a pedestal, 31.4, in the sensor box forming a mechanical amplifier.

The sensor's cavity may be formed by two identical fiber gratings (twin gratings), 31.5, in respect to the Bragg wavelength and the reflection rate. In the manufacturing process, the twin gratings may be inscribed in the fiber within a single exposure session by the use of amplitude masks with two equal slits separated by a designed distance. This process theoretically guarantees two FBGs be formed with identical optical characteristics. The sensor finally may be packaged in a sealed box to prevent the ingress of dust and oil.

As illustrated schematically by FIG. 32, when the sensor is mounted on an object with mechanical vibration, the reed may vibrate and deform, 32.1 periodically owing to an acceleration applied on the reed, 32.2, which may generate a time-varied stress on the optical cavity structure of the sensor and which may, in turn, induce a phase periodic change, regarded as fringe movement, 32.3, in the detected fringe signal.

FIG. 33 is a schematic for the vibration measurement mechanism which involves an algorithm that tunes the laser central wavelength to the mid-point of a fringe signal through adjusting the driving current of the laser indicated with a letter M, 33.1. This may be regarded as an intersection point or a working point generally used for phase measurements in the sensor technology. When the fringe signal moves to left and right, 33.2, periodically as a result of the vibration of the reed, the working point of the detection system may change, 33.3, along with the slope of the target fringe, moving to the upper portion (H point) and the lower portion (L point) periodically, which may give a different intensity of the reflected light. This may form an effective translation mechanism to convert a wavelength-changed signal to an intensity-changed signal. In this way, the intensity changes in the detection signal may then be interpreted as a detected vibration signal in the analog form.

Detection of temperature changes during vibration measurements may be completed by adjusting the laser central wavelength to track the target fringe movement. As shown in FIG. 34, when the temperature around the sensor changes, for example from $T_1$ to $T_2$, the wavelength of the fringe to be detected may shift accordingly from $\lambda_C$ to $\lambda_D$. This process may induce the fringe to move toward the long wavelength which, as a result of working point changing, may induce a decrease of the output amplitude of the vibration signal. In order to keep the output amplitude of the vibration signal constant, the laser central wavelength may be tuned to dynamically track the target fringe movement. As illustrated in FIG. 34, the laser central wavelength may be adjusted from $\lambda_P$ to $\lambda_Q$, which, theoretically, makes the working point recover to the original position and consequently keeps the vibration signal amplitude constant. This fringe-tracking process may be completed by adjusting the laser drive current based on an error signal measured from the deviation of the vibration signal amplitude.

While adjusting the drive current of the laser diode may be fast enough to tune the laser central wavelength to track the target fringe movement to readjust the working point, the technique may have a limited tuning range. Beyond this range, the laser central wavelength may be tuned with the help of the thermoelectric cooler (TEC) drive current adjustment. As known, the laser central wavelength changes linearly with the operation temperature that may be controlled by the TEC and may have a large tuning span and change rate per ° C. Therefore, besides the laser drive current control, the TEC's drive current control may be used to tune the laser central wavelength to track the target fringe movement within a large temperature span. Basically, the laser's drive current control may be employed for fine wavelength tuning, while the TEC's drive current control may be employed for wavelength tuning in a larger scale. The two control methods may be alternately employed in the sensor system for achieving an accurate adjustment of the laser center wavelength to track the target fringe movement. Based on this control algorithm, the variations of the vibration signal amplitude, from the working point, movement due to the temperature changes may be compensated. At same time, the deviation values in TEC's drive current and the laser drive current may be read out as a measured value for estimating the temperature changes affecting the sensor head. The relationships between the sensor temperature, which results in sensor wavelength shift, may then be compensated by the laser wavelength shift due to changes in the drive currents of the laser and the TEC, as shown in FIG. 35 (1), (2) and (3), respectively. From these relationships, it will be appreciated that the temperature change around the sensor may be obtained from the deviation values of drive currents of the laser and TEC.

Example

Embodiments of a sensor system may be able to operate in a multi-channel mode by using multiplexing technology to monitor the vibration and the temperature variation at six points on the lead box simultaneously, as shown in FIG. 36, where N sensors may be employed for simultaneously monitoring N-point vibrations and the temperature variations in the generator. The reflected lights from each sensor may be detected, 36.1 and the vibrations and temperature variations at each monitoring point may be read out and calculated, 36.2, respectively, with the algorithm mentioned above. The detailed process for possible vibration and temperature variation detections for each sensor is explained with a flowchart as shown in FIG. 37.

In one embodiment, as shown in FIG. 38, a sensor system may use a distributed feedback (DFB) laser as the light source and six sensors, 38.4, to monitor the vibrations and temperature variations at six different points on the lead box in the generator. For example, to measure temperature changes while the vibration is measured, the laser drive current may be adjusted one step lower than 1 mA, so that the intensity of the laser output is not affected excessively. In another example, the system may calculate the temperature change as an indirect temperature measurement around the sensor by multiplying the total changed current values with the following parameters: for each ° C. change in laser chip temperature, the central wavelength of the laser may move by 100 picometer; and for the driving current change of every 1 mA, the central wavelength of the laser may shift by 10 picometer. This control mechanism may balance the sensor wavelength shift in a change rate up to 10 picometer per °C. The measured data may be transmitted from the data acquisition system, 38.2, to a computer, 38.3, via a USB cable. In the computer, a graphical user interface program may show the detected multi-channel vibration waveforms, signal spectrums and temperature change trends. Using the user interface program, the user could set the alarm threshold for each monitoring point in the lead box.

Fiber Optic all Flow/Temperature Sensor

The rate and temperature of flow, including by way of example air, gas, water and hydrogen, in a power generator system are two parameters which may be real-time monitored during the operation of the power generator system. The majority of transducers used in flow measurement, basically, are the electric-driving type of sensor such as piezoelectric or capacitance-type sensors. These types of sensors cannot be employed in some special situations such as in the power generator system where there exists the large current and high intensity electromagnetic field. With fiber optic sensing technology, it may be possible to let the fiber flow sensors work in a harsh environment and provide them with immunity to electromagnetic interference. The fiber flow sensor embodied here may comprise a twin-grating sensor as a vortex sensor that may detect the pressure oscillation or vortex-induced vibration in the pipe. The phase variation in the optical detection signal may be used as a characteristic to determine the vibration frequency of the vortex field, which may have a direct relationship with the water flow rate to be measured.

Description of Technology

Figure 40:
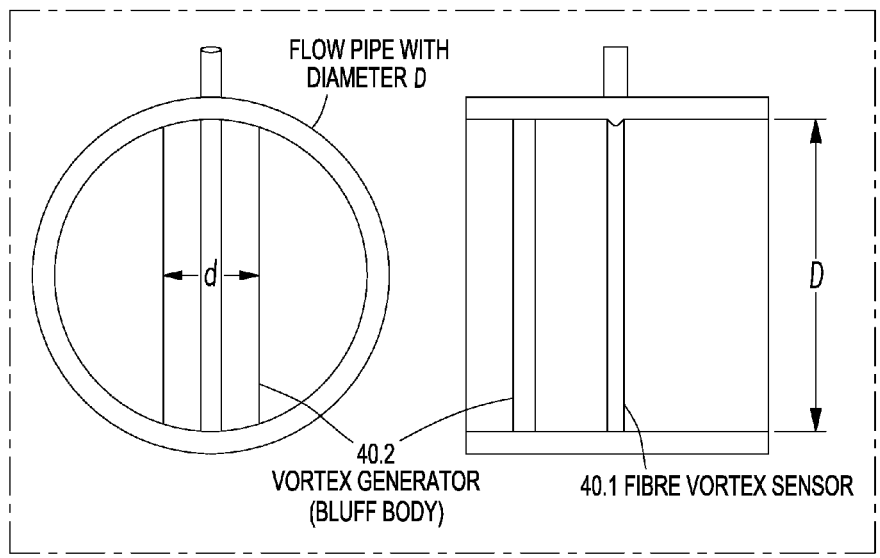
FIG. 40 illustrates a fiber optic flow sensor assembly according to one embodiment.
Figure 41:
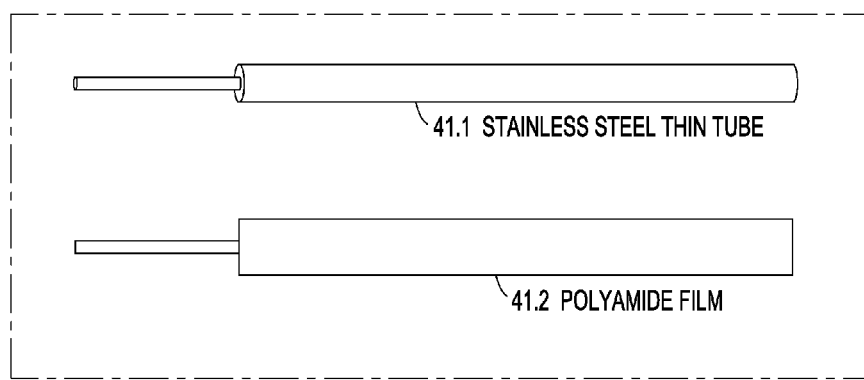
FIG. 41 illustrates packaged fiber optic flow sensors according to various embodiments.
Figure 42:
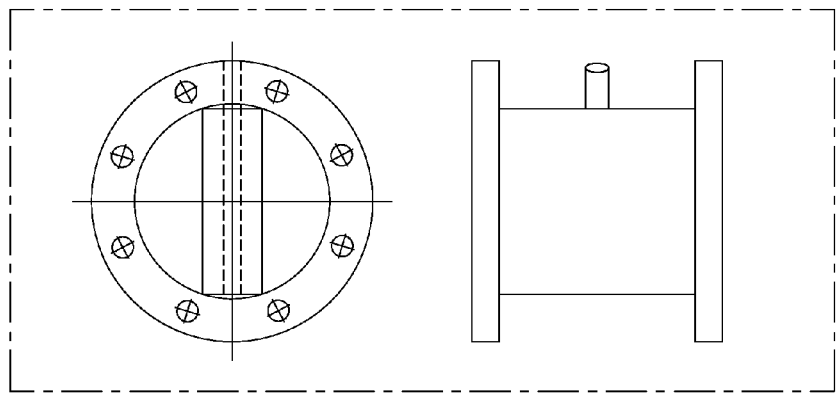
FIG. 42 illustrates a fiber optic flow sensor assembly according to one embodiment.

The structure of a fiber optic flow sensor assembly is shown in FIG. 40, in which a fiber sensing element as a flow sensor or vortex sensor, 40.1, may be installed behind a rectangular metal block called the bluff body or the vortex generator, 40.2, in a pipe with a diameter D. The fiber flow sensor may comprise a packaged twin-grating sensor as shown in FIG. 41, in which a stainless steel tube package may be used for water flow measurement as shown in FIG. 41.1 and a sandwich package with polyamide films may be used for measurements of air, gas and hydrogen flows, as shown in FIG. 41.2. One embodiment of a fiber flow sensor assembly is schematically shown in FIG. 42.

Figure 43:
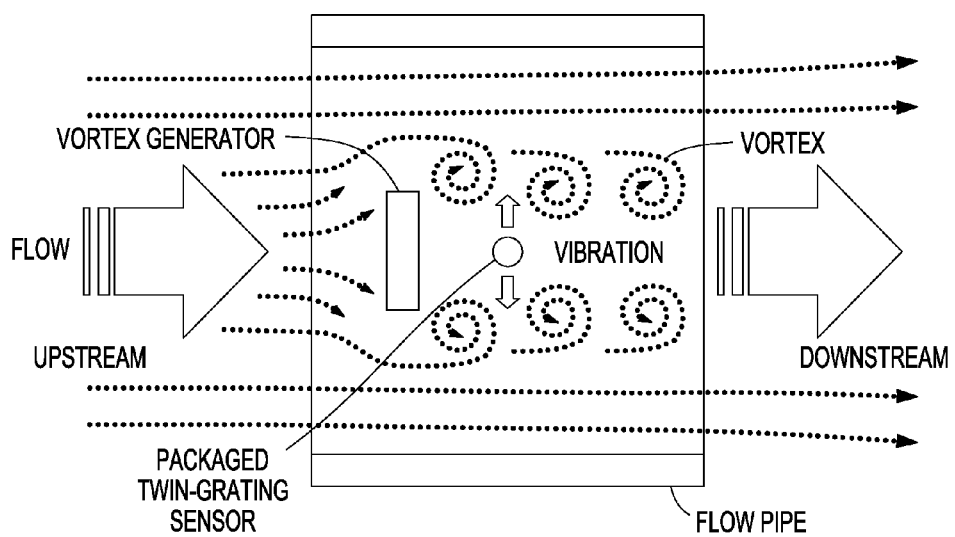
FIG. 43 illustrates vibration generation in a flow induced by vortex according to one embodiment.
Figure 44:
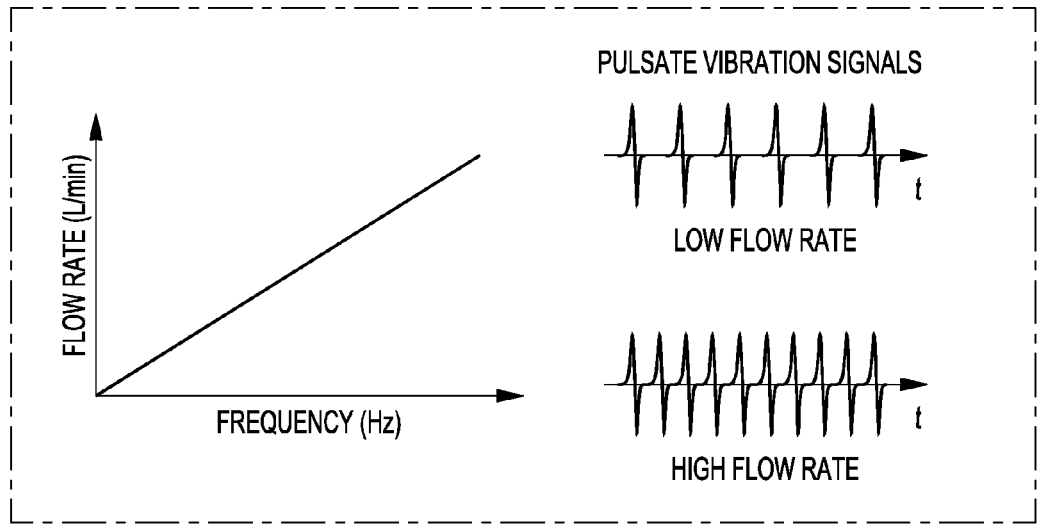
FIG. 44 illustrates a graphical relationship between the frequency of vortex-induced vibration and the flow rate according to one embodiment.

In operation principle for flow measurement, as illustrated in FIG. 43, when the flow, 43.1, enters the pipe, the vortex generator, 43.2, may create two groups of vortices with reverse directions in the flow downstream. The vortices may generate alternating low pressure zones which may cause any object in this regime to vibrate. This vortex vibration is one kind of pulsating vibration which may be detected with a fiber flow sensor. The vibration frequency called vortex shedding frequency f may be linearly proportional to the average flow velocity V and the flow rate L as shown in FIG. 44. This relationship may be expressed as:

$$V = \frac{d}{S_t}f, \quad (4)$$

where $S_t$ is the Strouhal number and d is the width of the vortex generator. The flow rate Q can be calculated with a formula expressed as:

$$Q = AV = \frac{Ad}{S_t}f, \quad (5)$$

where A is the cross-sectional area available for the water flow.

The structure of twin-grating sensor is shown in FIG. 10. Both sensor and the fiber may be polyamide coated that may provide the sensor an ability to work in a harsh environment with high temperatures of up to 250° C. Also just like the normal fiber, the polyamide coated fiber sensor may be resistant to high voltages and electromagnetic interference.

Figure 45:
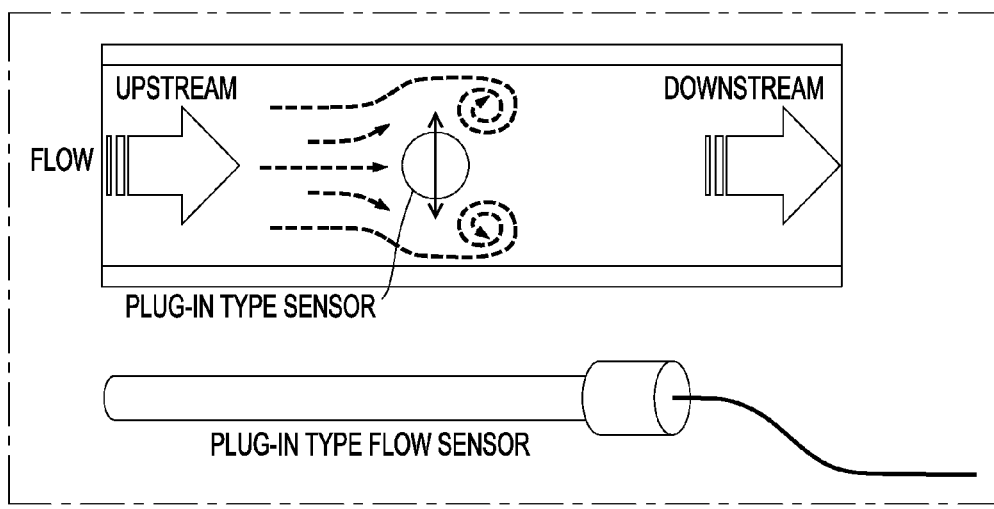
FIG. 45 illustrates vibration generation in a flow induced by a vortex and detection with a plug-in type fiber optic flow sensor according to various embodiments.

When the flow is in large velocity, a plug-in type of flow sensor assembly may be utilised and inserted directly into the pipe for flow measurement. In this case, a stronger vortex may be generated around the sensor, which may directly cause the sensor to vibrate. The operation principle for this situation and the structure of the plug-in type sensor are schematically illustrated in FIG. 45.

The vortex-induced vibration may cause a periodic change in cavity length of the fiber flow sensor, which in turn may generate a corresponding phase vibration of the fringe signal around its initial phase value. The phase vibration in the fringe signal may be detected and converted into an electrical signal with a fringe tracking technology as schematically illustrated in FIG. 6.

The fringe tracking technology may comprise a fringe-moving detection technology. As shown in FIG. 6, the input detected signal with multiple fringes may be first filtered in time domain by a time window, 6.1, with a time width equal to that of the fringe, in order to extract a target fringe, 6.2, to be real-time tracked afterwards. When the laser source is frequency modulated with a saw-tooth periodic signal, the fringe position in this modulation signal period (a time that the fringe appears in a modulation period) may be determined by the initial phase value of the fringe signal, 6.3. In the detection of the vortex-induced vibration, the vortex field may cause the phase of the fringe signal to change, which in turn may change the fringe position in the modulation signal period. Using the fringe tracking technology, the position of a target fringe may be determined and may be transferred in to a voltage output with a phase to voltage converter having a linear curve.

With this detection method, the vortex-induced vibration in flow may be detected as an electrical signal. Finally the vibration frequency may be calculated from the detected electrical signal and the flow rate may be obtained according to the parameters of a flow sensor assembly by using Equations (4) and (5).

Figure 46:
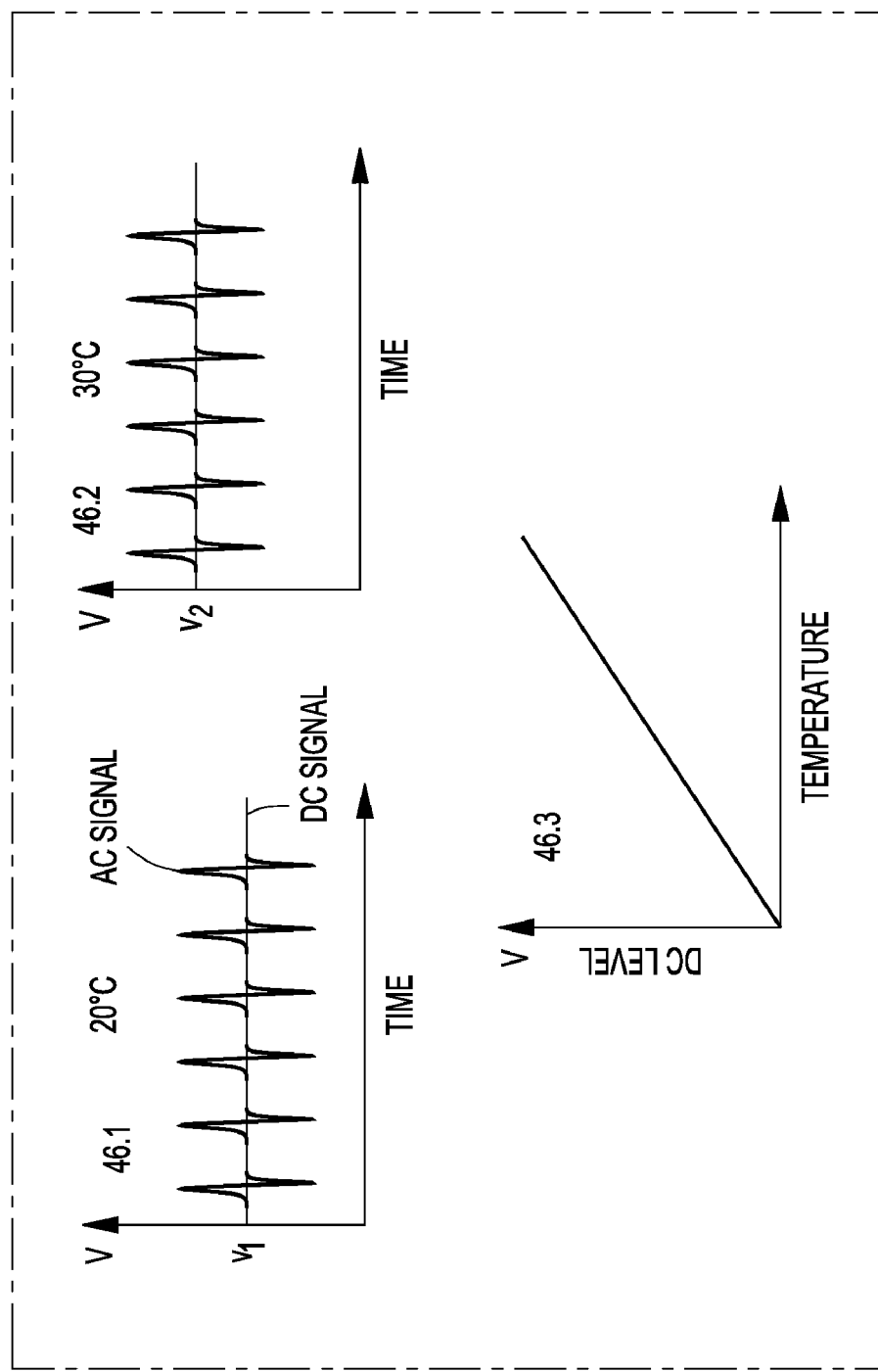
FIG. 46 illustrates a graphical relationship between a DC level as an output of the phase measurement of detected signal and temperature around the sensor according to one embodiment.

Temperature measurement, with the fiber flow sensor, may be completed by reading the DC level in the detection signal for flow measurements with fringe tracking technology. As shown in FIG. 46, the output waveform from flow measurements may comprise two components; one may comprise an AC signal as the vortex-induced vibration and another may comprise a DC signal that comes from the fringe movement slowly with the temperature changes around the sensor. FIG. 46.1 is an output waveform from flow measurements in which the $v_1$ represents an average DC level when the temperature is 20° C., and FIG. 46.2 is another output waveform obtained at 30° C., where there is an average DC level $v_2$, having $v_2 > v_1$. It will be appreciated that the DC level in the detection signal linearly increases with the temperature rising. FIG. 46.3 is a graph describing a relationship between the average DC level in the detection signal and the temperature around the fiber flow sensor.

Figure 47:
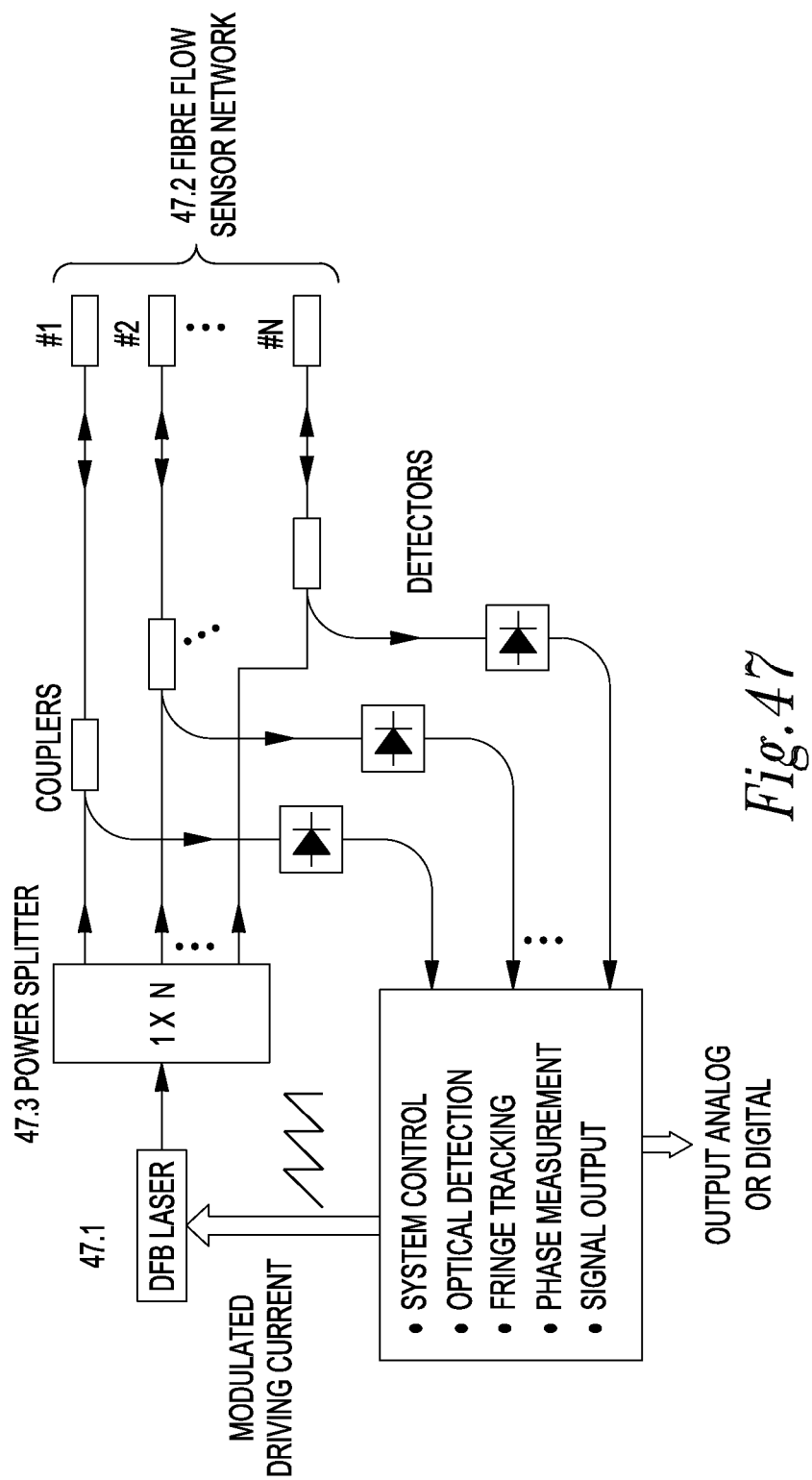
FIG. 47 illustrates a fiber optic flow sensor system according to one embodiment.

A structure of data acquisition system for flow measurement is shown in FIG. 47. The system uses a distributed feedback (DFB) laser source, 47.1, with a working wavelength matched with that of the flow sensor. The system may work in a space division multiplexing mode to manage N fiber flow sensors to form a sensor network, 47.2. Each sensor may be interrogated by an optical frequency swept probe light from a 1×N optical power splitter, 47.3, and the returning signal light from the sensor may be detected in the corresponding sensor channel. The signals from all sensor channels may be preliminarily processed in the signal processing unit, in order to obtain the vibration waveforms of each flow sensor. These vibration waveforms may then be sent to the computer via a USB cable. In the computer site, with a user interface program, the frequency of vortex-induced vibration in accordance with the flow velocity in each sensor may be measured and finally the flow rate may be calculated.

Figure 48:
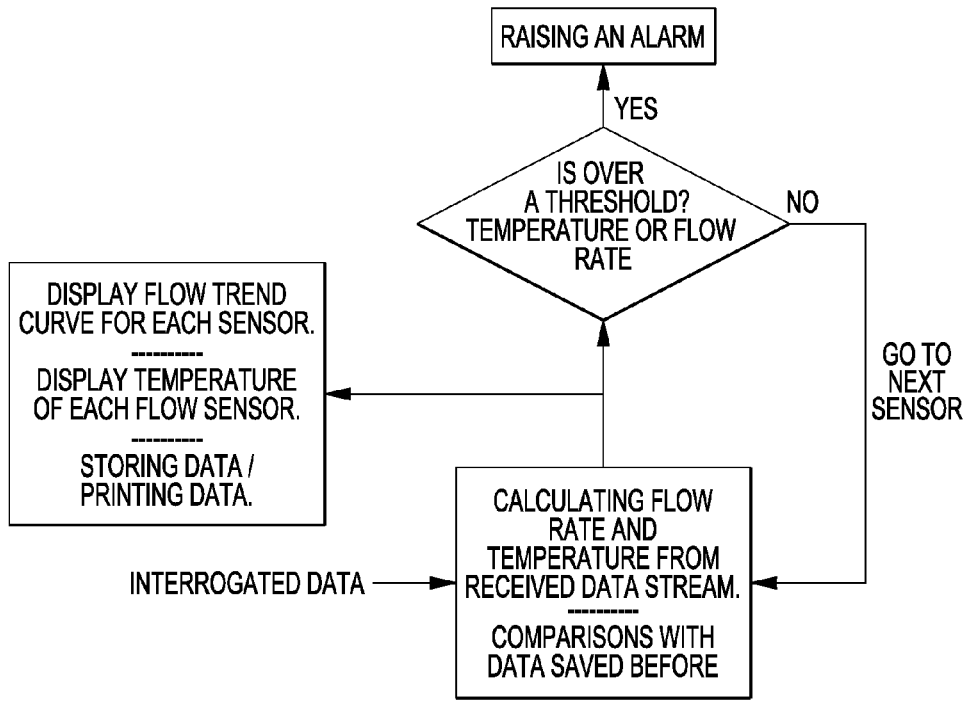
FIG. 48 illustrates functions used in a computer user interface program for flow rate and temperature measurements according to one embodiment.

A flowchart of a user interface program for flow measurements and data display used in the computer site is shown in FIG. 48. With this user interface program, the user may monitor the current flow rate and temperature of each fiber flow sensor and may view the change trend curves as well as set the alarms to corresponding flow sensors.

Example

Figure 49:
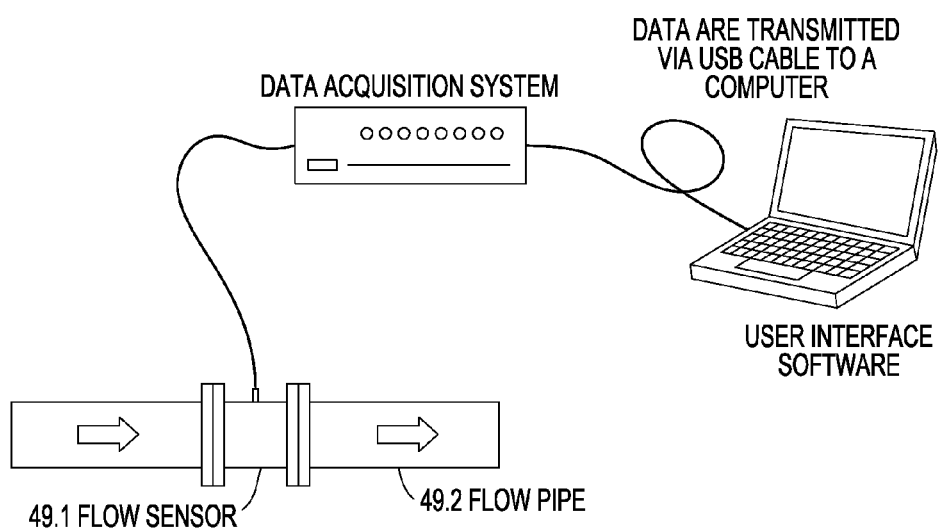
FIG. 49 illustrates a fiber optic flow sensor system for monitoring restriction of flow with a small rate and increased temperature according to one embodiment.
Figure 50:
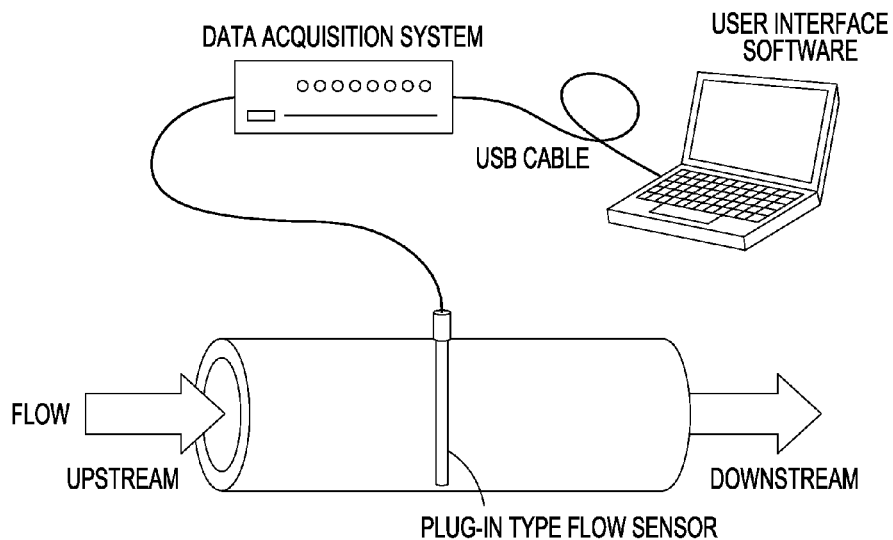
FIG. 50 illustrates a fiber optic flow sensor system for monitoring restriction of flow with a large rate and increased temperature according to one embodiment.

One embodiment of a flow sensor system is schematically illustrated in FIG. 49, in which a flow sensor assembly, 49.1, may be incorporated in the water pipe, 49.2 in a power generator system. This fiber flow sensor system may simultaneously measure a low rate of water flow below 1 L/min and the water temperature in the pipe from 10~100° C., respectively. The detected signal of the vortex-induced vibration may be transmitted to a computer through a USB connection, where the flow rate and temperature may be calculated and displayed. Another embodiment of a sensor system that may be used for simultaneously measuring a large flow rate of water (larger than 10 L/min) and the water temperature in the pipe is schematically illustrated in FIG. 50. In this system, a plug-in type fiber flow sensor may be employed.

Fiber Optic Sensor to Monitor Moisture and Oil Temperature

Moisture in the oil and oil temperature in a generator are two parameters which may be real-time monitored. An effective detection method may be to use fiber sensor technology to measure the changes of the optical signal parameters such as optical intensity, polarization state, or optical phase which are related to moisture and temperature. In this embodiment, a multiple-layer polyamide coated, packaged fiber optic sensor (twin-grating fiber sensor) may be used as a fiber moisture sensor to monitor the moisture in the oil or oil temperature. The phase changes in the optical detection signal may be used as the characteristics to determine moisture in the oil or oil temperature. As an application, the fiber moisture sensor may be used as a bearing oil sensor for monitoring oil conditions in the generator.

Description of Proposed Technology

Figure 51:
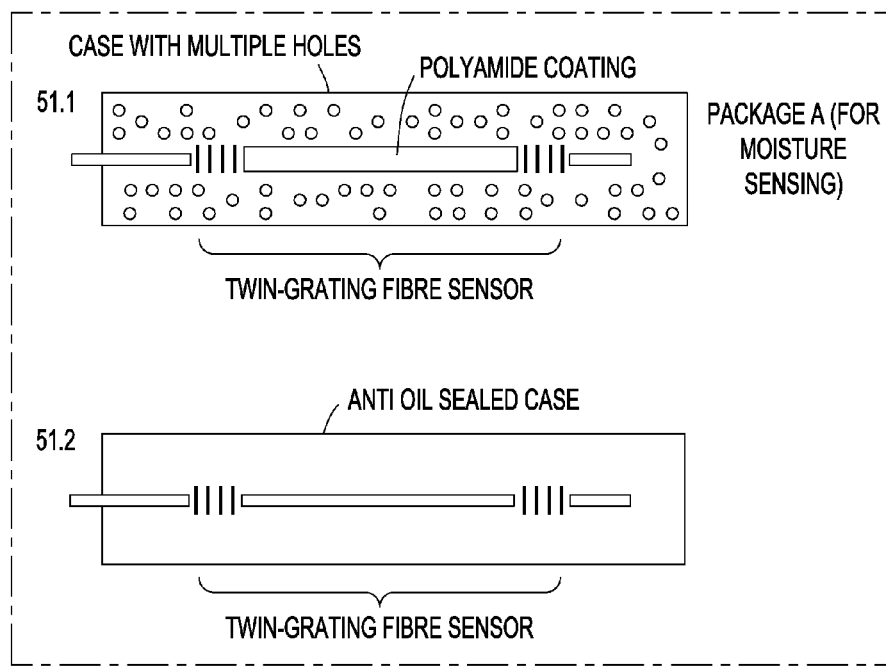
FIG. 51 illustrates packaged fiber optic moisture sensors according to various embodiments.

The structure of a fiber moisture sensor is shown in FIG. 51.1. The sensor may comprise a fiber sensing element and a package case. The fiber sensing element may comprise a multiple-layer polyamide coated, twin-grating fiber sensor with a designed wavelength. For moisture detection, as shown in FIG. 51.1, the sensor may be packaged inside an anti-oil plastic case as package A that may have many small holes to let the moisture permeate into the case and arrive at the sensor easily. For oil temperature detection, as shown in FIG. 51.3, the sensor may be sealed inside an anti-oil plastic case as package B.

In operation principle, for moisture measurement, when the twin-grating fiber sensor is coated with multiple-layer polyamide films on the cavity area, the polyamide coating may generate an additive strain applied on the sensor cavity after an annealing treatment. This additive strain may cause the cavity of the sensor to shrink. When the polyamide-coated twin-grating fiber sensor is placed in an environment with moisture, the polyamide coating layers on the fiber may absorb the moisture in the environment and start to release this additive strain imposed on the sensor cavity, which may bring about some changes in optical properties of the fiber cavity, such as the cavity length increasing. This in turn may result in a movement of the detected signal phase, or as fringe movement. The amount of the phase variation of the fringe signal may be proportional to the moisture contents, or relative humidity, absorbed by the sensor.

Figure 52:
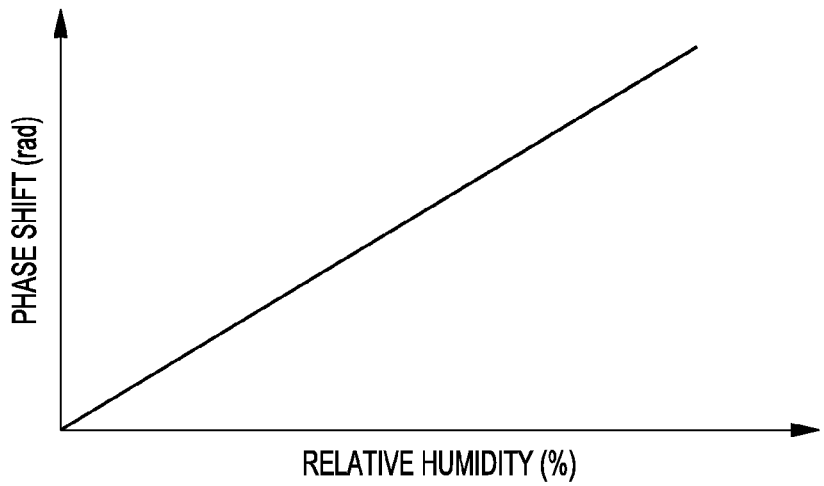
FIG. 52 illustrates a graphical relationship between the phase shift in a detected fringe signal and the relative humidity according to one embodiment.

In respect to signal detection, a movement of the fringe signal in accordance with the moisture content in time domain can be observed. The relationship between the moisture content or relative humidity (RH) in the oil and the phase shift of the fringe signal is schematically shown in FIG. 52. Therefore using the phase measurement technology, one may obtain the moisture contents absorbed by the sensor.

The phase measurement technology used for moisture detection is schematically explained in FIG. 6 where the detected signal with multiple fringes may be first filtered in the time domain by a timing window, 6.1, with window width being equal to the width of the fringe, 6.2; this is to track the fringe as it moves. The tracking may be done by the distributed feedback (DFB) laser which may be frequency modulated with a saw-tooth periodic signal. The fringe position in this modulation signal period (a time that the fringe appears in a modulation period) may be determined by the initial phase value of the fringe signal, 6.3. With this phase tracking algorithm, changes in the sensor cavity may be detected, and the phase shift in the detected signal, resulting from the moisture absorbed by the polyamide layer, may be converted into a voltage with an amount corresponding to the moisture content.

Figure 53:
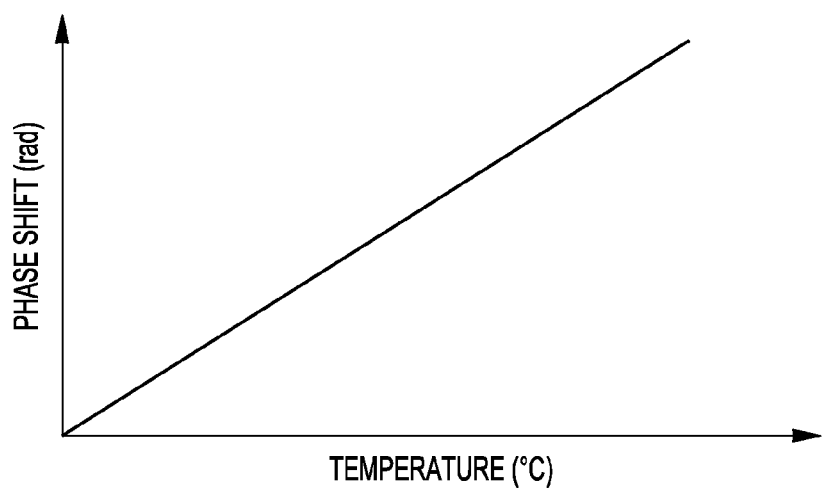
FIG. 53 illustrates a graphical relationship between the phase shift in detected fringe signal and the temperature around the sensor according to one embodiment.

For temperature measurement, the detection principle may be the same as that for moisture measurement. The temperature change also may alter the sensor cavity length and result in a movement of the fringe signal. The potential relationship between the temperature and the phase shift in the fringe signal is shown in FIG. 53.

In one embodiment, a package B type sensor may be employed, which may be sealed in an anti-oil plastic case, so the sensor cavity change may only result from the temperature change around the sensor. In respect to sensor interrogation, the data acquisition system may interrogate the moisture sensor and also interrogate the temperature sensor. One difference may be that the conversion coefficients and the calibrations may be different to these two types of sensors. Since the moisture sensor may have a temperature property, in one embodiment, the detection results from the moisture measurement may be compensated with a measured value from the temperature sensor.

Figure 54:
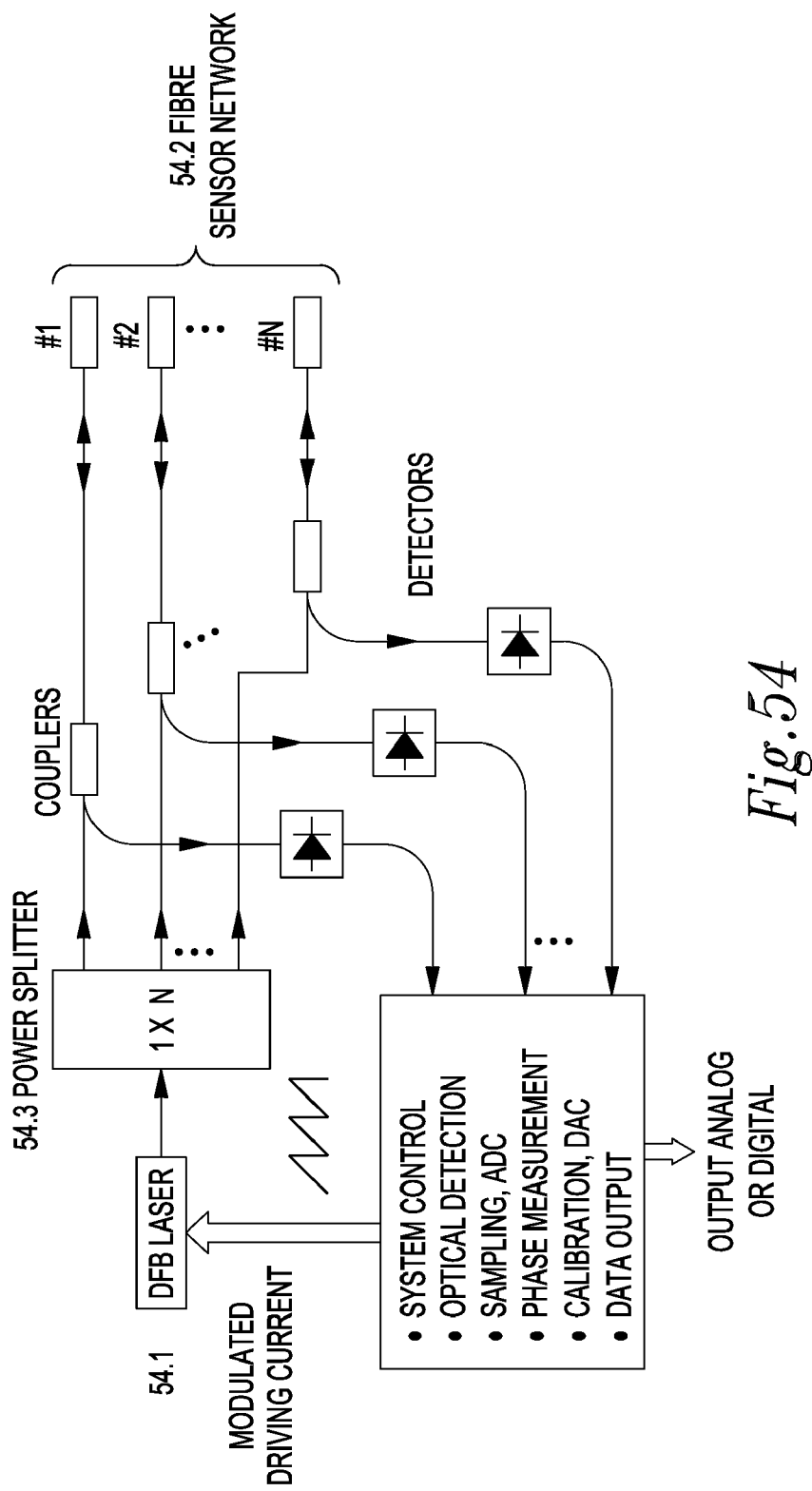
FIG. 54 illustrates a fiber optic moisture/temperature sensor system according to one embodiment.

A structure of data acquisition system for measurements of the moisture and temperature is shown in FIG. 54. The system uses a distributed feedback (DFB laser source, 54.1, with a working wavelength matched with that of the moisture sensor or temperature sensor. The system may work in a space division multiplexing mode to manage N fiber flow sensors to form a sensor network, 54.2. Each sensor may be interrogated by an optical frequency swept probe light from a 1×N optical power splitter, 54.3, and the returning signal light from the sensor may be detected in the corresponding sensor channel.

Finally, the detected voltage signals from different fiber sensors, after preliminarily processing, may be transmitted in a digital form to a computer via a USB cable. In the computer site, with a user interface program, the moisture content in the oil or the oil temperature in each sensor may be calculated.

Reference throughout the specification to "various embodiments," "some embodiments," "one embodiment," "an embodiment," and the like means that a particular feature, structure, or characteristic described in connection with the embodiment is included in at least one embodiment. Thus, appearances of the phrases "in various embodiments," "in some embodiments," "in one embodiment," "in an embodiment," and the like in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features structures, or characteristics of one or more other embodiments without limitation.

The examples presented herein are intended to illustrate potential and specific implementations of the embodiments. It can be appreciated that the examples are intended primarily for purposes of illustration for those skilled in the art. No particular aspect or aspects of the examples is/are intended to limit the scope of the described embodiments. The figures and descriptions of the embodiments have been simplified to illustrate elements that are relevant for a clear understanding of the embodiments, while eliminating, for purposes of clarity, other elements.

While various embodiments have been described herein, it should be apparent that various modifications, alterations, and adaptations to those embodiments may occur to persons skilled in the art with attainment of at least some of the advantages. The disclosed embodiments are therefore intended to include all such modifications, alterations, and adaptations without departing from the scope of the embodiments as set forth herein.

What is claimed is:

1. A system, comprising:
   a magnetic flux sensor, comprising:
      an optical fiber;
      at least one twin-grating structure formed on the optical fiber, each twin-grating structure comprising: a first optical grating, structure, a second optical grating structure adjacent the first optical grating structure, and a sensing cavity disposed between the first and second optical grating structures, each twin-grating structure selectively responsive to a unique wavelength of light to generate an optical interference fringe signal; and
      a magnetostrictive coating disposed over each twin-grating structure, the magnetostrictive coating to change an optical property of the twin-grating structure and a phase of the optical interference fringe signal when the magnetostrictive coating is exposed to changing magnetic flux;
      a laser source coupled to the magnetic flux sensor to input light into the optical fiber, the laser source configured to output the unique wavelength of each twin-grating structure;
      an optical detector coupled to the optical fiber to generate, for each twin grating structure, an electrical interference fringe signal representative of the optical interference fringe signal generated by the twin-grating structure; and
      a processor coupled to the optical detector, the processor programmed to, for each twin-grating structure of the magnetic flux sensor, extract a target fringe of the optical interference fringe, signal based on a digital representation of the electrical interference fringe signal and track variation in a phase of the target fringe over time to determine variation in the magnetic flux.

2. The system of claim 1, wherein the magnetic flux sensor comprises one twin-grating structure to define a magnetic flux probe.

3. The sensor of claim 1, wherein the magnetostrictive coating comprises Terfenol-D.

4. The sensor of claim 1, comprising a dielectric material disposed over each twin-grating structure and corresponding magnetostrictive coating, a shape of the dielectric material dimensioned for placement in a gap between a stator and a rotor of a generator.

5. The system of claim 1, wherein the laser source is modulatable by periodic current waveform.

6. The system of claim 2, wherein the magnetic flux sensor is disposed in a gap between a rotor and a stator of a generator to monitor magnetic flux in the gap during operation of the generator.

7. The system of claim 6, wherein the processor is programmed to determine a peak magnitude of the phase variation to determine a peak magnitude of the magnetic flux.

8. The system of claim 7, wherein the processor is programmed to determine, based on the peak magnitude of the magnetic flux, when a shorted turn is present in the rotor.

9. A system, comprising:
   at least one strain sensor, each strain sensor comprising:
      an optical fiber;
      at least one twin-grating structure formed on the optical fiber, each twin-grating structure comprising: a first optical grating structure, a second optical grating structure adjacent the first optical grating structure, and a sensing cavity disposed between the first and second optical grating structures, each twin-grating structure selectively responsive to a unique wavelength of light to generate an optical interference fringe signal; and
      a polymer coating disposed over each twin-grating structure, the polymer coating to induce axial strain in the optical fiber responsive to transaxial pressure applied to the polymer coating, the axial strain to change an optical property of the twin-grating structure and a phase of the interference fringe signal:
   a laser source coupled to each strain sensor to input light into the optical fiber, the laser source configured to output the unique wavelength of each twin-grating structure formed on the optical fiber;
   for each strain sensor, an optical detector coupled to the optical fiber, wherein when the laser source outputs the unique wavelength of a twin-grating structure formed on the optical fiber, the optical detector receives the optical interference fringe signal to generate a corresponding electrical interference fringe signal; and
   a processor coupled to the optical detector of each strain sensor, the processor programmed to, for each twin-grating-structure of each strain sensor, extract a target fringe of the optical interference fringe signal based on a digital representation of the electrical interference fringe signal and track variation in a phase of the target fringe over time to determine variation in the axial strain.

10. The system of claim 9, comprising a plurality of strain sensors.

11. The system of claim 9, comprising at least one strain sensor having a plurality of twin-grating structures formed on the optical fiber.

12. The system of claim 9, wherein the polymer coating comprises a polyamide coating.

13. The system of claim 9, wherein a diameter of the optical fiber comprising the polymer coating is approximately 145 microns.

14. The system of claim 9, wherein the laser source comprises a tunable laser diode.

15. The system of claim 14, wherein the processor is programmed to control the laser diode to interrogate a strain sensor by causing the laser diode to sweep over a working wavelength of the laser diode, the working wavelength comprising the unique wavelength of each twin-grating structure formed on the optical fiber of the straw sensor.

16. The system of claim 15, wherein the processor is programmed to control the laser source in a wavelength division multiplexing (WDM) mode.

17. The system of claim 15, wherein the processor is programmed to control the laser source in a frequency division multiplexing (FDM) mode.

18. The system of claim 9, comprising a first strain sensor having a plurality of twin-grating structures formed on the optical fiber, the first strain sensor contained in a filler material disposed between stator coils and a plurality of wedge elements of a generator, the filler material to apply a transaxial pressure to the first strain sensor that is dependent on a tightness of the plurality of wedge elements.

19. A sensor to detect compressive stress generated by a fastener,
the sensor comprising:
an optical fiber;
at least one twin-grating structure formed on the optical fiber, each twin-grating structure comprising: a first optical grating structure, it second optical grating structure adjacent the first optical grating structure, and a sensing cavity disposed between the first and second optical grating structures, each twin-grating structure selectively responsive to a unique wavelength of light to generate an optical interference fringe signal, and
for each twin-grating structure, a washer to contain the twin-grating structure and to receive a fastener therethrough, the washer responsive to compressive stress applied by the fastener to change an optical property of the twin-grating structure and a phase of the optical interference fringe signal.

20. The sensor of claim 19, comprising a plurality of twin-grating structures formed on the optical fiber.

21. The sensor of claim 19, wherein the optical fiber comprises two or more optical fiber lengths connected to define a single optical path, and wherein each of the lengths comprises a twin-grating structure formed thereon.

22. The sensor of claim 19, wherein the washer comprises fiberglass.

23. The sensor of claim 19, wherein the fastener comprises a bolt.

24. A system, comprising:
at least one sensor to detect compressive stress generated by a fastener, each sensor comprising:
an optical fiber;
at least one twin-grating structure formed on the optical fiber, each twin-grating structure comprising: a first optical grating structure, a second optical grating structure adjacent the first optical grating structure, and a sensing cavity disposed between the first and second optical grating structures, each twin-grating structure selectively responsive to a unique wavelength of light to generate an optical interference fringe signal; and
for each twin-grating structure, a washer to contain the twin-grating structure and to receive a fastener therethrough, the washer responsive to compressive stress applied by the fastener to change an optical property of the twin-grating structure and a phase of the optical interference fringe signal;
a laser source coupled to each sensor to input light into the optical fiber, the laser source configured to output the unique wavelength of each twin-grating structure formed on the optical fiber;
for each sensor, an optical detector coupled to the optical fiber, wherein when the laser source outputs the unique wavelength of a twin-grating structure formed on the optical fiber, the optical detector receive the optical interference fringe signal to generate a corresponding electrical interference fringe signal; and
a processor coupled to the optical detector of each sensor, the process programmed to for each twin-grating structure of each sensor, extract a target fringe of die optical interference fringe signal based on a digital representation of the electrical interference fringe signal and track variation in a phase of the target fringe over time to determine variation in the compressive stress.

25. The system of claim 24, comprising a plurality of sensors.

26. The system of claim 24, comprising at feast one sensor having a plurality of twin-grating structures formed on the optical fiber.

27. The system of claim 24, wherein the optical filter of at least one sensor comprises two or more optical fiber lengths connected to define a single optical path, and wherein each of the lengths comprises a twin-grating structure formed thereon.

28. The system of claim 24, wherein the laser source comprises a tunable laser diode.

29. The system of claim 28, wherein the processor is programmed to control the laser diode to interrogate a sensor by causing the laser diode to sweep over a working wavelength of the laser diode, the working wavelength comprising the unique wavelength of each twin-grating structure formed on the optical fiber of the sensor.

30. The system of claim 29, wherein the processor is programmed to control the laser source in a wavelength division multiplexing (WDM) mode.

31. The system of claim 29, wherein the processor is programmed to control the laser source in a frequency division multiplexing (FDM) mode.

32. The system of claim 24, wherein a first sensor is disposed in a generator and comprises a plurality of twin-grating structures, and wherein the processor is programmed to monitor compressive stress variations of the twin-grating structures based on the tracked variation in the phases of the corresponding target fringes.

33. The system of claim 24, comprising a least one washer receiving a through bolt for providing axial compression to a plurality of laminations defining a stator core.

34. A sensor to detect compressive stress, the sensor comprising:
an optical fiber;
at least one twin-grating structure formed on the optical fiber, each twin-grating structure comprising: a first optical grating structure, a second optical grating structure adjacent the first optical grating structure, and a sensing cavity disposed between the first and second optical grating structures, each twin-grating structure selectively responsive to a unique wavelength of light to generate an optical interference fringe signal; and for each twin-grating structure, a block-shaped housing to contain the twin-grating structure, the housing responsive to compressive stress applied thereto to change an optical property of the twin-grating structure and a phase of the optical interference fringe signal.

35. The sensor of claim 34, comprising a plurality of twin-grating structures formed on the optical fiber.

36. The sensor of claim 34, wherein the optical fiber comprises two or more optical fiber lengths connected to define a single optical path, and wherein each of the lengths comprises a twin-grating structure formed thereon.

37. The sensor of claim 34, wherein the housing comprises fiberglass.

38. The sensor of claim 34, wherein the housing is dimensioned for receipt by parallel ring assembly of a generator.

39. A system, comprising:
at least one sensor to detect compressive stress, each sensor comprising:
an optical fiber;
at least one twin-grating structure formed on the optical fiber, each twin-grating structure comprising a first optical grating structure, a second optical grating structure adjacent the first optical grating structure, and a sensing cavity disposed between the first and second optical grating structures, each twin-grating structure selectively responsive to a unique wavelength of light to generate an optical interference fringe signal; and
for each twin-grating structure, a block-shaped housing to contain the twin-grating structure, the housing responsive to compressive stress applied thereto to change an optical property of the twin-grating structure and a phase of the optical interference fringe signal;
a laser source coupled to each sensor to input light into the optical fiber, the laser source configured to output the unique wavelength of each twin-grating, structure formed on the optical fiber;
for each sensor, an optical detector coupled to the optical fiber, wherein when the laser source outputs the unique wavelength of a twin-grating structure formed on the optical fiber, the optical detector receives the optical interference fringe signal to generate a corresponding electrical interference fringe signal; and
a processor coupled to the optical detector of each sensor, the processor programmed to, for each twin-grating-structure of each sensor, extract a target fringe of the optical interference, fringe signal based on a digital representation of the electrical interference fringe signal and track variation in a phase of the target fringe over time to determine variation in the compressive stress.

40. The system of claim 39, comprising a plurality of sensors.

41. The system of claim 39, comprising at least one sensor having a plurality of twin-grating structures formed on the optical fiber.

42. The system of claim 39, wherein the optical fiber of at least one sensor comprises two or more optical fiber lengths connected to define a single optical path, and wherein each of the lengths comprises a twin-grating structure formed thereon.

43. The system of claim 39, wherein the laser source comprises a tunable laser diode.

44. The system of claim 43, wherein the processor is programmed to control the laser diode to interrogate a sensor by causing the laser diode to sweep over a working wavelength of the laser diode, the working wavelength comprising the unique wavelength of each twin-grating structure formed on the optical fiber of the sensor.

45. The system of claim 44, wherein the processor is programmed to control the laser source in a wavelength division multiplexing (WDM) mode.

46. The system of claim 44, wherein the processor is programmed to control the laser source in a frequency division multiplexing (FDM) mode.

47. The system of claim 39, wherein a first sensor comprises a plurality of twin-grating structures, and wherein the housings containing the twin-grating structures are disposed between parallel conductor rings of a generator.

48. A vibration and temperature sensor, comprising:
an optical fiber;
a twin-grating structure formed on the optical fiber, the twin-gating structure comprising: a first optical grating structure, a second optical grating structure adjacent the first optical grating structure, and a sensing cavity disposed between the first and second optical grating structures, the twin-grating structure selectively responsive to a unique wavelength of light to generate an optical interference fringe signal; and
a reed member coupled to the twin-grating structure, the reed member to induce time-varied stress on the sensing cavity responsive to vibratory motion of the reed, wherein an optical property of the twin-grating structure is determined by the time-varied stress on the sensing cavity and temperature of the twin-grating structure.

49. A system, comprising:
at least one vibration and temperature sensor, each sensor comprising:
an optical fiber;
a twin-grating structure formed on the optical fiber, the twin grating structure comprising: a first optical grating structure, a second optical grating structure adjacent the first optical grating structure, and a sensing cavity disposed between the first and second optical grating structures, the twin-grating structure selectively responsive to a unique wavelength of light to generate an optical interference fringe signal; and
a reed member coupled to the twin-grating structure, the reed member to induce time-varied stress on the sensing cavity responsive to vibratory motion of the reed, wherein an optical property of the twin-grating structure is determined by the time-varied stress on the sensing cavity and a temperature of the twin-grating structure:
a laser source coupled to each vibration and temperature sensor to input light into the optical fiber, the laser source configured to output the unique wavelength of the twin-grating structure formed on the optical fiber;
for each vibration and temperature sensor, an optical detector coupled to the optical fiber, wherein when the laser source outputs the unique wavelength of a twin-grating structure formed on the optical fiber, the optical detector receives the optical interference fringe signal to generate a corresponding electrical interference fringe signal; and a processor coupled to the optical detector of each vibration and temperature sensor, the processor programmed to, for each twin-grating-structure of each sensor, extract a target fringe of the optical interference fringe signal based on a digital representation of the electrical interference fringe signal, tune the laser source to a center wavelength of the target fringe, and monitor intensity changes in the target fringe to determine a magnitude of the vibratory motion of the reed;

wherein the processor is programmed to, for each twin-grating-structure of each sensor, tune the laser source to compensate for changes in the center wavelength of the target fringe caused by a change in the temperature of the twin-grating structure and indicate the change in temperature based on a change in a drive current of the laser source.

50. The system of claim 49, wherein the vibration and temperature sensor is coupled to a main lead of a generator.

51. The system of claim 49, wherein the vibration and temperature sensor is coupled to an end winding of a generator.

52. The system of claim 49, wherein the vibration and temperature sensor is coupled to lead box of a generator.

53. A flow sensor, comprising:
a pipe to carry a flow of a fluid;
a vortex generator connected across an inner diameter of the pipe to generate vortices in a downstream flow of the fluid;
an optical fiber connected across the inner diameter or the pipe and located downstream of the vortex generator; and
a twin-grating structure formed on the optical fiber, the twin-grating structure comprising: a first optical grating structure, a second optical grating structure adjacent the first optical grating structure, and a sensing cavity disposed between the first and second optical grating structures, the twin-grating structure selectively responsive to a unique wavelength of light to generate an optical interference fringe signal;
wherein the vortices induce vibration of the sensing cavity, and wherein an optical property or the twin-grating structure and a phase of the optical interference fringe signal are determined by the vibration of the sensing cavity.

54. The flow sensor of claim 53, wherein the fluid comprises any of: air, gas, water, hydrogen.

55. The flow sensor of claim 53, wherein the optical fiber is contained in a stainless steel tube.

56. The flow sensor of claim 53, wherein the optical fiber is contained in a polyamide tube.

57. A system, comprising:
at least one flow sensor, flow sensor comprising:
a pipe to carry a flow of a fluid;
a vortex generator connected across an inner diameter of the pipe to generate vortices in a downstream flow of the fluid;
an optical fiber connected across the inner diameter of the pipe and located downstream of the vortex generator; and
a twin-grating structure formed on the optical fiber, the twin-grating structure comprising: a first optical grating structure, a second optical grating structure adjacent the first Optical grating structure, and a sensing cavity disposed between the first and second optical grating structures, the twin-grating structure selectively responsive to a unique wavelength of light to generate an optical interference fringe signal;

wherein the vortices induce vibration of the sensing cavity, and wherein an optical property of the twin-grating structure and a phase of the optical interference fringe signal are determined by the vibration of the sensing cavity;

a laser source coupled to each flow sensor to input light into the optical fiber, the laser source configured to output the unique wavelength of each twin-grating structure formed on the optical fiber;

for each flow sensor, an optical detector coupled to the optical fiber, wherein when the laser source outputs the unique wavelength of a twin-grating structure formed on the optical fiber, the optical detector receives the optical interference fringe signal to generate a corresponding electrical interference fringe signal; and a processor coupled to the optical detector of each flow sensor, the processor programmed to, for each twin-grating-structure of each sensor, extract a target fringe of the optical interference fringe signal based on a digital representation of the electrical interference fringe signal, track variation in a phase of the target fringe over lime to determine a magnitude of the vibration of the sensing cavity, and determine a flow rate of the fluid based on the magnitude of the vibration of the sensing cavity.

58. The system of claim 57, wherein at least one flow sensor is disposed in a fluid flow of a power generator system.

59. A moisture sensor, comprising:
an optical fiber;
a twin-grating structure formed on the optical fiber, the twin-grating structure comprising: a first optical grating structure, a second optical grating structure adjacent the first optical grating structure, and a sensing cavity disposed between the first and second optical grating structures, the twin-grating structure selectively responsive to a unique wavelength of light to generate an optical interference fringe signal; and
a multiple layer polyamide film coating disposed over the twin-grating structure to pre-stress the sending cavity, wherein exposure of the coating to moisture reduces the pre-stress of the sensing cavity to change an optical property of the twin-grating structure and a phase of the optical interference fringe signal.

60. A system, comprising:
at least one moisture sensor, each moisture sensor comprising:
an optical fiber;
a twin-grating structure formed on the optical fiber, the twin grating structure comprising: a first optical grating structure, a second optical grating structure adjacent the first optical grating structure, and a sensing cavity disposed between the first and second optical grating structures, the twin-grating structure selectively responsive to a unique wavelength of light to generate an optical interference fringe signal; and
a multiple-layer polyamide film coating disposed over the twin-grating structure to pre-stress the sensing cavity, wherein exposure of the coating to moisture reduces the pre-stress of the sensing cavity to change an optical property of the twin-grating structure and a phase of the optical interference fringe signal.

a laser source coupled to each moisture sensor to input light into the optical fiber, the laser source configured to output the unique wavelength of each twin-grating structure formed on the optical fiber;

for each moisture sensor, an optical detector coupled to the optical fiber, wherein when the laser source outputs the unique wavelength of a twin-grating structure formed on the optical fiber, the optical detector receives the optical interference fringe signal to generate a corresponding electrical interference fringe signal; and a processor coupled to the optical detector of each moisture sensor, the processor programmed to, for each twin-grating-structure of each moisture sensor, extract a target fringe of the optical interference fringe signal based on a digital representation of the electrical interference fringe signal and track variation in a phase of the target fringe over time to determine variation in the moisture.

61. The system of claim 60, wherein at least one moisture sensor is disposed in an oil reservoir of a generator.

62. A magnetic flux sensor, comprising:
- an optical fiber;
- at least one twin-grating structure formed on the optical fiber, each twin-grating structure comprising: a first optical grating structure, a second optical grating structure adjacent the first optical grating structure, and a sensing cavity disposed between the first and second optical grating structures, each twin-grating structure selectively responsive to a unique wavelength of light to generate an optical interference fringe signal; and
- a magnetostrictive coating disposed over each twin-grating structure, the magnetostrictive coating to change an optical property of the twin-grating structure and a phase of the optical interference fringe signal when the magnetostrictive coating is exposed to changing magnetic flux;
- a dielectric material disposed over each twin-grating structure and corresponding magnetostrictive coating, a shape of the dielectric material dimensioned for placement in a gap between a stator and a rotor of a generator.

63. The sensor of claim 62, wherein the dielectric material comprises fiberglass.

* * * * *